(12) United States Patent
Nishida et al.

(10) Patent No.: US 10,090,294 B2
(45) Date of Patent: Oct. 2, 2018

(54) SEMICONDUCTOR DEVICE

(71) Applicant: ROHM CO., LTD., Kyoto-shi, Kyoto (JP)

(72) Inventors: Kenji Nishida, Kyoto (JP); Shinpei Ohnishi, Kyoto (JP); Kentaro Nasu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/449,479

(22) Filed: Mar. 3, 2017

(65) Prior Publication Data
US 2017/0256536 A1    Sep. 7, 2017

(30) Foreign Application Priority Data

Mar. 4, 2016 (JP) .................. 2016-042748
Dec. 14, 2016 (JP) .................. 2016-242478
Feb. 9, 2017 (JP) .................. 2017-022146

(51) Int. Cl.
| H01L 29/866 | (2006.01) |
| H01L 27/06 | (2006.01) |
| H01L 29/739 | (2006.01) |
| H01L 29/423 | (2006.01) |
| H01L 29/06 | (2006.01) |

(52) U.S. Cl.
CPC ...... H01L 27/0635 (2013.01); H01L 29/0615 (2013.01); H01L 29/423 (2013.01); H01L 29/7397 (2013.01); H01L 29/866 (2013.01)

(58) Field of Classification Search
CPC ............ H01L 29/0696; H01L 29/1095; H01L 29/7375; H01L 29/7393–29/7395; H01L 29/7397; H01L 29/66325; H01L 29/66333–29/66348
See application file for complete search history.

(56) References Cited

U.S. PATENT DOCUMENTS

| 6,768,168 B1 * | 7/2004 | Takahashi | ......... H01L 29/66348 257/329 |
| 7,897,997 B2 * | 3/2011 | Hsieh | .................. H01L 27/0255 257/139 |
| 2002/0050603 A1 * | 5/2002 | Kawamoto | ......... H01L 27/0647 257/175 |

(Continued)

FOREIGN PATENT DOCUMENTS

| JP | 2001257349 | 9/2001 |
| JP | 2013033931 | 2/2013 |

*Primary Examiner* — Jessica Manno
*Assistant Examiner* — Mohammed R Alam
(74) *Attorney, Agent, or Firm* — Hamre, Schumann, Mueller & Larson, P.C.

(57) ABSTRACT

A semiconductor device, including a semiconductor layer of a first conductivity type, having a main surface with a diode trench formed therein, an inner wall insulating film, including a side wall insulating film, formed along side walls of the diode trench, and a bottom wall insulating film, formed along a bottom wall of the diode trench and having a thickness greater than a thickness of the side wall insulating film, and a bidirectional Zener diode, formed on the bottom wall insulating film inside the diode trench and having a pair of first conductivity type portions and at least one second conductivity type portion formed between the pair of first conductivity type portions.

18 Claims, 39 Drawing Sheets

(56) References Cited

U.S. PATENT DOCUMENTS

| | | | |
|---|---|---|---|
| 2010/0127330 A1* | 5/2010 | Arai .................... | H01L 27/0255 257/355 |
| 2012/0068178 A1* | 3/2012 | Chen ................... | H01L 27/0629 257/49 |
| 2012/0326207 A1* | 12/2012 | Yoshimochi ........ | H01L 29/7397 257/139 |

* cited by examiner

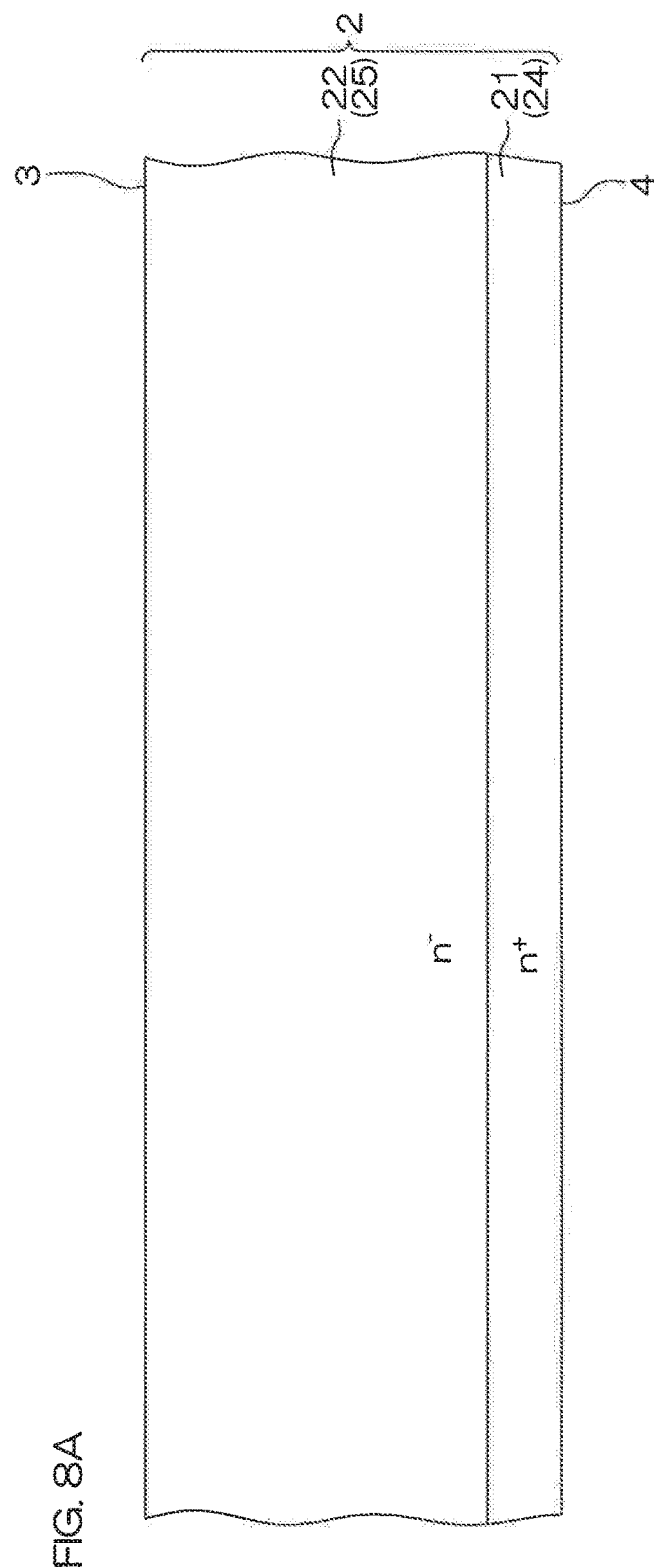

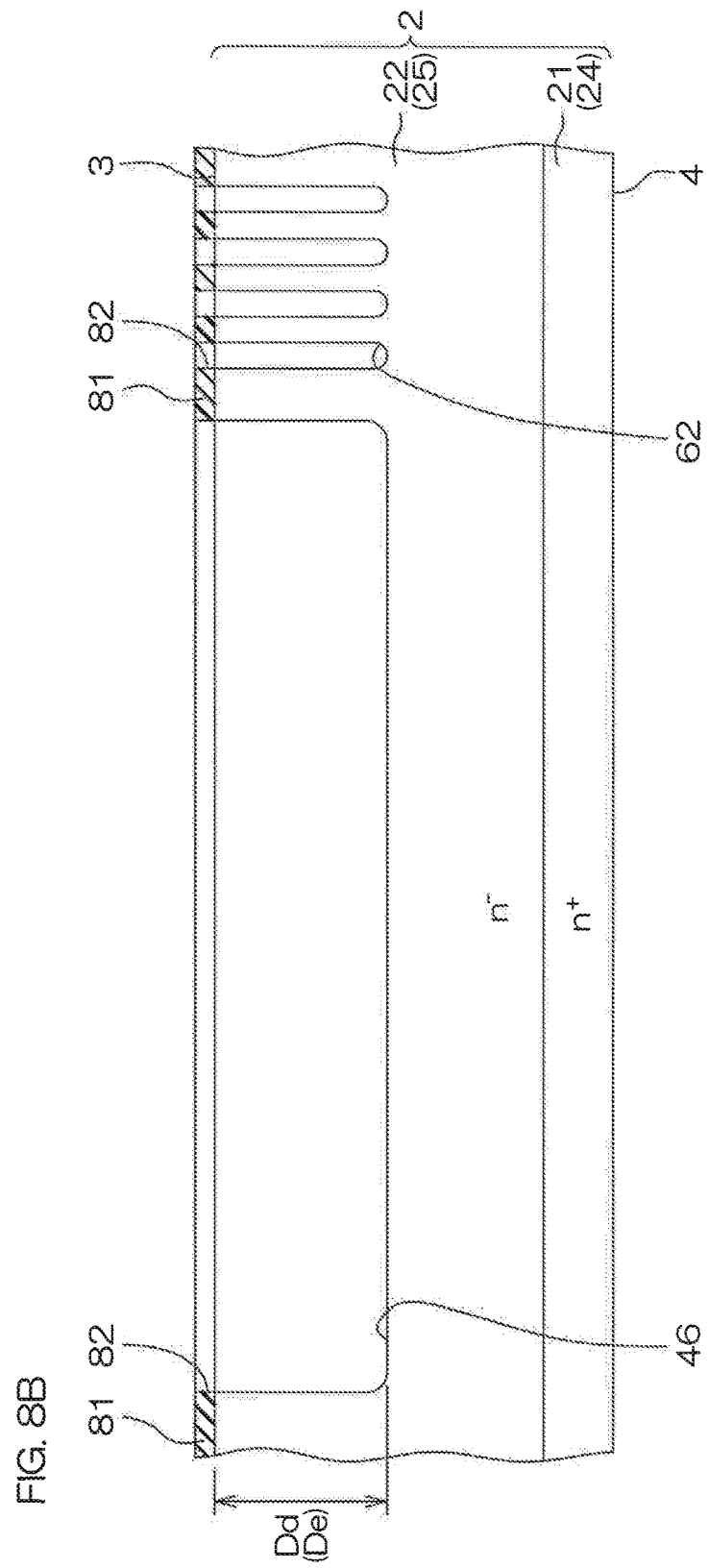

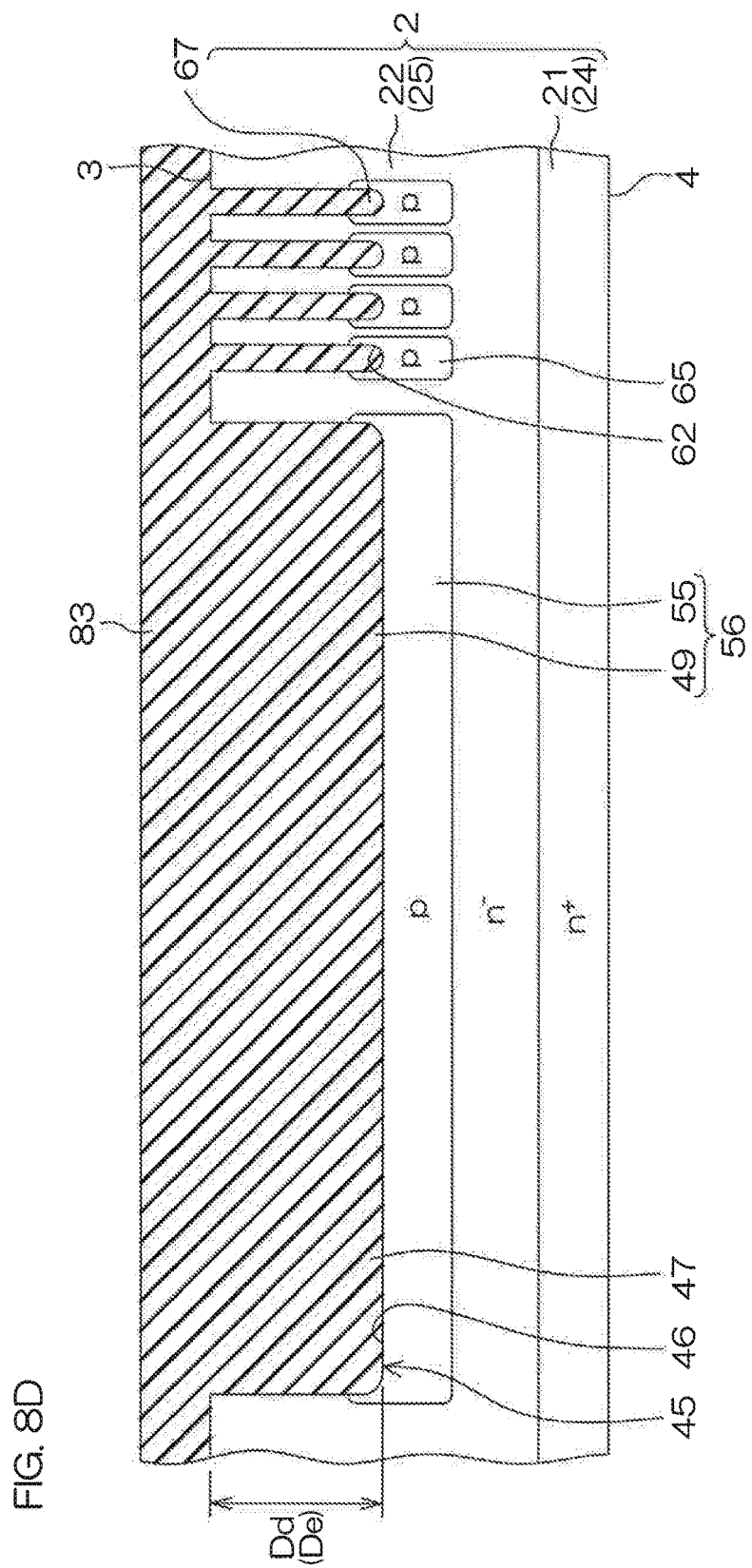

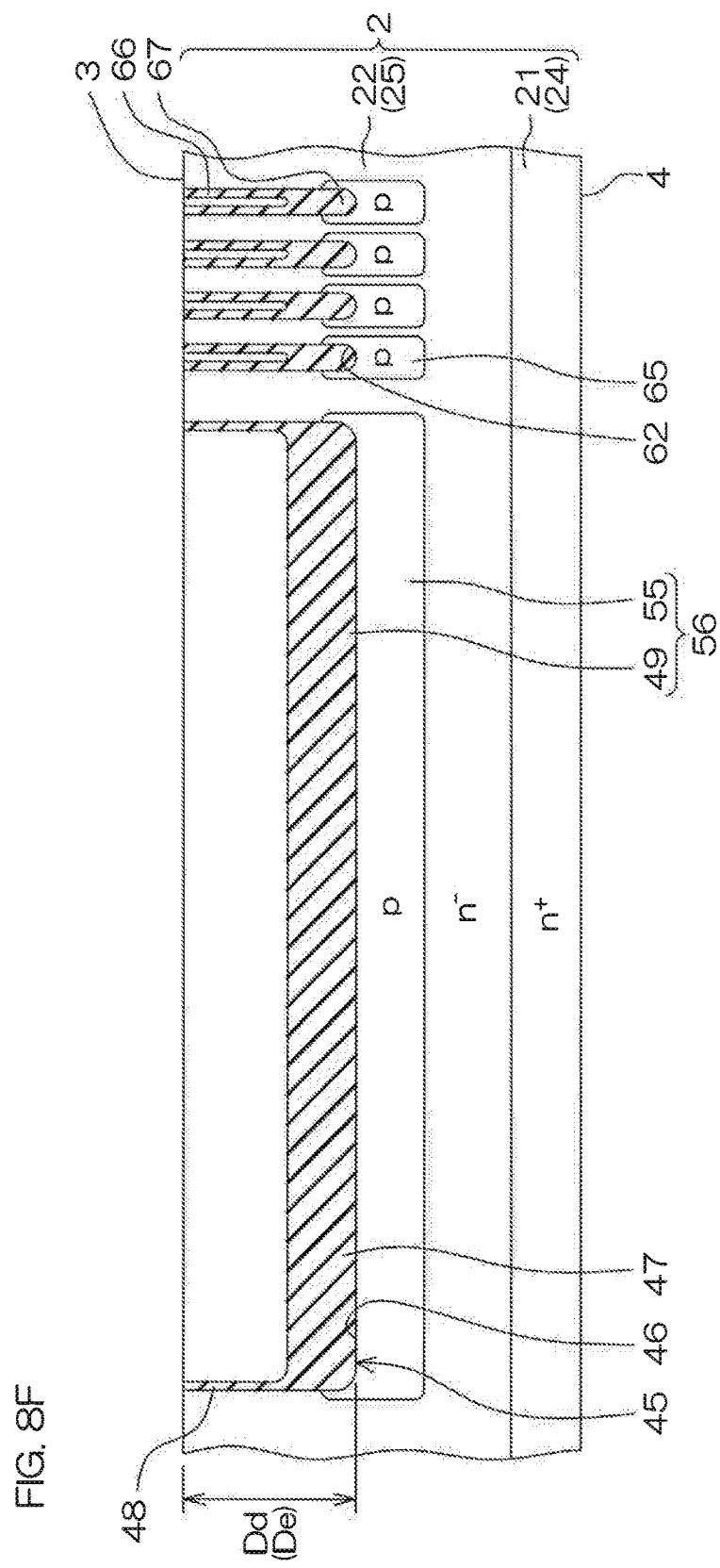

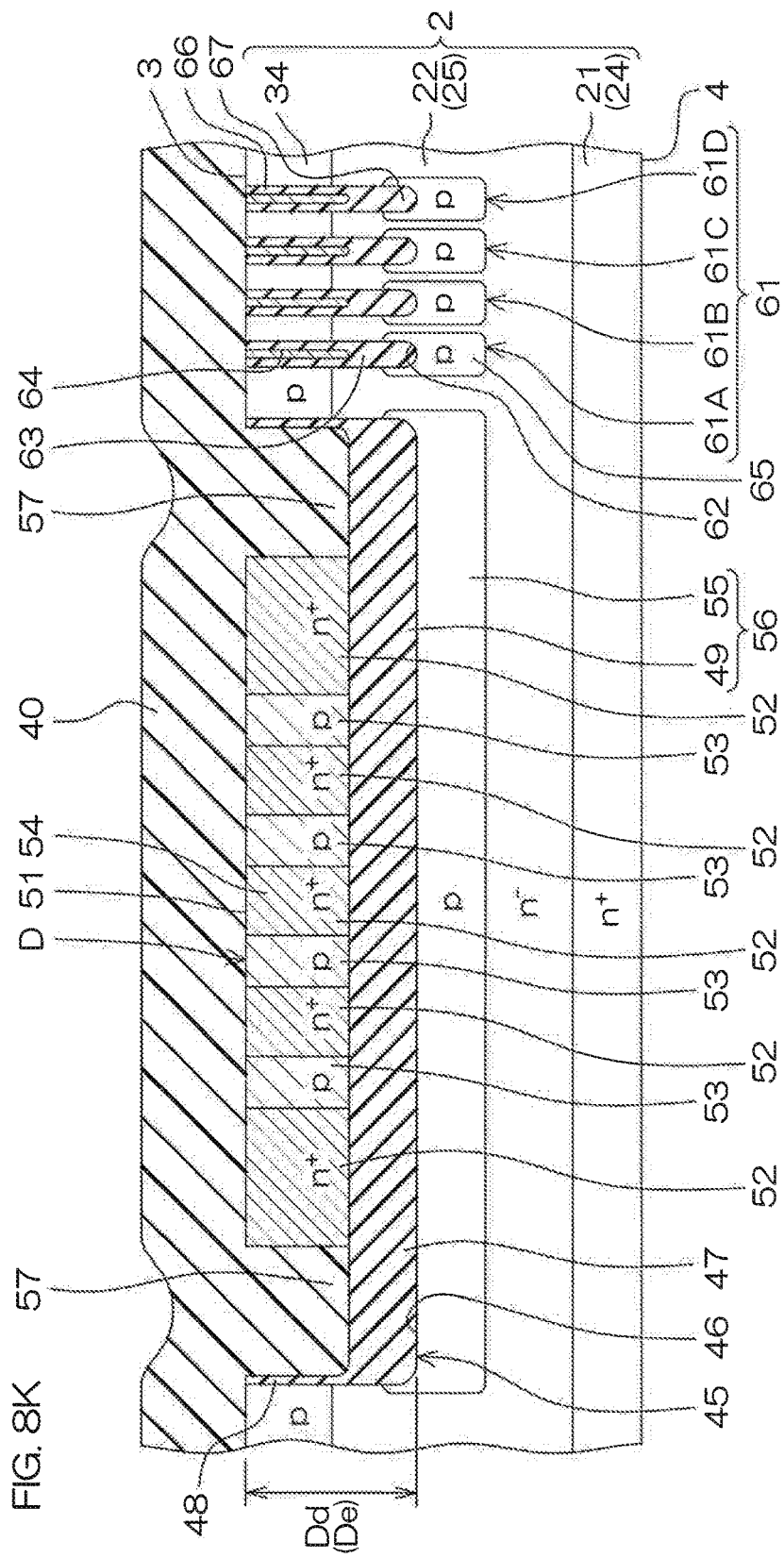

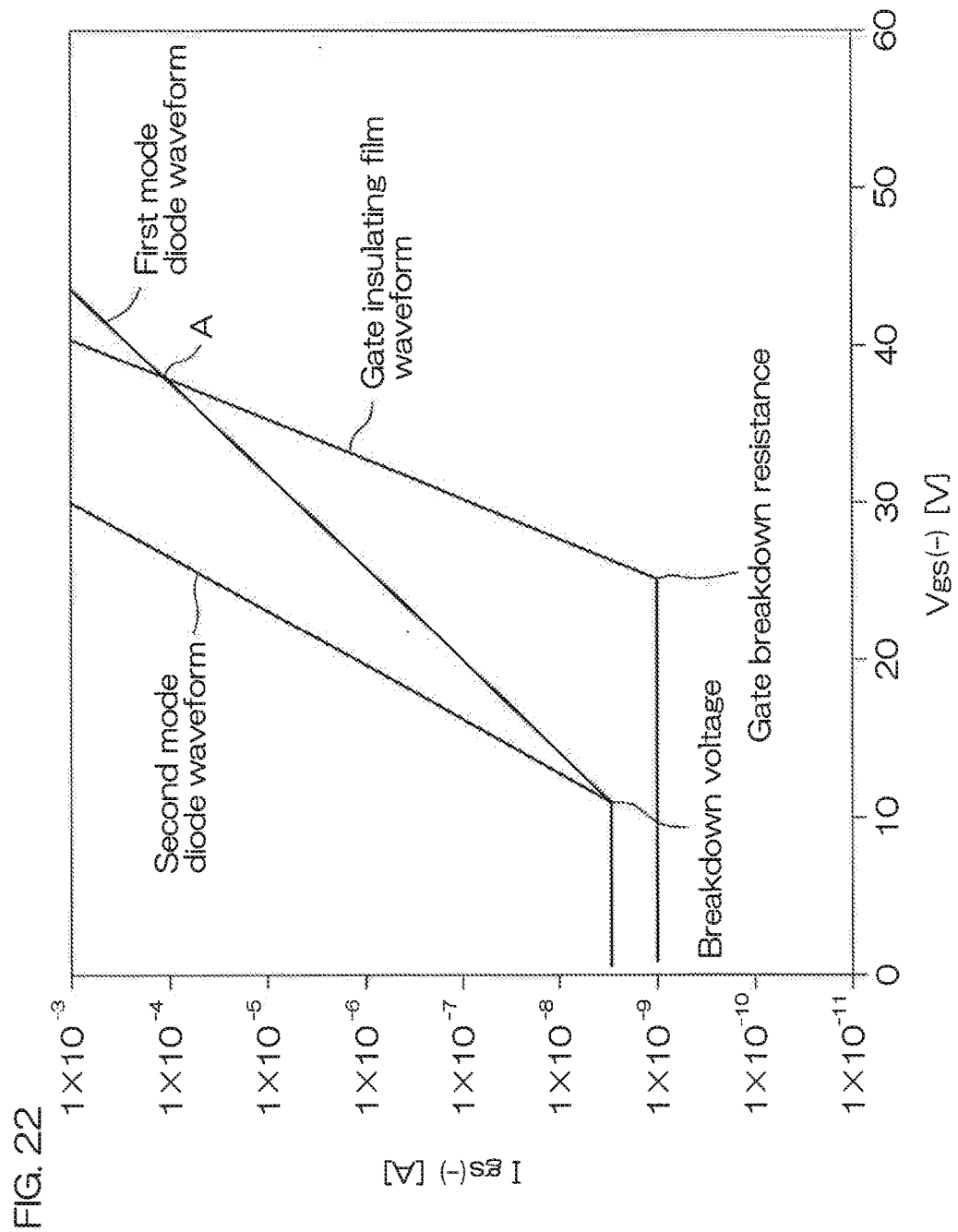

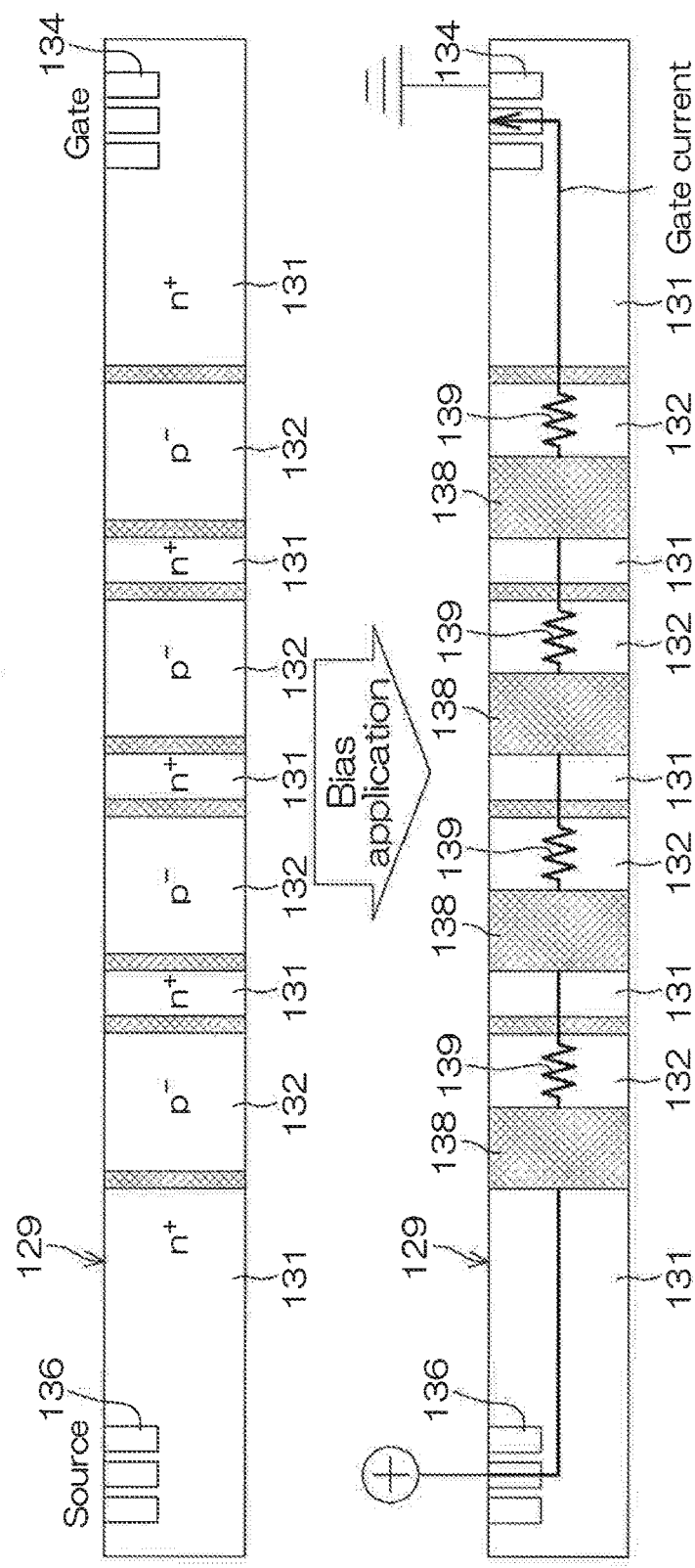

SEMICONDUCTOR DEVICE

CROSS-REFERENCE TO RELATED APPLICATIONS

The present application corresponds to Japanese Patent Application No. 2016-42748 filed in the Japan Patent Office on Mar. 4, 2016, Japanese Patent Application No. 2016-242478 filed in the Japan Patent Office on Dec. 14, 2016, and Japanese Patent Application No. 2017-22146 filed in the Japan Patent Office on Feb. 9, 2017 and the entire disclosures of these applications are incorporated herein by reference.

TECHNICAL FIELD

The present invention relates to a semiconductor device having a structure that includes a semiconductor layer in which a trench is formed and has a bidirectional Zener diode formed inside the trench.

BACKGROUND ART

A semiconductor device that includes a bidirectional Zener diode is disclosed in Patent Document 1 (Japanese Patent Application Publication No. 2001-257349). The semiconductor device includes an $n^+$ type semiconductor substrate. An $n^-$ type epitaxial layer is formed on the semiconductor substrate. A trench is formed in a surface layer portion of the epitaxial layer. A gate oxide film is formed on an inner wall of the trench. A bidirectional Zener diode, including an $n^+$ type region, a p type region, and an $n^+$ type region, is formed in the trench.

SUMMARY OF INVENTION

The semiconductor device according to Patent Document 1 has a structure where the p type region of the bidirectional Zener diode faces the $n^-$ type epitaxial layer across the gate oxide film. Therefore, when a voltage drop occurs across the pair of $n^+$ type regions that sandwich the p type region, electrons are drawn to a region, in the p type region, that faces the $n^-$ type epitaxial layer. In this case, there is a problem that an inversion layer, in which the p type is inverted to the n type, is formed in the p type, consequently causing an undesired increase of current.

An object of the present invention is thus to provide a semiconductor device with which undesired increase of current can be suppressed in a structure with a bidirectional Zener diode formed inside a trench.

BRIEF DESCRIPTION OF DRAWINGS

FIG. 8A to FIG. 8M are sectional views for describing a method for manufacturing the semiconductor device of FIG. 1.

FIG. 22 is a diagram of gate-source breakdown waveforms.

FIG. 23 is a diagram for describing a mechanism of breakdown of a bidirectional Zener diode according to a first mode.

DESCRIPTION OF EMBODIMENTS

Figure 1:
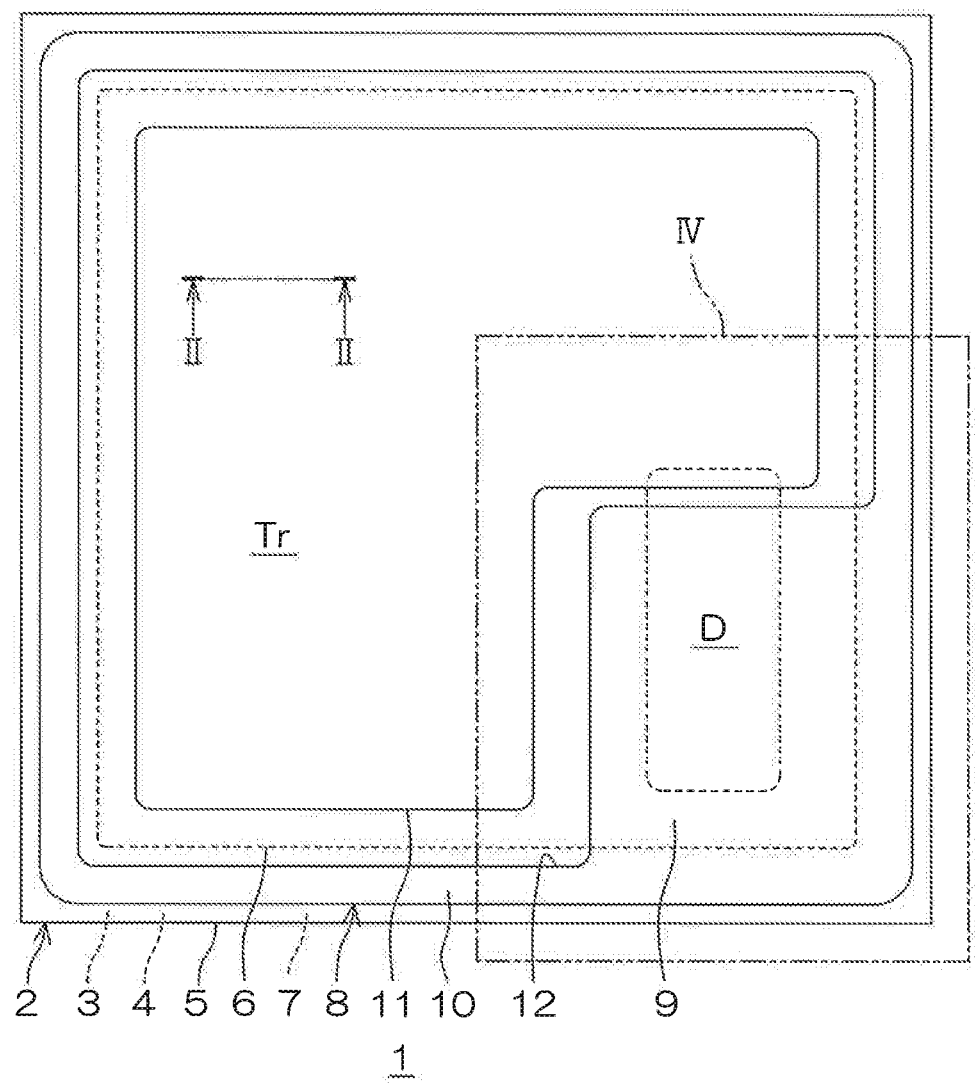
FIG. 1 is a plan view of a semiconductor device according to a first preferred embodiment of the present invention.

A semiconductor device according to a preferred embodiment of the present invention includes a semiconductor layer of a first conductivity type, having a main surface with a diode trench formed therein, an inner wall insulating film, including a side wall insulating film, formed along side walls of the diode trench, and a bottom wall insulating film, formed along a bottom wall of the diode trench and having a thickness greater than a thickness of the side wall insulating film, and a bidirectional Zener diode, formed on the bottom wall insulating film inside the diode trench and having a pair of first conductivity type portions and at least one second conductivity type portion formed between the pair of first conductivity type portions.

A semiconductor device according to another preferred embodiment of the present invention includes a semiconductor layer of a first conductivity type, having a main surface with a diode trench formed therein, an inner wall insulating film, formed along an inner wall of the diode trench, a bidirectional Zener diode, formed inside the diode trench and having a pair of first conductivity type portions and at least one second conductivity type portion formed between the pair of first conductivity type portions, and a floating region of the second conductivity type formed in a region of the semiconductor layer oriented along a bottom wall of the diode trench.

Effects of Invention

With the semiconductor device according to one preferred embodiment of the present invention, the bottom wall insulating film is interposed between the bottom wall of the diode trench and the bidirectional Zener diode. An inversion suppressing structure that suppresses inversion of the conductivity type of the second conductivity type portion of the bidirectional Zener diode to the first conductivity type is formed by the bottom wall insulating film.

The inversion of the conductivity type of the second conductivity type portion to the first conductivity type can thereby be suppressed even when a voltage drop occurs across the pair of first conductivity type portions. A semiconductor device with which undesired increase of current can be suppressed can thus be provided.

With the semiconductor device according to the other preferred embodiment of the present invention, the inner wall insulating film is interposed between the bottom wall of the diode trench and the bidirectional Zener diode. In addition, the floating region of the second conductivity type, which faces the bidirectional Zener diode across the inner wall insulating film, is formed in the semiconductor layer. An inversion suppressing structure that suppresses the inversion of the conductivity type of the second conductivity type portion of the bidirectional Zener diode to the first conductivity type is formed by the inner wall insulating film and the floating region.

The inversion of the conductivity type of the second conductivity type portion to the first conductivity type can thereby be suppressed even when a voltage drop occurs across the pair of first conductivity type portions. A semiconductor device with which undesired increase of current can be suppressed can thus be provided.

Preferred embodiments of the present invention shall now be described in detail with reference to the attached drawings.

First Preferred Embodiment

FIG. 1 is a plan view of a semiconductor device 1 according to a first preferred embodiment of the present invention.

The semiconductor device 1 according to the present preferred embodiment is a composite type semiconductor device that integrally includes an insulated gate type field effect transistor Tr and a bidirectional Zener diode D. The bidirectional Zener diode D is formed, for example, as a protecting element that protects the insulated gate type field effect transistor Tr from overvoltage and overcurrent.

Referring to FIG. 1, the semiconductor device 1 includes a semiconductor layer 2. The semiconductor layer 2 includes a first main surface 3, a second main surface 4, positioned at an opposite side of the first main surface 3, and side surfaces 5 connecting the first main surface 3 and the second main surface 4. The semiconductor layer 2 is formed to a quadrilateral chip shape in a plan view of viewing from a direction of a normal to the first main surface 3 (hereinafter referred to simply as "plan view").

An element forming region 6 and an outer region 7, which is a region at an outer side of the element forming region 6, are set in the semiconductor layer 2. The element forming region 6 is a region in which the insulated gate type field effect transistor Tr and the bidirectional Zener diode D are formed.

In the present preferred embodiment, the element forming region 6 is set to a quadrilateral shape in plan view that has four sides parallel to respective sides of the semiconductor layer 2. The element forming region 6 is set at an inner side of the semiconductor layer 2 across an interval from a peripheral edge of the semiconductor layer 2. In the present preferred embodiment, the outer region 7 is set to an endless shape (a quadrilateral annular shape in plan view) in a region between side walls of the semiconductor layer 2 and a peripheral edge of the element forming region 6 so as to surround the element forming region 6.

A front surface electrode 8 is formed on the first main surface 3 of the semiconductor layer 2. The front surface electrode 8 may, for example, contain at least one type of material among copper, an alloy containing copper, aluminum, and an alloy containing aluminum. The front surface electrode 8 may, for example, contain an aluminum-copper alloy (Al—Cu alloy) or may contain an aluminum-silicon-copper alloy (Al—Si—Cu alloy).

The front surface electrode 8 includes a gate pad 9, a gate finger 10, and a source pad 11. The gate pad 9 and the gate finger 10 form a gate electrode of the insulated gate type field effect transistor Tr. The source pad 11 forms a source electrode of the insulated gate type field effect transistor Tr.

In plan view, the gate pad 9 is formed along one corner portion that connects two side surfaces 5 of the semiconductor layer 2. The gate pad 9 is formed to a quadrilateral shape in plan view. The gate finger 10 is formed integral to the gate pad 9. In the outer region 7, the gate finger 10 is formed along a periphery of the element forming region 6. The gate finger 10 is formed to an endless shape (a quadrilateral annular shape in plan view) that surrounds the element forming region 6.

An insulating region 12 is formed inside a region surrounded by the gate pad 9 and the gate finger 10. The insulating region 12 extends along an inner edge of the gate pad 9 and an inner edge of the gate finger 10 and electrically separates the gate pad 9 and the source pad 11. The source pad 11 is formed to an L shape in plan view inside a region surrounded by the insulating region 12.

Figure 2:
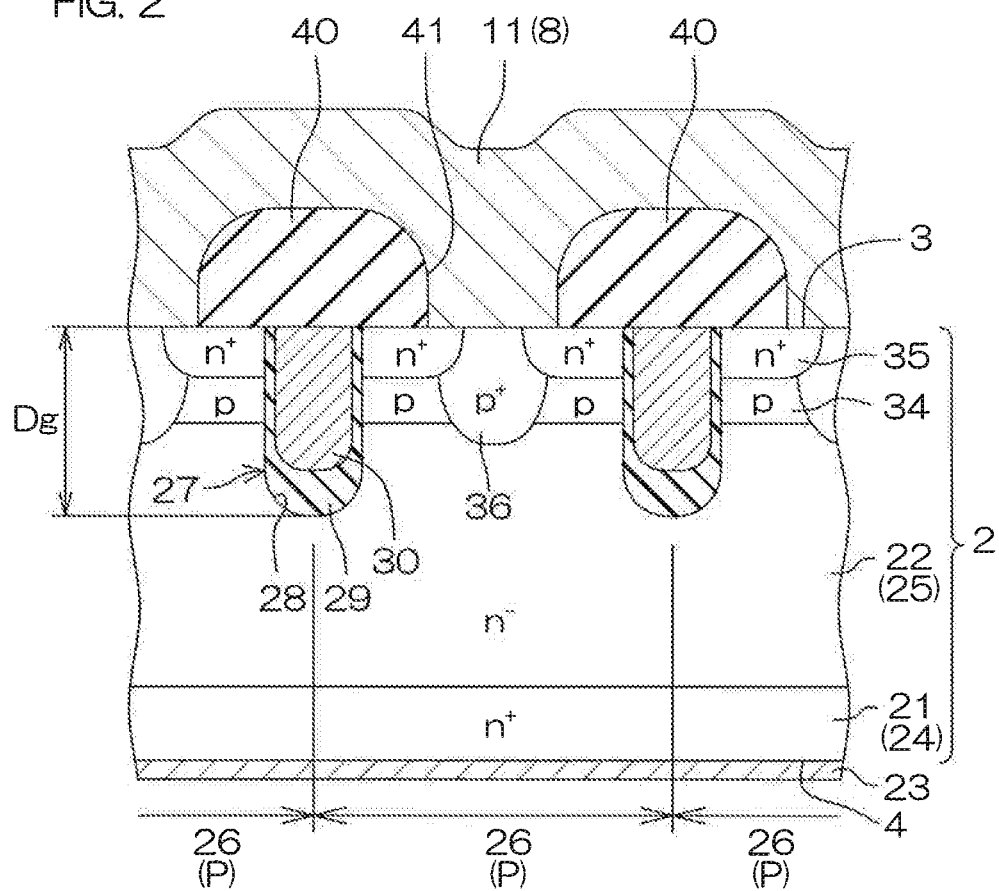
FIG. 2 is a sectional view taken along line II-II in FIG. 1.

FIG. 2 is a sectional view taken along line II-II in FIG. 1.

With reference to FIG. 2, the semiconductor layer 2 includes an n$^+$ type semiconductor substrate 21, made of silicon, and an n$^-$ type epitaxial layer 22 formed on a main surface of the n$^+$ type semiconductor substrate 21. The first main surface 3 of the semiconductor layer 2 is formed by the n$^-$ type epitaxial layer 22, and the second main surface 4 of the semiconductor layer 2 is formed by the n$^+$ type semiconductor substrate 21.

An n type impurity concentration of the n$^+$ type semiconductor substrate 21 is, for example, not less than $1.0\times10^{19}$ cm$^{-3}$ and not more than $1.0\times10^{20}$ cm$^{-3}$. An n type impurity concentration of the n$^-$ type epitaxial layer 22 is, for example, not less than $1.0\times10^{15}$ cm$^{-3}$ and not more than $1.0\times10^{17}$ cm$^{-3}$.

A drain electrode 23 is connected to the second main surface 4 of the semiconductor layer 2. The $n^+$ type semiconductor substrate 21 is thereby formed as an $n^+$ type drain region 24 and the $n^-$ type epitaxial layer 22 is formed as an $n^-$ type drift drain region 25. The same electrode material as that of the front surface electrode 8 may be adopted as the electrode material of the drain electrode 23.

Trench gate structures 27 are formed in the element forming region 6 directly under the source pad 11. The trench gate structures 27 define unit cells 26 of the insulated gate type field effect transistor Tr. Each trench gate structure 27 includes a gate trench 28, a first inner wall insulating film 29, and an embedded gate electrode 30. In the trench gate structure 27, the first inner wall insulating film 29 is formed as a gate insulating film.

The gate trenches 28 are formed in the first main surface 3 of the semiconductor layer 2. The gate trenches 28 may be formed in stripes in plan view or may be formed in a lattice in plan view. A cell pitch P of the unit cells 26 that is defined by the distance between mutually adjacent gate trenches 28 is, for example, not less than 1.0 μm and not more than 2.0 μm. Each gate trench 28 has an inner wall that includes side walls and a bottom wall.

The first inner wall insulating film 29 is formed along the inner wall of each gate trench 28. The embedded gate electrode 30 is embedded in the gate trench 28 across the first inner wall insulating film 29. The first inner wall insulating film 29 may contain silicon oxide ($SiO_2$). The embedded gate electrode 30 may include polysilicon having conductivity.

Although unillustrated, the trench gate structures 27 are electrically connected to the gate finger 10 in the outer region 7. Power is supplied to the unit cells 26 by the trench gate structures 27.

Figure 3:
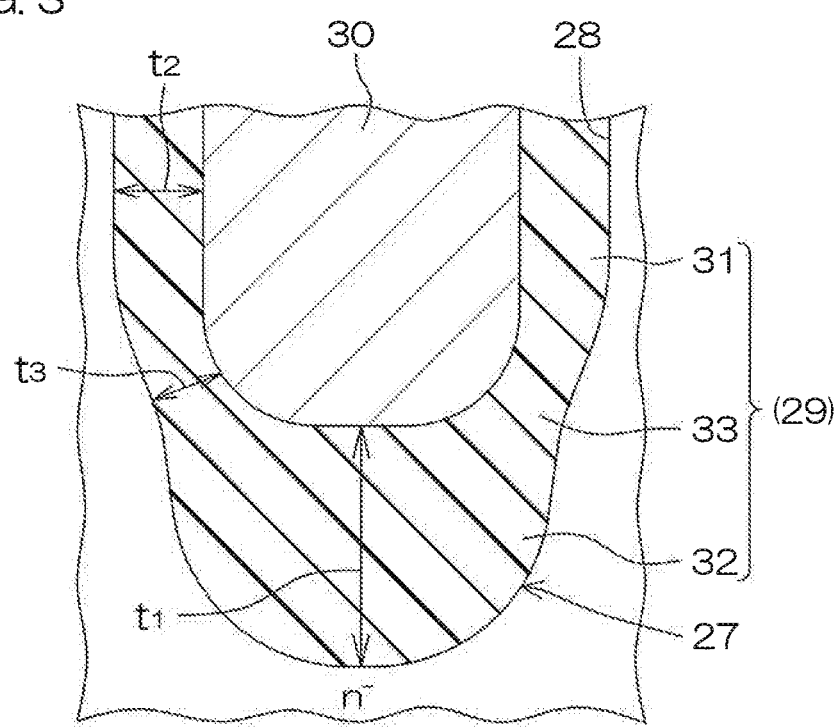
FIG. 3 is a diagram of a principal portion of a trench gate structure.

FIG. 3 is a diagram of a principal portion of a trench gate structure 27.

With reference to FIG. 3, each first inner wall insulating film 29 integrally includes a first side wall insulating film 31, a first bottom wall insulating film 32, and a first connection insulating film 33. The first side wall insulating film 31 is formed along the side walls of the corresponding gate trench 28. The first bottom wall insulating film 32 is formed along the bottom wall of the gate trench 28. The first connection insulating film 33 is formed along connection portions connecting the side walls and the bottom wall of the gate trench 28.

A thickness t1 of the first bottom wall insulating film 32 is greater than a thickness t2 of the first side wall insulating film 31 (thickness t2<thickness t1). A thickness t3 of the first connection insulating film 33 is not more than the thickness t2 of the first side wall insulating film 31 (thickness t3≤thickness t2<thickness t1).

A ratio t1/Dg of the thickness t1 of the first bottom wall insulating film 32 with respect to a depth Dg of the gate trench 28 is, for example, not less than 0.08 and not more than 0.35. A ratio t2/t1 of the thickness t2 of the first side wall insulating film 31 with respect to the thickness t1 of the first bottom wall insulating film 32 is, for example, not less than 0.16 and not more than 0.6.

The depth Dg of the gate trench 28 is, for example, not less than 9000 Å and not more than 12000 Å (approximately 10000 Å in the present preferred embodiment). The thickness t1 of the first bottom wall insulating film 32 is, for example, not less than 1000 Å and not more than 3000 Å. The thickness t2 of the first side wall insulating film 31 is, for example, not less than 500 Å and not more than 600 Å.

The thickness t3 of the first connection insulating film 33 is, for example, not less than 400 Å and not more than 600 Å.

Referring to FIG. 2 again, at sides of the trench gate structures 27, p type body regions 34 are formed in surface layer portions of the first main surface 3 of the semiconductor layer 2. Each p type body region 34 is shared by mutually adjacent trench gate structures 27. In the present preferred embodiment, p type body regions 34 are formed across substantially the entirety of the first main surface 3 of the semiconductor layer 2. An impurity concentration of the p type body regions 34 is, for example, not less than $1.0 \times 10^{15}$ $cm^{-3}$ and not more than $1.0 \times 10^{17}$ $cm^{-3}$.

At sides of the trench gate structures 27, $n^+$ type source regions 35 are formed in surface layer portions of the p type body regions 34. The $n^+$ type source regions 35 are exposed from the first main surface 3 of the semiconductor layer 2. An n type impurity concentration of the $n^+$ type source regions 35 is higher than the n type impurity concentration of the $n^-$ type epitaxial layer 22 and is, for example, not less than $1.0 \times 10^{19}$ $cm^{-3}$ and not more than $1.0 \times 10^{20}$ $cm^{-3}$.

At sides of the trench gate structures 27, $p^+$ type body contact regions 36 are formed in surface layer portions of the p type body regions 34. The $p^+$ type body contact regions 36 penetrate through the $n^+$ type source regions 35 from the first main surface 3 of the semiconductor layer 2 and are connected to the p type body regions 34. A p type impurity concentration of the $p^+$ type body contact regions 36 is higher than the p type impurity concentration of the p type body regions 34 and is, for example, not less than $1.0 \times 10^{16}$ $cm^{-3}$ and not more than $1.0 \times 10^{17}$ $cm^{-3}$.

At sides of the trench gate structures 27, the $n^+$ type source regions 35, the p type body regions 34, and the $n^-$ type epitaxial layer 22 ($n^-$ type drift drain region 25) are formed successively from the first main surface 3 toward the second main surface 4 of the semiconductor layer 2.

The embedded gate electrodes 30 face the $n^+$ type source regions 35, the p type body regions 34, and the $n^-$ type epitaxial layer 22 across the first side wall insulating films 31. In each p type body region 34, regions between the corresponding $n^+$ type source regions 35 and the $n^-$ type epitaxial layer 22 are channels of the insulated gate type field effect transistor Tr.

An insulating layer 40, covering the trench gate structures 27 is formed on the first main surface 3 of the semiconductor layer 2. The insulating layer 40 may have a laminated structure formed by laminating a plurality of insulating films or may have a single layer structure that includes only a single insulating film. The insulating layer 40 may contain, for example, silicon oxide ($SiO_2$) or silicon nitride (SiN).

Source contact holes 41 are formed in the insulating layer 40. The source contact holes 41 expose the $n^+$ type source regions 35 and the p type body regions 34 from the insulating layer 40.

The source pad 11 described above is formed over the insulating layer 40. The source pad 11 enters into the source contact holes 41 from above the insulating layer 40. The source pad 11 is connected to the $n^+$ type source regions 35 and the $p^+$ type body contact regions 36 inside the source contact holes 41.

Figure 4:
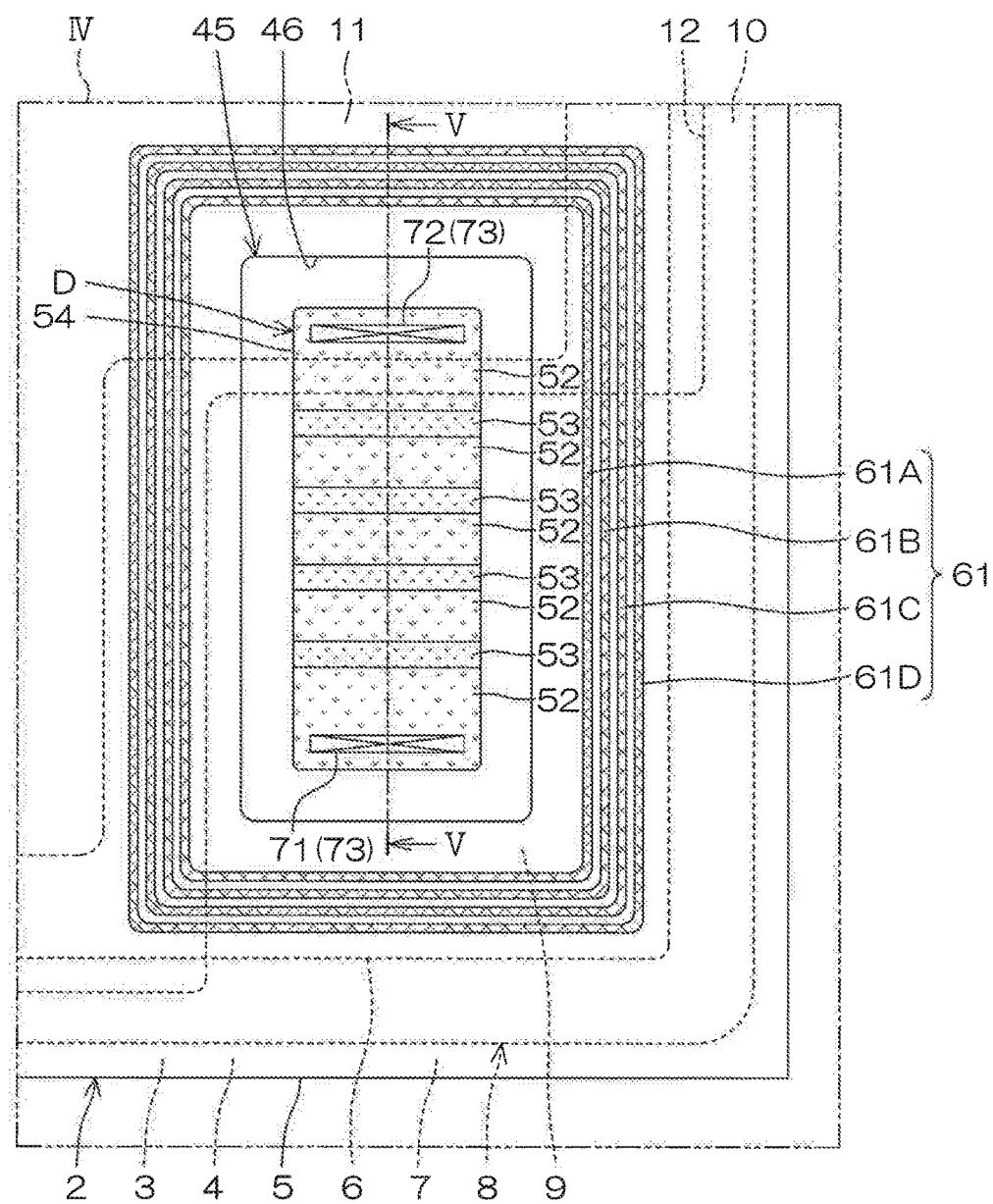
FIG. 4 is an enlarged view of a region surrounded by alternate long and two short dashes line IV in FIG. 1.
Figure 5:
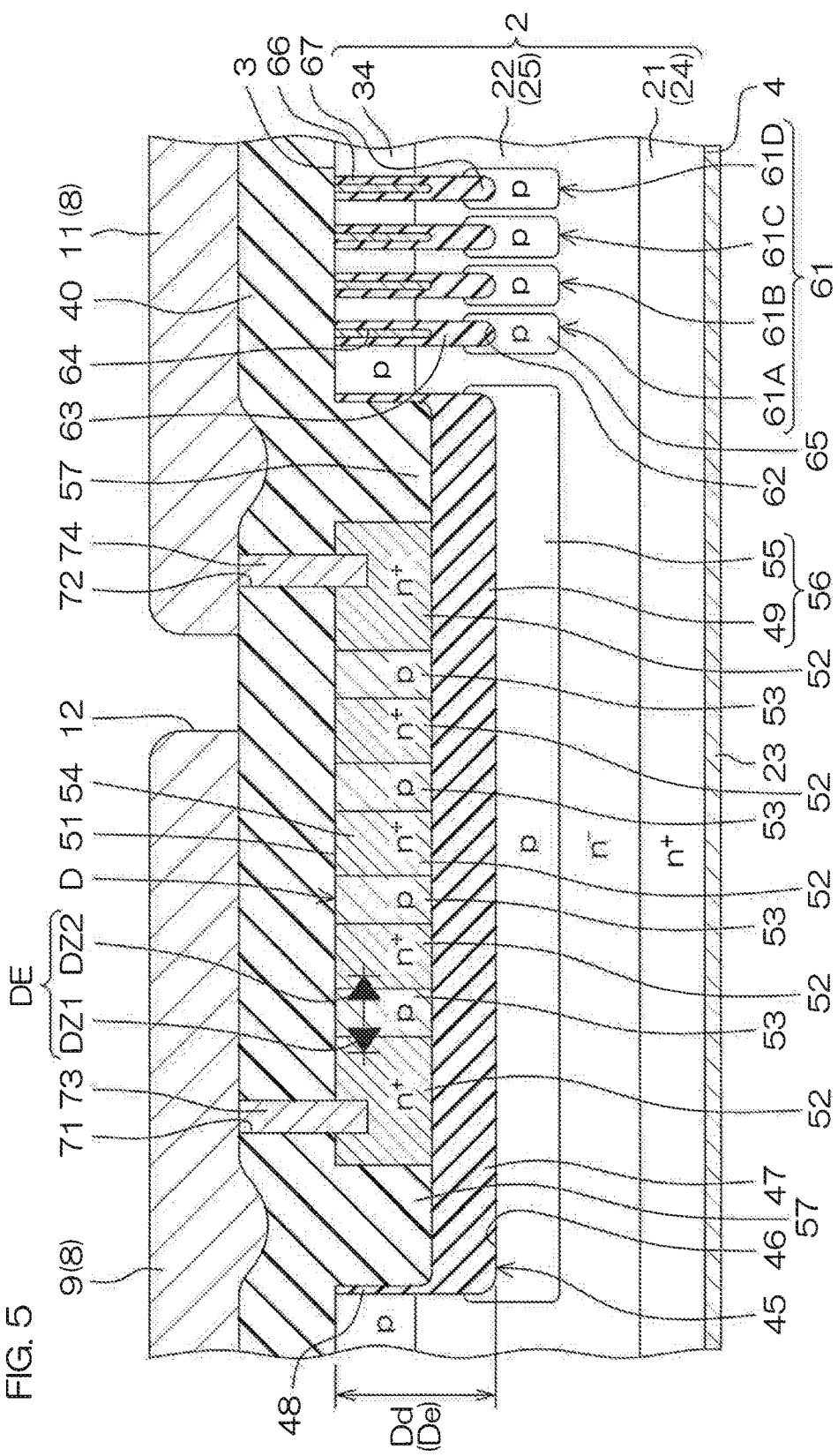
FIG. 5 is a sectional view taken along line V-V in FIG. 4.

FIG. 4 is an enlarged view of a region surrounded by alternate long and two short dashes line IV in FIG. 1. FIG. 5 is a sectional view taken along line V-V in FIG. 4. For convenience of description, the gate pad 9 and the source pad 11 are indicated by broken lines and a layout of the first main surface 3 of the semiconductor layer 2 is indicated by solid lines in FIG. 4.

With reference to FIG. 4 and FIG. 5, a trench diode structure 45 is formed in the element forming region 6 directly under the gate pad 9. The trench diode structure 45 includes a diode trench 46, a second inner wall insulating film 47, and a bidirectional Zener diode D.

The diode trench 46 is formed in a main surface of the semiconductor layer 2. The diode trench 46 is led out from a region directly under the gate pad 9 to a region directly under the source pad 11. In the present preferred embodiment, the diode trench 46 is formed to a rectangular shape in plan view.

The diode trench 46 has a depth Dd substantially equal to the depth Dg of the gate trenches 28. Therefore the depth Dd of the diode trench 46 is, for example, not less than 9000 Å and not more than 12000 Å (approximately 10000 Å in the present preferred embodiment).

The diode trench 46 has one end portion positioned in the region directly under the gate pad 9 and another end portion positioned in the region directly under the source pad 11. The diode trench 46 has an inner wall that includes side walls and a bottom wall.

The second inner wall insulating film 47 is formed along the inner wall of the diode trench 46. The bidirectional Zener diode D is embedded in the diode trench 46 across the second inner wall insulating film 47.

Figure 6:
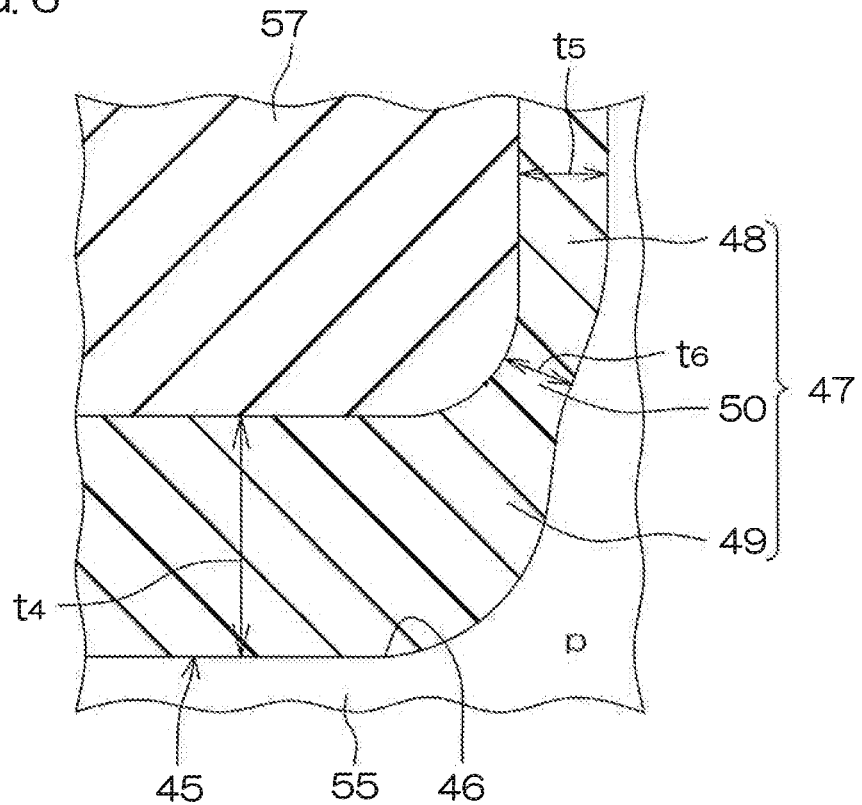
FIG. 6 is a diagram of a principal portion of a trench diode structure.

FIG. 6 is a diagram of a principal portion of the trench diode structure 45.

Referring to FIG. 6, the second inner wall insulating film 47 has a structure substantially similar to that of each first inner wall insulating film 29. More specifically, the second inner wall insulating film 47 integrally includes a second side wall insulating film 48, a second bottom wall insulating film 49, and a second connection insulating film 50. The second side wall insulating film 48 is formed along the side walls of the diode trench 46. The second bottom wall insulating film 49 is formed along the bottom wall of the diode trench 46. The second connection insulating film 50 is formed along connection portions connecting the side walls and the bottom wall of the diode trench 46.

A thickness t4 of the second bottom wall insulating film 49 is greater than a thickness t5 of the second side wall insulating film 48 (thickness t5<thickness t4). A thickness t6 of the second connection insulating film 50 is not more than the thickness t5 of the second side wall insulating film 48 (thickness t6≤thickness t5<thickness t4).

A ratio t4/Dd of the thickness t4 of the second bottom wall insulating film 49 with respect to the depth Dd of the diode trench 46 is, for example, not less than 0.08 and not more than 0.35. A ratio t5/t4 of the thickness t5 of the second side wall insulating film 48 with respect to the thickness t4 of the second bottom wall insulating film 49 is, for example, not less than 0.16 and not more than 0.6.

In the present preferred embodiment, the thickness t4 of the second bottom wall insulating film 49 is substantially equal to the thickness t1 of the first bottom wall insulating films 32 (thickness t4=thickness t1 or thickness t4÷thickness t1). In the present preferred embodiment, the thickness t5 of the second side wall insulating film 48 is substantially equal to the thickness t2 of the first side wall insulating films 31 (thickness t5=thickness t2 or thickness t5÷thickness t2). In the present preferred embodiment, the thickness t6 of the second connection insulating film 50 is substantially equal to the thickness t3 of the first connection insulating films 33 (thickness t6=thickness t3 or thickness t6÷thickness t3).

Referring again to FIG. 4 and FIG. 5, the bidirectional Zener diode D is formed on the second bottom wall insulating film 49 inside the diode trench 46. In the present preferred embodiment, the bidirectional Zener diode D is formed to a rectangular shape extending along the diode trench 46 in plan view. The bidirectional Zener diode D has one end portion positioned in the region directly under the gate pad 9 and another end portion positioned in the region directly under the source pad 11.

The bidirectional Zener diode D has a flat upper surface 51 facing an opening of the diode trench 46. The upper surface 51 of the bidirectional Zener diode D is formed substantially parallel to the bottom wall of the diode trench 46.

In the direction of the normal to the first main surface 3 of the semiconductor layer 2, a distance between the first main surface 3 of the semiconductor layer 2 and the bottom wall of the diode trench 46 is substantially equal to a distance between the upper surface 51 of the bidirectional Zener diode D and the bottom wall of the diode trench 46. The upper surface 51 of the bidirectional Zener diode D is thus formed on the same plane as the first main surface 3 of the semiconductor layer 2.

The bidirectional Zener diode D is formed across an interval from the side walls of the diode trench 46. Side walls of the bidirectional Zener diode D are formed inside a region surrounded by the side walls of the diode trench 46. A distance between the side walls of the bidirectional Zener diode D and the side walls of the diode trench 46 is greater than a thickness of the bidirectional Zener diode D.

The bidirectional Zener diode D includes $n^+$ type portions 52 (first conductivity type portions) and p type portions 53 (second conductivity type portions) and has a structure in which the $n^+$ type portions 52 and the p type portion 53 are repeated alternately. The $n^+$ type portions 52 are respectively formed at the one end portion and the other end portion of the bidirectional Zener diode D. The $n^+$ type portions 52 and the p type portions 53 are formed alternately repeatedly in a region between the pair of $n^+$ type portions 52 formed at the respective end portions of the bidirectional Zener diode D.

In the present preferred embodiment, the $n^+$ type portions 52 and the p type portions 53 are formed in bands, which, in plan view, extend along an intersecting direction intersecting a direction in which the diode trench 46 extends. The $n^+$ type portions 52 and the p type portions 53 are thereby formed in stripes extending along the intersecting direction. The intersecting direction may be an orthogonal direction orthogonal to the direction in which the diode trench 46 extends.

A pn junction portion is formed in each region between an $n^+$ type portion 52 and a p type portion 53. Zener diodes DZ1 and DZ2, each having an $n^+$ type portion 52 as a cathode and a p type portion 53 as an anode, are formed by the pn junction portions.

The bidirectional Zener diode D includes a plurality (four in the present preferred embodiment) of bidirectional Zener diode elements DE. Each bidirectional Zener diode element DE includes a pair of the Zener diodes DZ1 and DZ2 that are electrically connected to each other via an anode (a p type portion 53).

Mutually adjacent bidirectional Zener diode elements DE are electrically connected to each other via a cathode (an $n^+$ type portion 52). In the present preferred embodiment, a single bidirectional Zener diode D is formed by such a plurality of bidirectional Zener diode elements DE.

The bidirectional Zener diode D may have structure that includes only one bidirectional Zener diode element DE. The bidirectional Zener diode D may thus have a pair of $n^+$ type portions 52 and at least one p type portion 53 formed between the pair of $n^+$ type portions 52.

In the present preferred embodiment, the bidirectional Zener diode D includes a polysilicon body 54. In the present preferred embodiment, each n+ type portion 52 includes an n+ type impurity region formed by selectively implanting an n type impurity into the polysilicon body 54. In the present preferred embodiment, each p type portion 53 includes a p type impurity region formed by selectively implanting a p type impurity into the polysilicon body 54.

The n+ type portions 52 may have an n type impurity concentration substantially equal to the n type impurity concentration of the n+ type source regions 35. The p type portions 53 may have a p type impurity concentration substantially equal to the p type impurity concentration of the p type body regions 34.

Referring to FIG. 5, a p type floating region 55 is formed in a region of the semiconductor layer 2 along the bottom wall of the diode trench 46. The p type floating region 55 is formed along portions of the side walls of the diode trench 46 in addition to the bottom wall of the diode trench 46. The p type floating region 55 also covers corner portions connecting the side walls and the bottom wall of the diode trench 46. A p type impurity concentration of the p type floating region 55 is, for example, not less than $1.0 \times 10^{15}$ cm$^{-3}$ and not more than $1.0 \times 10^{17}$ cm$^{-3}$.

In the present preferred embodiment, the second bottom wall insulating film 49 is interposed between the bottom wall of the diode trench 46 and the bidirectional Zener diode D. In addition, the p type floating region 55, facing the bidirectional Zener diode D across the second bottom wall insulating film 49, is formed in the semiconductor layer 2. An inversion suppressing structure 56 that suppresses inversion of the conductivity type of the p type portions 53 of the bidirectional Zener diode D to the n type is formed by the second bottom wall insulating film 49 and the p type floating region 55.

Referring to FIG. 5, a side wall protection film 57, with an insulating property, is formed on the side walls of the bidirectional Zener diode D. The side wall protection film 57 fills a region between the side walls of the bidirectional Zener diode D and the side walls of the diode trench 46. The bidirectional Zener diode D is protected from the side wall sides by the side wall protection film 57. Also, by the side wall protection film 57, an insulating property between the bidirectional Zener diode D and the semiconductor layer 2 is improved in regard to a lateral direction parallel to the first main surface 3 of the semiconductor layer 2.

Referring to FIG. 4 and FIG. 5, in the element forming region 6, electric field relaxation structures 61, each of which relaxes an electric field in a peripheral region along a peripheral edge of the diode trench 46, are formed in the peripheral region. In the present preferred embodiment, the electric field relaxation structures 61 include a plurality (four, in the present preferred embodiment) of electric field relaxation structures 61A, 61B, 61C, and 61D formed at intervals in that order in a direction away from the diode trench 46.

The electric field relaxation structures 61A, 61B, 61C, and 61D are formed so as to surround the diode trench 46. Each of the electric field relaxation structures 61A, 61B, 61C, and 61D includes an electric field relaxation trench 62, a third inner wall insulating film 63, an embedded conductor 64, and a p type floating region 65.

Each electric field relaxation trench 62 is formed in the first main surface 3 of the semiconductor layer 2. In the present preferred embodiment, the electric field relaxation trench 62 is formed to an endless shape in plan view (a quadrilateral annular shape in plan view) that surrounds a periphery of the diode trench 46.

The electric field relaxation trench 62 has a depth De substantially equal to the depth Dg of the gate trenches 28 and the depth Dd of the diode trench 46. Therefore the depth De of the electric field relaxation trench 62 is, for example, not less than 9000 Å and not more than 12000 Å (approximately 10000 Å in the present preferred embodiment). The electric field relaxation trench 62 has an inner wall that includes side walls and a bottom wall.

The third inner wall insulating film 63 is formed along the inner wall of the electric field relaxation trench 62. The embedded conductor 64 is embedded in the electric field relaxation trench 62 across the third inner wall insulating film 63. The third inner wall insulating film 63 may contain silicon oxide. The embedded conductor 64 may contain polysilicon having conductivity.

Figure 7:
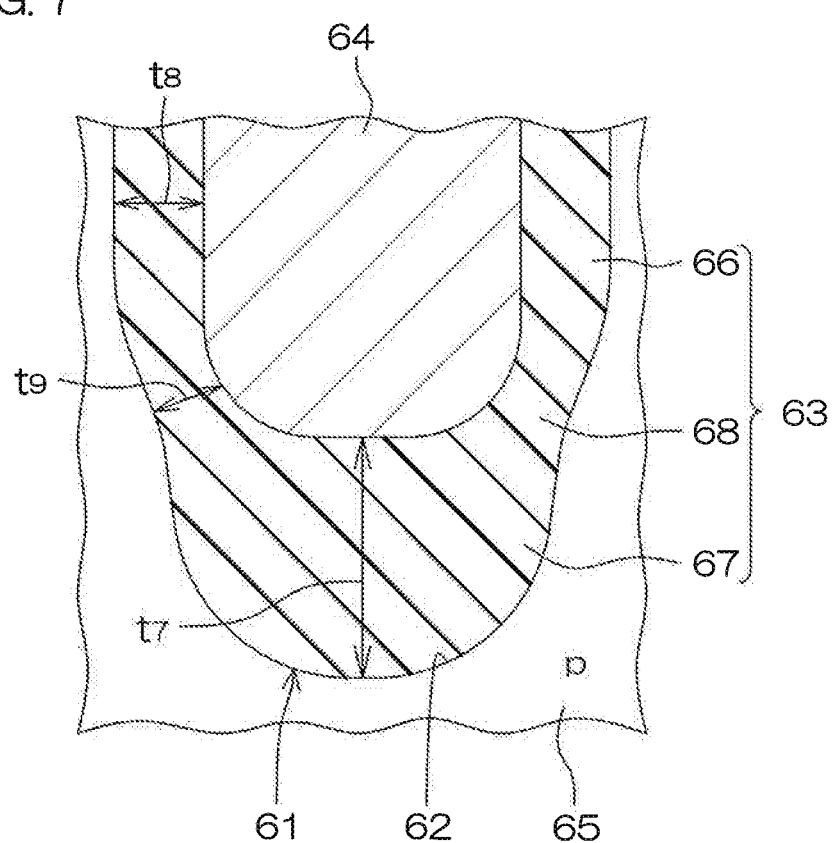
FIG. 7 is a diagram of a principal portion of an electric field relaxation structure.

FIG. 7 is a diagram of a principal portion of an electric field relaxation structure 61.

Each third inner wall insulating film 63 has a structure substantially similar to those of each first inner wall insulating film 29 and the second inner wall insulating film 47. More specifically, the third inner wall insulating film 63 integrally includes a third side wall insulating film 66, a third bottom wall insulating film 67, and a third connection insulating film 68.

The third side wall insulating film 66 is formed along the side walls of the electric field relaxation trench 62. The third bottom wall insulating film 67 is formed along the bottom wall of the electric field relaxation trench 62. The third connection insulating film 68 is formed along connection portions connecting the side walls and the bottom wall of the electric field relaxation trench 62.

A thickness t7 of the third bottom wall insulating film 67 is greater than a thickness t8 of the third side wall insulating film 66 (thickness t8<thickness t7). A thickness t9 of the third connection insulating film 68 is not more than the thickness t8 of the third side wall insulating film 66 (thickness t9≤thickness t8<thickness t7).

A ratio t7/De of the thickness t7 of the third bottom wall insulating film 67 with respect to the depth De of the electric field relaxation trench 62 is, for example, not less than 0.08 and not more than 0.35. A ratio t8/t7 of the thickness t8 of the third side wall insulating film 66 with respect to the thickness t7 of the third bottom wall insulating film 67 is, for example, not less than 0.16 and not more than 0.6.

In the present preferred embodiment, the thickness t7 of the third bottom wall insulating film 67 is substantially equal to the thickness t4 of the second bottom wall insulating film 49 (thickness t7=thickness t4 or thickness t7÷thickness t4). In the present preferred embodiment, the thickness t8 of the third side wall insulating film 66 is substantially equal to the thickness t5 of the second side wall insulating film 48 (thickness t8=thickness t5 or thickness t8÷thickness t5). In the present preferred embodiment, the thickness t9 of the third connection insulating film 68 is substantially equal to the thickness t6 of the second connection insulating film 50 (thickness t9=thickness t6 or thickness t9÷thickness t6).

Referring again to FIG. 5, each p type floating region 65 is formed in a region of the semiconductor layer 2 along the bottom wall of the electric field relaxation trench 62. The p type floating region 65 is formed along portions of the side walls of the electric field relaxation trench 62 in addition to the bottom wall of the electric field relaxation trench 62. The p type floating region 65 thus also covers corner portions connecting the side walls and the bottom wall of the electric field relaxation trench 62.

The p type floating regions 65 may have a p type impurity concentration substantially equal to the p type impurity concentration of the p type floating region 55 at the diode trench 46 side. Also, the p type floating regions 65 may be formed to a depth substantially equal to the depth of the p type floating region 55. Electric fields at bottom portions of the electric field relaxation trenches 62, especially, the electric fields at corner portions of the electric field relaxation trenches 62 can be relaxed by the p type floating regions 65.

The number and shapes of the electric field relaxation structures 61 may be changed as suited in accordance with the electric field to be relaxed. Therefore, a structure where only one electric field relaxation structure 61 is formed may be adopted or a structure where eight or more electric field relaxation structures 61 are formed may be adopted. Also, dot-shaped or line-shaped electric field relaxation structures 61 that are discontinuous may be formed so as to surround the peripheral edge of the diode trench 46.

The trench diode structure 45 and the electric field relaxation structures 61 are covered by the insulating layer 40 described above. The side wall protection film 57 formed in the trench diode structure 45 may be formed by a portion of the insulating layer 40. A first contact hole 71 and a second contact hole 72 are formed in the insulating layer 40.

The first contact hole 71 exposes the one end portion ($n^+$ type portion 52) of the bidirectional Zener diode D that is positioned directly below the gate pad 9. A bottom portion of the first contact hole 71 may be positioned inside the one end portion of the bidirectional Zener diode D.

The second contact hole 72 exposes the other end portion ($n^+$ type portion 52) of the bidirectional Zener diode D that is positioned directly below the source pad 11. A bottom portion of the second contact hole 72 may be positioned inside the other end portion of the bidirectional Zener diode D.

A first contact plug 73 is embedded in the first contact hole 71. The first contact plug 73 is electrically connected to the gate pad 9 and the one end portion ($n^+$ type portion 52) of the bidirectional Zener diode D. The first contact plug 73 may contain tungsten (W).

A second contact plug 74 is embedded in the second contact hole 72. The second contact plug 74 is electrically connected to the source pad 11 and the other end portion ($n^+$ type portion 52) of the bidirectional Zener diode D. The second contact plug 74 may contain tungsten (W).

An example of a method for manufacturing the semiconductor device 1 shall now be described. FIG. 8A to FIG. 8M are sectional views for describing the method for manufacturing the semiconductor device 1 of FIG. 1. FIG. 8A to FIG. 8M are sectional views of the portion corresponding to FIG. 5 described above. With FIG. 8A to FIG. 8M, a description mainly focusing on the trench diode structure 45 and the structure of the periphery thereof shall be provided.

First, with reference to FIG. 8A, the $n^+$ type semiconductor substrate 21 is prepared. Next, silicon is grown epitaxially from a main surface of the semiconductor substrate 21 while introducing an n type impurity. The $n^-$ type epitaxial layer 22 is thereby formed on the main surface of the $n^+$ type semiconductor substrate 21. The semiconductor layer 2 is formed by the laminated structure of the $n^+$ type semiconductor substrate 21 and the $n^-$ type epitaxial layer 22. The semiconductor layer 2 has the first main surface 3 and the second main surface 4.

Next, with reference to FIG. 8B, a mask 81 is formed on the first main surface 3 of the semiconductor layer 2. The mask 81 may be a silicon oxide film formed by selectively oxidizing the first main surface 3 of the semiconductor layer 2. The mask 81 selectively has openings 82 exposing regions in which the gate trenches 28, the diode trench 46, and the electric field relaxation trenches 62 are to be formed.

Next, unnecessary portions of the semiconductor layer 2 are removed selectively by etching via the mask 81. The gate trenches 28, the diode trench 46, and the electric field relaxation trenches 62 are thereby formed in the first main surface 3 of the semiconductor layer 2.

Figure 8C:
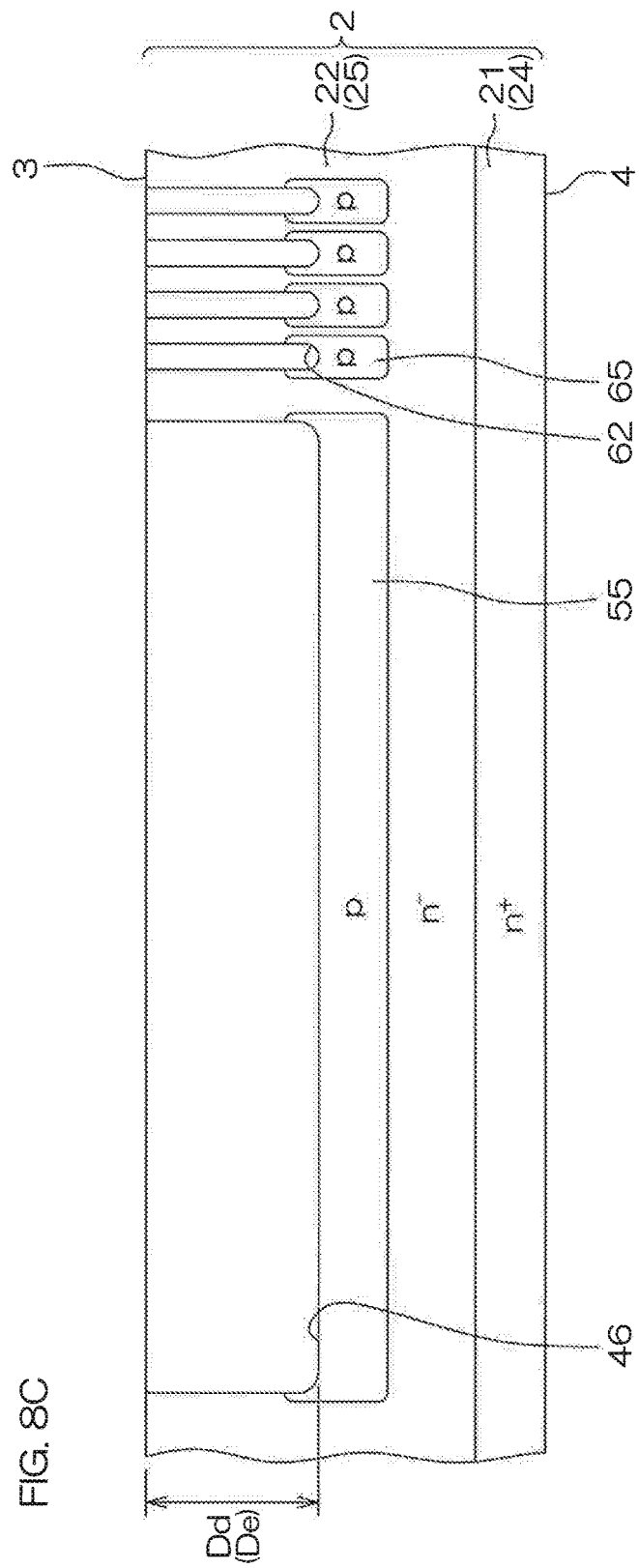

Next, with reference to FIG. 8C, a p type impurity is introduced into portions of the semiconductor layer 2 exposed at bottom portions of the diode trench 46 and the electric field relaxation trenches 62. The p type impurity is, for example, implanted into the semiconductor layer 2 via an unillustrated ion implantation mask. The p type floating region 55 is thereby formed along the bottom portion of the diode trench 46, and the p type floating regions 65 are formed along the bottom portions of the electric field relaxation trenches 62.

Next, with reference to FIG. 8D, an insulating material layer 83 is formed, for example, by a CVD (chemical vapor deposition) method. The insulating material layer 83 is formed so as to fill the gate trenches 28, the diode trench 46, and the electric field relaxation trenches 62 and cover substantially the entirety of the first main surface 3 of the semiconductor layer 2.

Figure 8E:
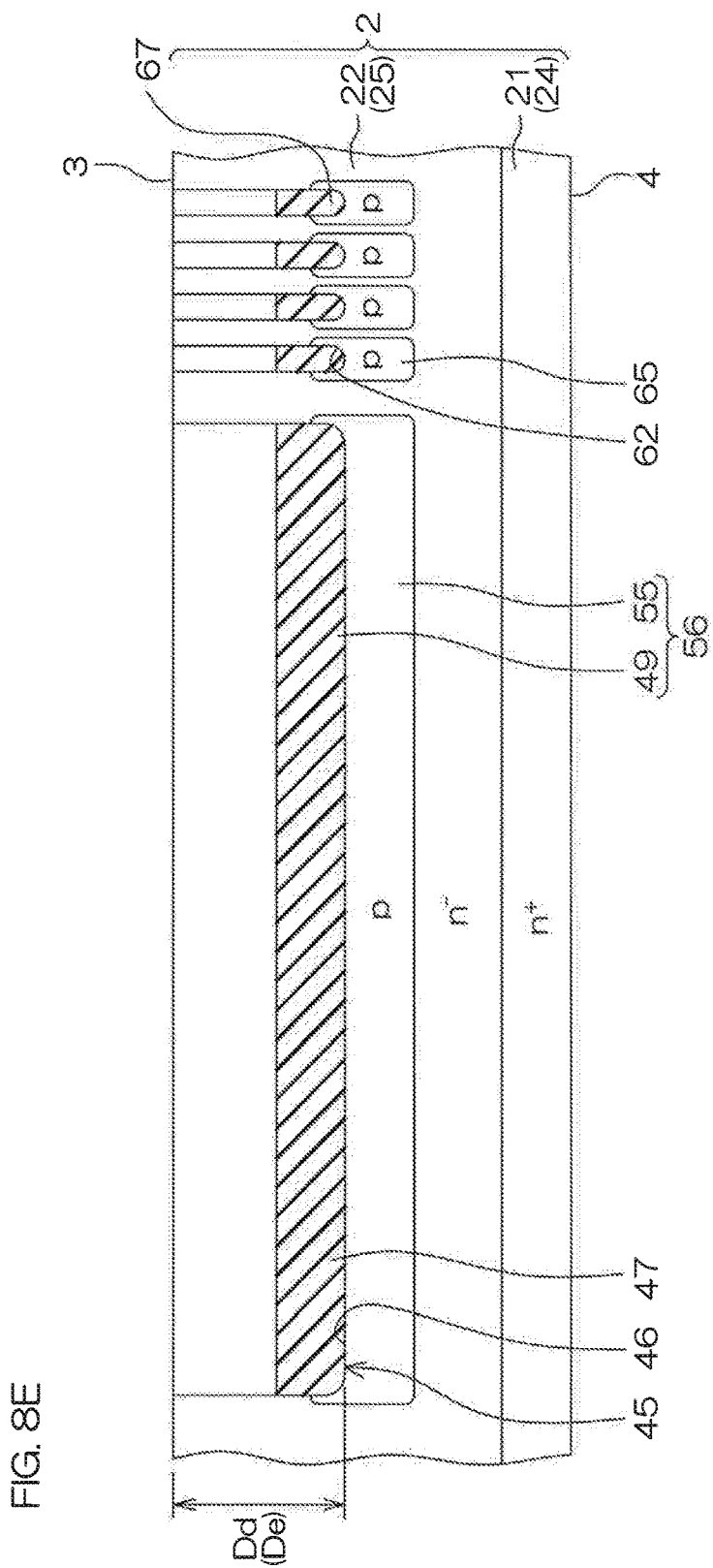

Next, with reference to FIG. 8E, unnecessary portions of the insulating material layer 83 are removed by etching back to intermediate portions in a depth direction of the gate trenches 28, the diode trench 46, and the electric field relaxation trenches 62. The first bottom wall insulating films 32, the second bottom wall insulating film 49, and the third bottom wall insulating films 67 are thereby formed.

Next, with reference to FIG. 8F, portions of the semiconductor layer 2 exposed at the side walls of the gate trenches 28, the side walls of the diode trench 46, and the side walls of the electric field relaxation trenches 62 are oxidized, for example, by a thermal oxidation method or a wet oxidation method. The first side wall insulating films 31, the second side wall insulating film 48, and the third side wall insulating films 66 are thereby formed. The first connection insulating films 33, the second connection insulating film 50, and the third connection insulating films 68 are also formed thereby.

Figure 8G:
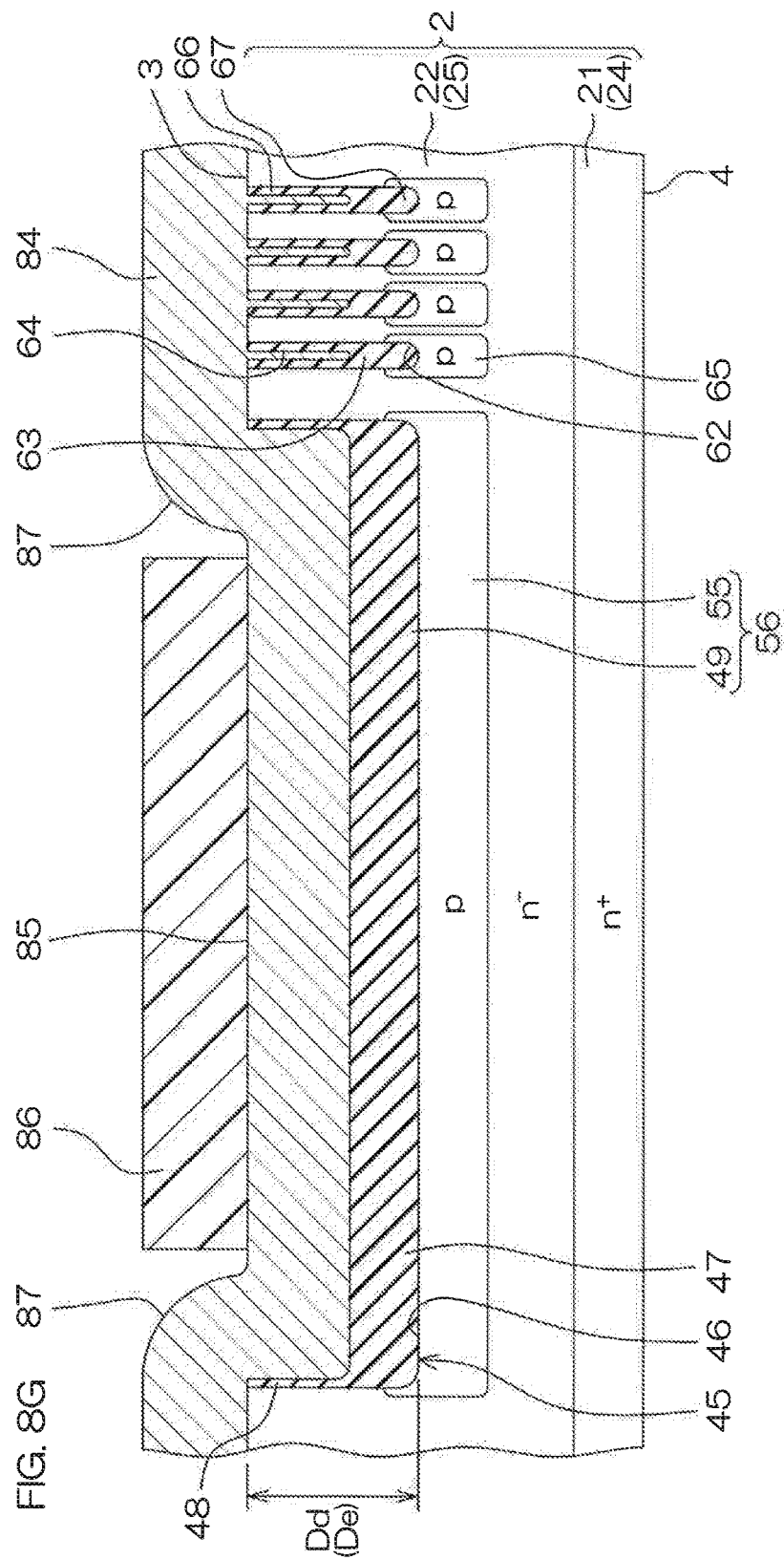

Next, with reference to FIG. 8G, a polysilicon layer 84 is formed, for example, by the CVD method. The polysilicon layer 84 is formed so as to fill the gate trenches 28, the diode trench 46, and the electric field relaxation trenches 62 and cover substantially the entirety of the first main surface 3 of the semiconductor layer 2.

Next, a mask 86, selectively covering a flat region 85, positioned inside the diode trench 46, is formed in the polysilicon layer 84. A step portion 87 is formed between a portion of the polysilicon layer 84 formed inside the diode trench 46 and a portion of the polysilicon layer 84 formed on the first main surface 3 of the semiconductor layer 2. The flat region 85 refers to a flat region surrounded by the step portion 87 in the portion of the polysilicon layer 84 positioned inside the diode trench 46.

Figure 8H:
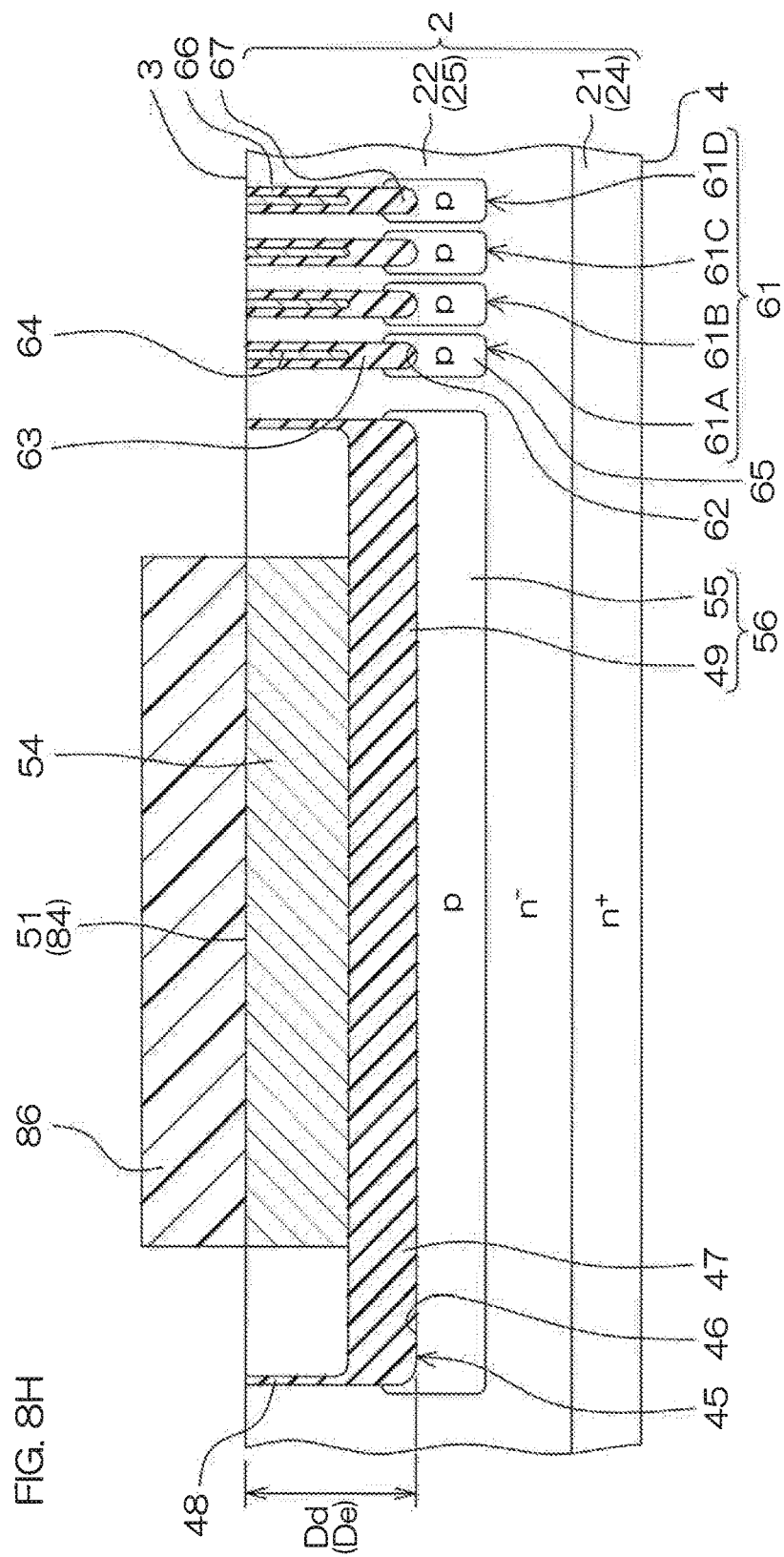

Next, with reference to FIG. 8H, unnecessary portions of the polysilicon layer 84 are removed by etching back via the mask 86. The embedded gate electrodes 30 are thereby formed inside the first bottom wall insulating films 32. Also, the polysilicon body 54, which is to be a basis of the bidirectional Zener diode D, is formed inside the diode trench 46. Also, the embedded conductors 64 are formed inside the electric field relaxation trenches 62.

In this process, the polysilicon body 54, having the flat upper surface 51 facing the opening of the diode trench 46, is formed. In the direction of the normal to the first main surface 3 of the semiconductor layer 2, the distance between the first main surface 3 of the semiconductor layer 2 and the bottom wall of the diode trench 46 is substantially equal to a distance between the upper surface 51 of the polysilicon body 54 and the bottom wall of the diode trench 46. The upper surface 51 of the polysilicon body 54 is thus formed on substantially the same plane as the first main surface 3 of the semiconductor layer 2.

Also in this process, the polysilicon body 54 is formed inside the diode trench 46 across an interval from the side walls of the diode trench 46. Side walls of the polysilicon body 54 are formed inside the region surrounded by the side walls of the diode trench 46. A distance between the side walls of the polysilicon body 54 and the side walls of the diode trench 46 is formed to be greater than a thickness of the polysilicon body 54.

The step portion 87, present between the portion of the polysilicon layer 84 formed on the first main surface 3 of the semiconductor layer 2 and the portion of the polysilicon layer 84 formed inside the diode trench 46, can thereby be removed. Remaining of the step portion 87 as a portion of the polysilicon body 54 can thus be suppressed and the bidirectional Zener diode D, having the flat upper surface 51, can thus be formed.

Figure 8I:
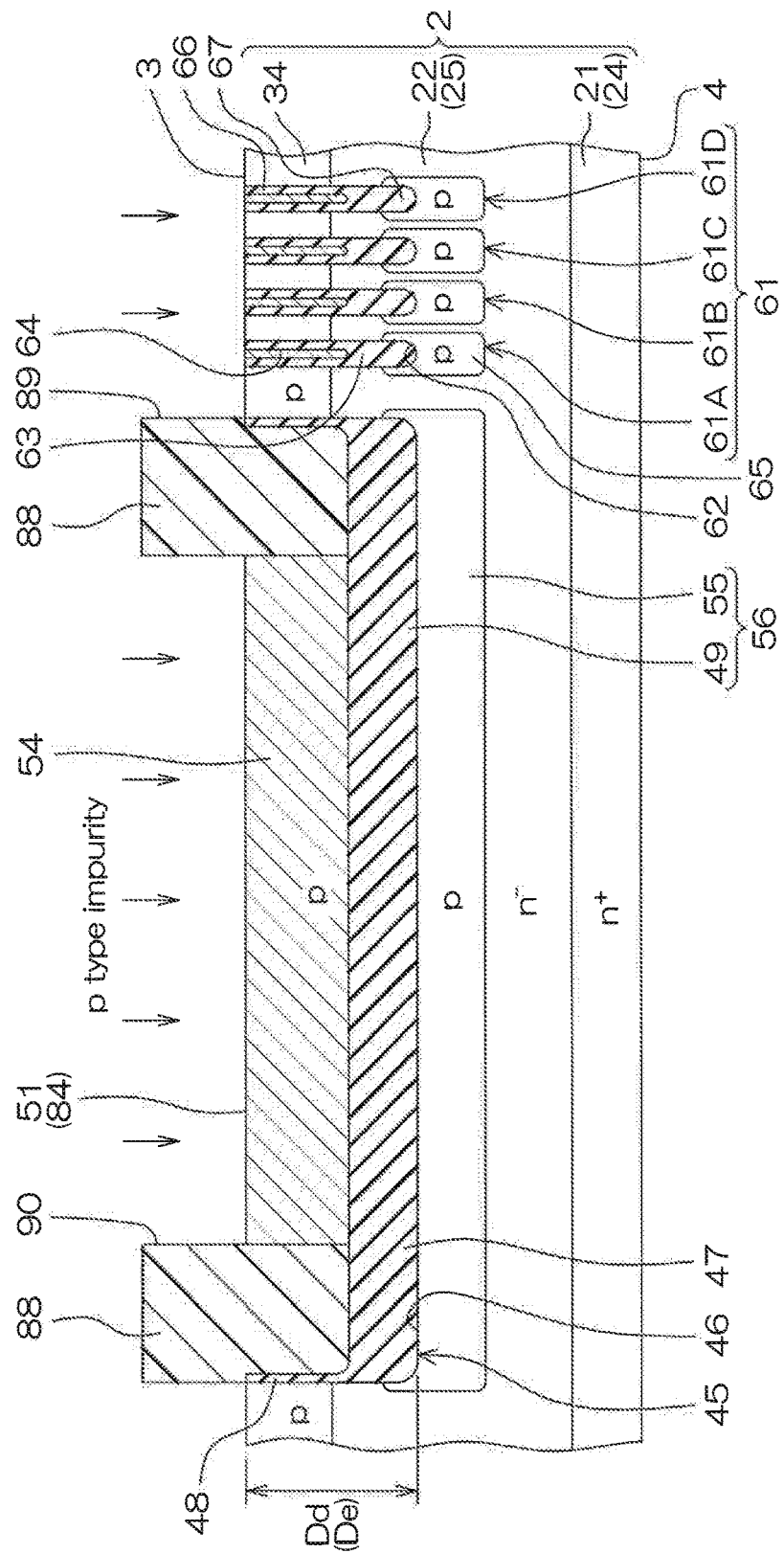

Next, with reference to FIG. 8I, a photomask 88 is formed on the first main surface 3 of the semiconductor layer 2. The photomask 88 may be of a negative type or may be of a positive type. Here, a description shall be provided with a negative type photomask 88 as an example.

Next, an opening 89, exposing a region in which the p type body regions 34 are to be formed, and an opening 90, exposing a region in which the p type portions 53 of the polysilicon body 54 are to be formed, are selectively formed in the photomask 88 by exposure and development.

Next, the p type impurity is implanted via the photomask 88 into entireties of the polysilicon body 54 and a surface layer portion of the first main surface 3 of the semiconductor layer 2. The p type impurity implanted into the surface layer portion of the first main surface 3 of the semiconductor layer 2 becomes the p type body regions 34. The p type impurity implanted into the polysilicon body 54 becomes the p type portions 53 after a process to be described below. After implantation of the p type impurity, the photomask 88 is removed.

Here, a case where a comparatively large step is present in the photomask 88 between a portion covering the upper surface 51 of the polysilicon body 54 and a portion covering the first main surface 3 of the semiconductor layer 2 shall be considered.

In exposing such a photomask 88, different focus margins must be set respectively for the portion covering the upper surface 51 of the polysilicon body 54 and the portion covering the first main surface 3 of the semiconductor layer 2. It thus becomes quite unrealistic to perform exposure of the portion covering the upper surface 51 of the polysilicon body 54 and exposure of the portion covering the first main surface 3 of the semiconductor layer 2 in the same process.

The focus margin is a width of a depth region in which a photomask can be maintained in a practically usable state when a focal point of light with respect to the photomask deviates upwards or downwards from an optimal focal point position during exposure.

On the other hand, with the present preferred embodiment, the upper surface 51 of the polysilicon body 54 and the first main surface 3 of the semiconductor layer 2 are formed on substantially the same plane. Forming of a step in the photomask 88 between the portion covering the upper surface 51 of the polysilicon body 54 and the portion covering the first main surface 3 of the semiconductor layer 2 can thus be suppressed. Moreover, the upper surface 51 of the polysilicon body 54 is formed to be flat and therefore the forming of a step in the photomask 88 above the upper surface 51 of the polysilicon body 54 can also be suppressed.

An equal focus margin can thus be set respectively for the portion covering the upper surface 51 of the polysilicon body 54 and the portion covering the first main surface 3 of the semiconductor layer 2 when exposing the photomask 88.

A process of forming the p type body regions 34 and a process of forming the p type portions 53 of the polysilicon body 54 can thereby be performed as a process in common. Also, at the same time, the process of forming the p type portions 53 in the polysilicon body 54 formed inside the diode trench 46 can be simplified.

Figure 8J:
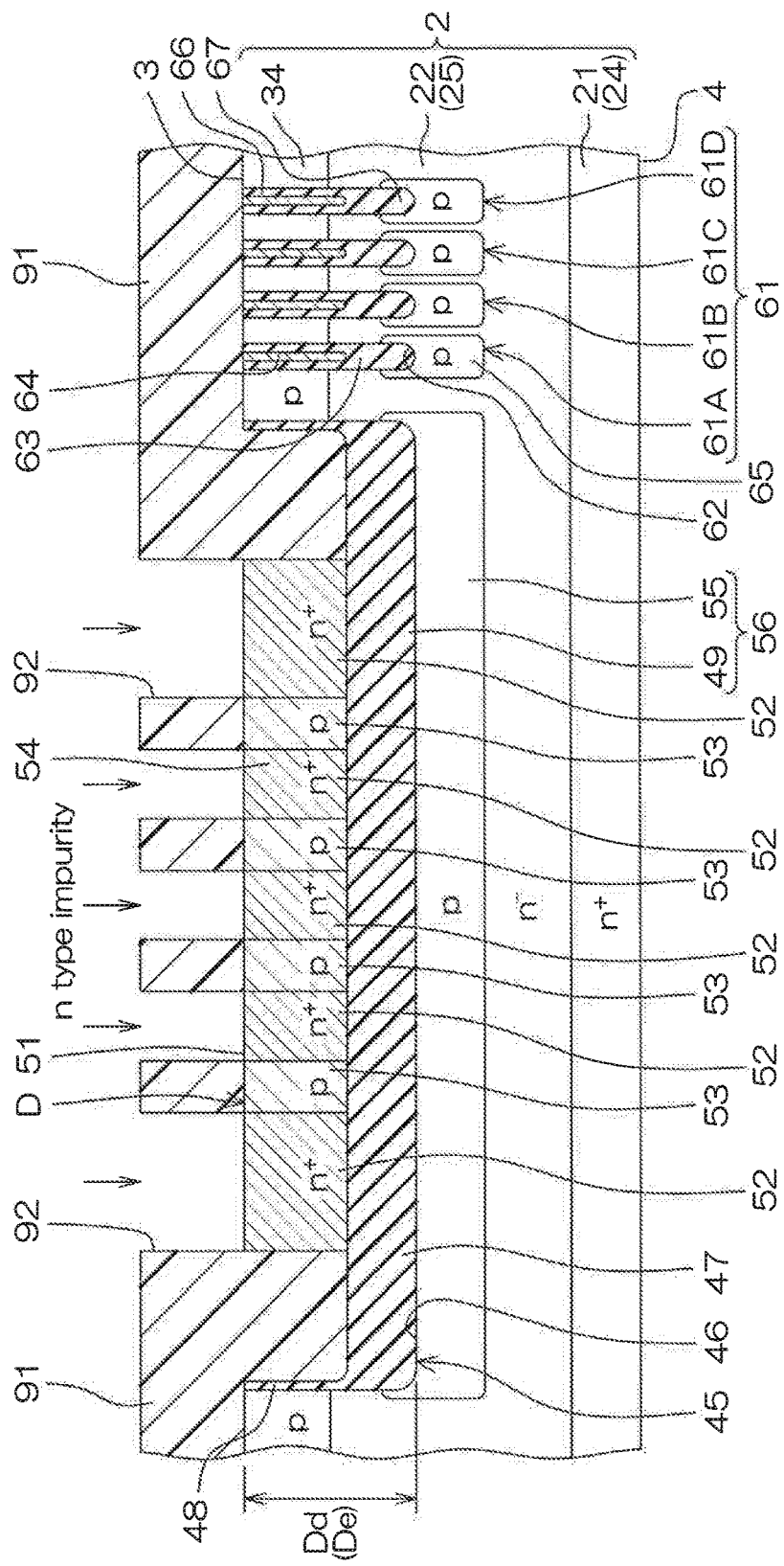

Next, with reference to FIG. 8J, another photomask 91 is formed on the first main surface 3 of the semiconductor layer 2. The photomask 91 may be of a negative type or may be of a positive type. Here, a description shall be provided with a negative type photomask 91 as an example.

Next, openings (not shown), exposing regions in which the $n^+$ type source regions 35 are to be formed, and openings 92, exposing regions in which the $n^+$ type portion 52 of the polysilicon body 54 are to be formed, are selectively formed in the photomask 91 by exposure and development.

Next, the n type impurity is implanted via the photomask 91 into the polysilicon body 54 and surface layer portions of the first main surface 3 of the semiconductor layer 2. The n type impurity implanted into the surface layer portions of the first main surface 3 of the semiconductor layer 2 becomes the $n^+$ type source regions 35. The n type impurity implanted into the polysilicon body 54 becomes the $n^+$ type portions 52.

By the present process, the bidirectional Zener diode D that includes the $n^+$ type portions 52 and the p type portions 53 and has the structure in which the $n^+$ type portions 52 and the p type portion 53 are repeated alternately is formed inside the diode trench 46. After implantation of the n type impurity, the photomask 91 is removed.

In the present process, forming of a step in the photomask 91 between a portion covering the upper surface 51 of the polysilicon body 54 and a portion covering the first main surface 3 of the semiconductor layer 2 can be suppressed. Moreover, the upper surface 51 of the polysilicon body 54 is formed to be flat and therefore the forming of a step in the photomask 91 above the upper surface 51 of the polysilicon body 54 can also be suppressed.

An equal focus margin can thus be set respectively for the portion covering the upper surface 51 of the polysilicon body 54 and the portion covering the first main surface 3 of the semiconductor layer 2 when exposing the photomask 91.

A process of forming the $n^+$ type source regions 35 and a process of forming the $n^+$ type portions 52 of the polysilicon body 54 can thereby be performed as a process in common. Also, at the same time, the process of forming the $n^+$ type portions 52 in the polysilicon body 54 formed inside the diode trench 46 can be simplified.

Next, with reference to FIG. 8K, the insulating layer 40 is formed, for example, by the CVD method. The insulating layer 40 is formed to fill a region between the side walls of the polysilicon body 54 and the side walls of the diode trench 46 and cover substantially the entirety of the first main surface 3 of the semiconductor layer 2. A portion of the insulating layer 40 that fills the region between the side walls of the polysilicon body 54 and the side walls of the diode trench 46 becomes the side wall protection film 57 that protects the side walls of the polysilicon body 54.

Figure 8L:
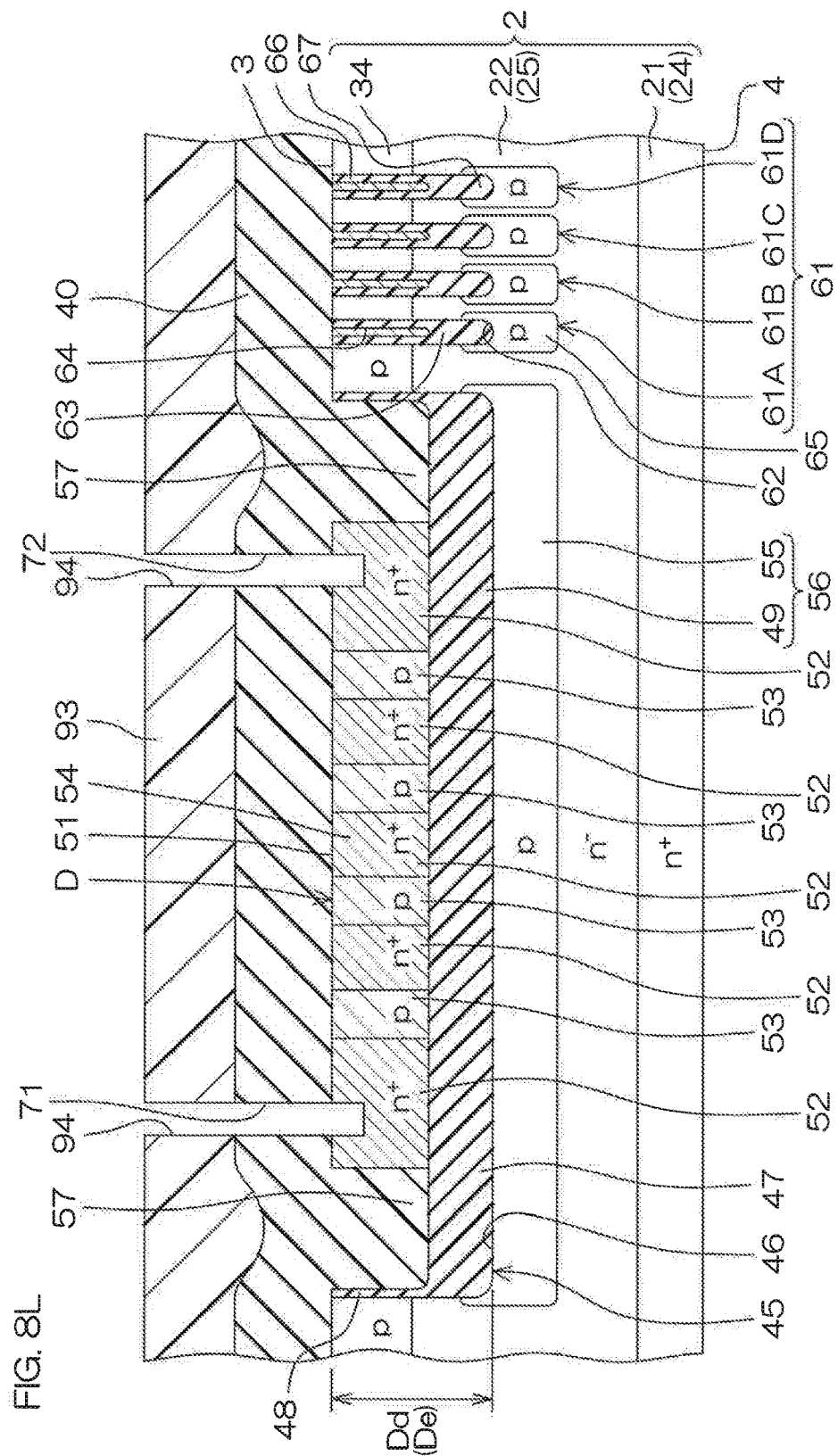

Next, with reference to FIG. 8L, a mask 93 is formed on the insulating layer 40. The mask 93 has openings 94 that selectively expose regions in which the first contact hole 71 and the second contact hole 72 are to be formed.

Next, unnecessary portions of the insulating layer 40 are removed by etching via the mask 98. The first contact hole 71, exposing one end portion of the polysilicon body 54, and the second contact hole 72, exposing another end portion of the polysilicon body 54, are thereby formed in the insulating layer 40. After the first contact hole 71 and the second contact hole 72 are formed, the mask 93 is removed.

Figure 8M:
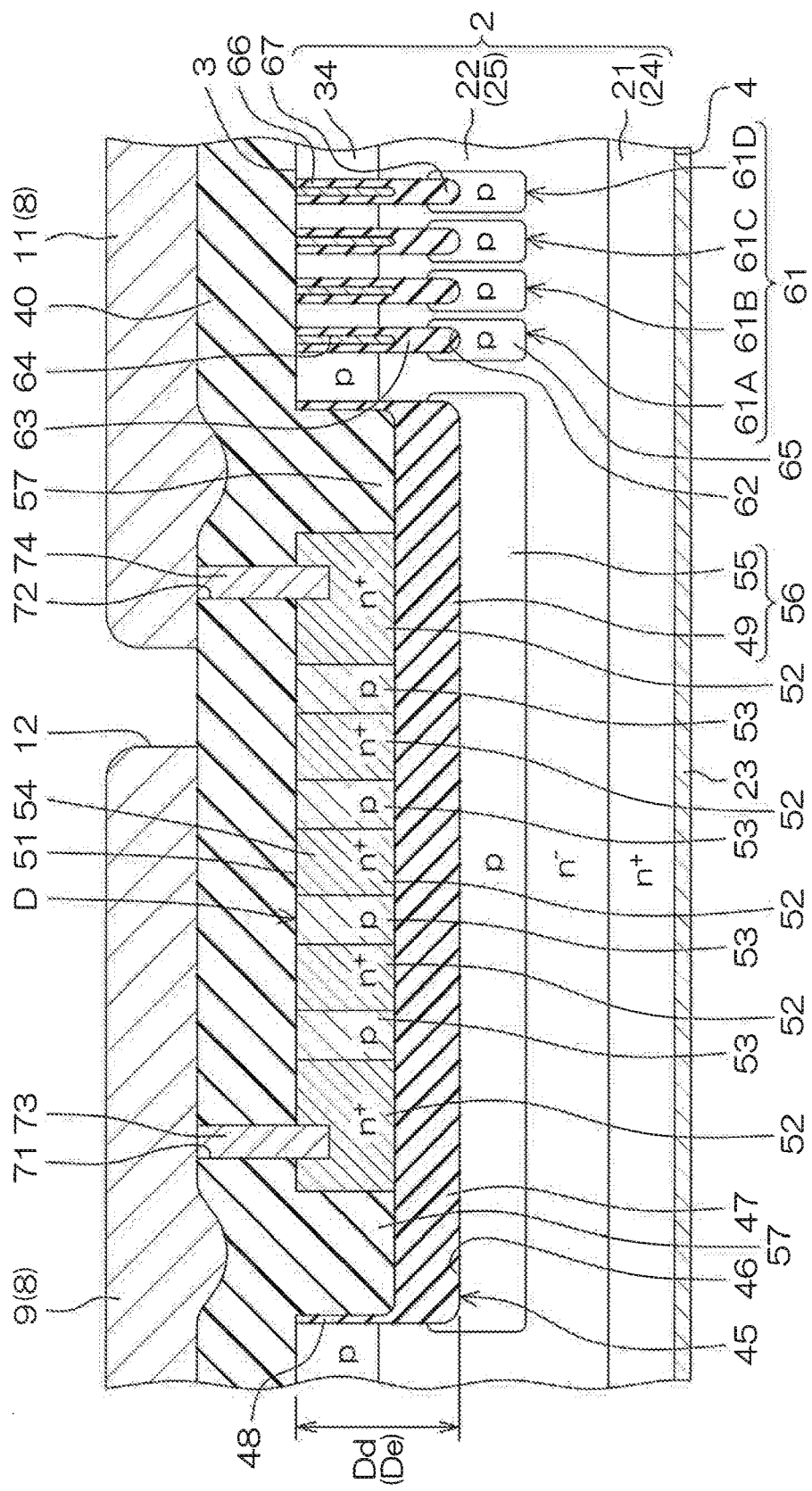

Next, with reference to FIG. 8M, tungsten is embedded in the first contact hole 71 and the second contact hole 72, for example, by the CVD method and etching back. The first contact plug 73 is thereby formed inside the first contact hole 71. Also, the second contact plug 74 is thereby formed inside the second contact hole 72.

Next, an electrode material (for example, aluminum) is deposited on the insulating layer 40, for example, by a sputtering method to form an electrode material layer. Next, unnecessary portions of the electrode material layer are removed, for example, by etching via a mask (not shown). The front surface electrode 8, which includes the gate pad 9, the gate finger 10, and the source pad 11, is thereby formed. Thereafter, the drain electrode 23 is formed on the second main surface 4 of the semiconductor layer 2, for example, by the sputtering method. The semiconductor device 1 is obtained through the above processes.

Next, operations of the bidirectional Zener diode D shall be described. Here, two bidirectional Zener diodes D that were adjusted in a width Wp of each p type portion 53 were prepared and the respective operations were examined.

Figure 9:
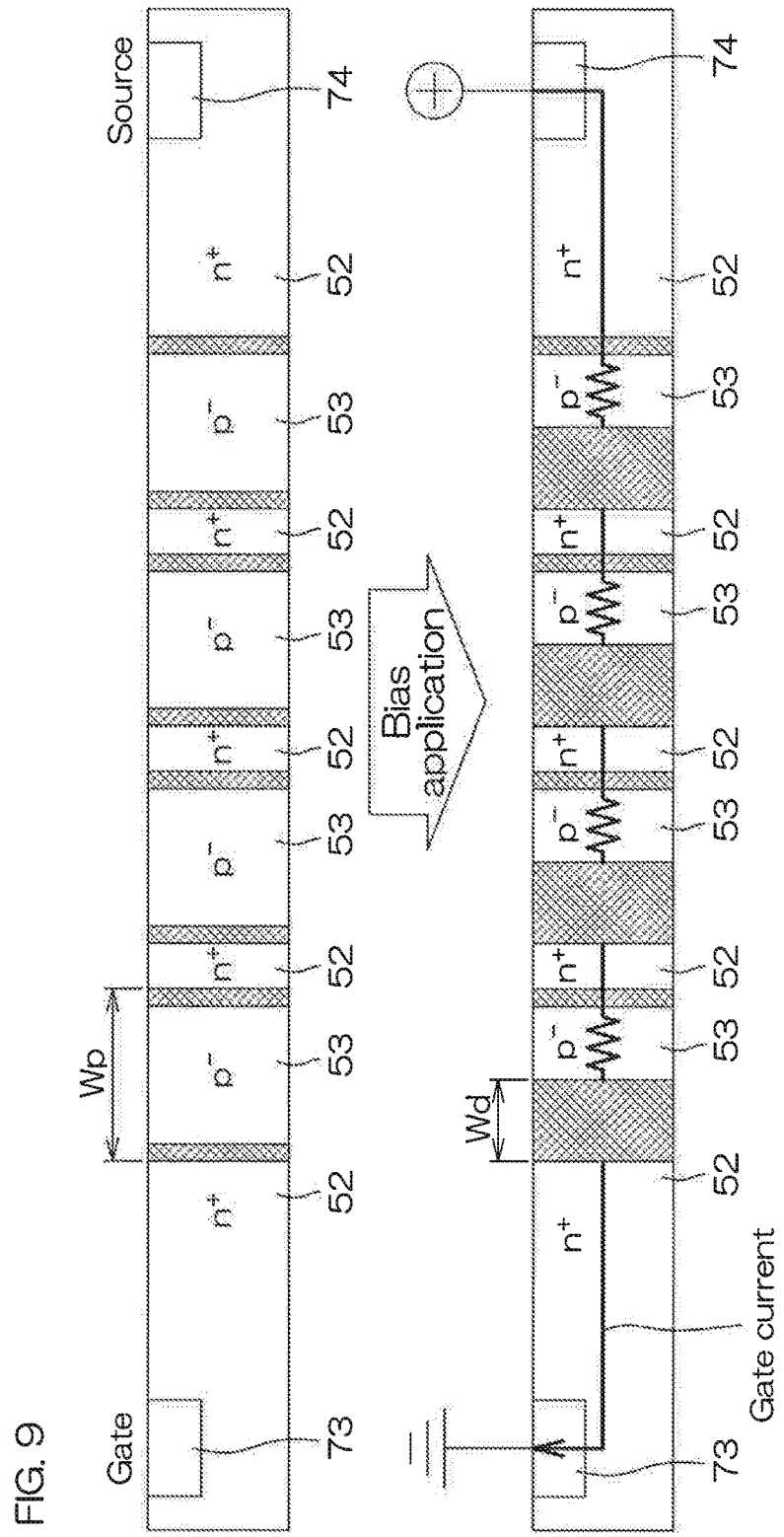
FIG. 9 is a diagram for describing an operation of a bidirectional Zener diode.
Figure 10:
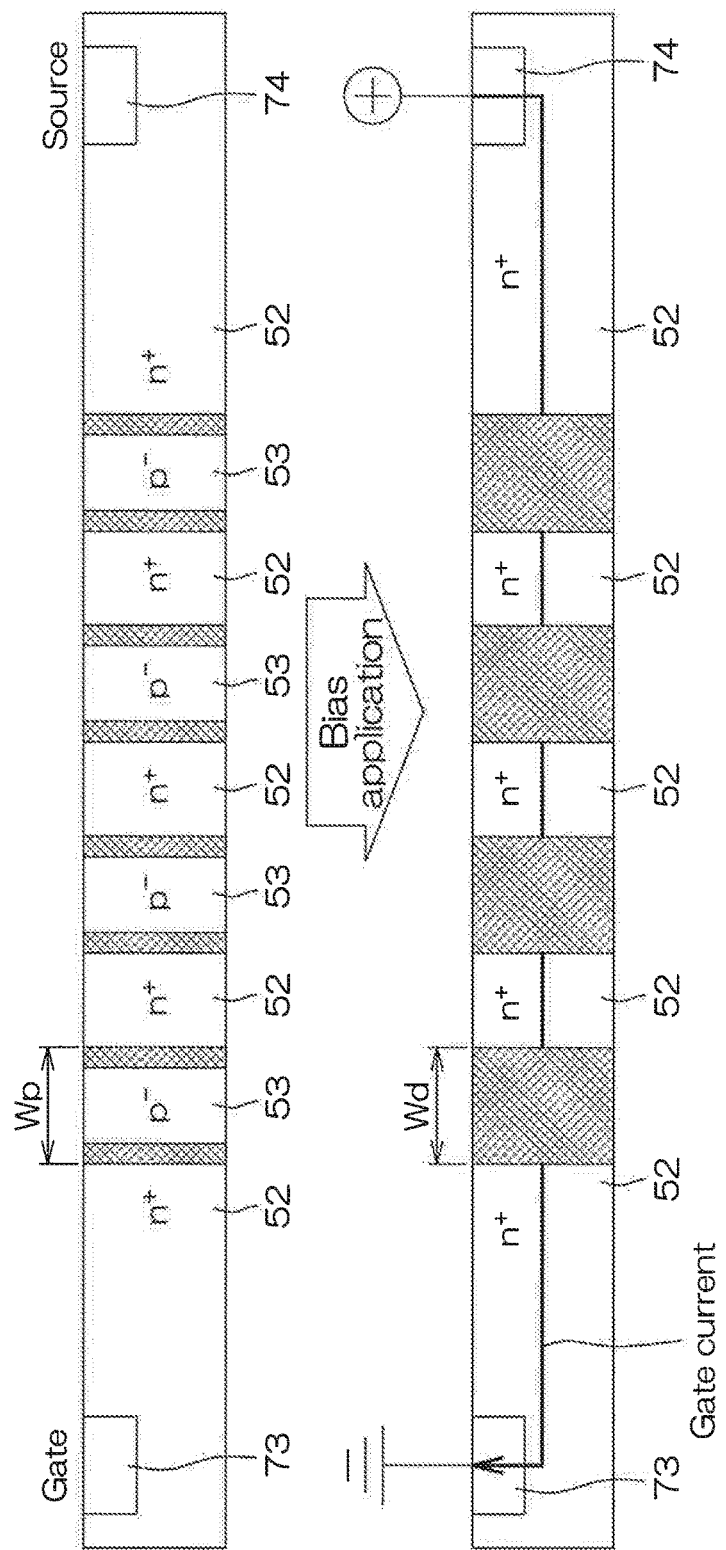
FIG. 10 is a diagram for describing an operation of a bidirectional Zener diode.

FIG. 9 and FIG. 10 are respectively diagrams for describing operations of the bidirectional Zener diodes D. FIG. 9 and FIG. 10 respectively illustrate the operations when the corresponding bidirectional Zener diodes D are made to undergo breakdown due to avalanche breakdown.

With the bidirectional Zener diode D of FIG. 9, the width Wp of each p type portion 53 is set to a value greater than a width Wd of a depletion layer spreading from each pn junction portion formed between an $n^+$ type portion 52 and a p type portion 53 (width Wp>width Wd). The width Wd of the depletion layer is the width of the depletion layer that spreads from each pn junction portion when a breakdown voltage is applied across the gate pad 9 and the source pad 11.

Referring to FIG. 9, when the breakdown voltage is applied across the gate pad 9 and the source pad 11, the bidirectional Zener diode D is made conductive due to avalanche breakdown. A gate current, which contains a noise component, thus flows across the gate pad 9 and the source pad 11 via the bidirectional Zener diode D.

The width Wp of the p type portion 53 is set to the value greater than the width Wd of the depletion layer (width Wp>width Wd). Therefore, in the breakdown state, each p type portion 53 is not filled up by the depletion layer and a portion of the p type portion 53 remains at a fixed width.

The remaining portion of the p type portion 53 becomes a serial resistor and therefore becomes an obstruction to releasing the gate current to a ground potential (gate pad 9). Consequently, a problem, such as breakdown of the gate insulating film, etc., occurs.

On the other hand, with the bidirectional Zener diode D shown in FIG. 10, the width Wp of each p type portion 53 is set to a value not greater than the width Wd of the depletion layer spreading from each pn junction portion formed between an $n^+$ type portion 52 and a p type portion 53 (width Wp≤width Wd).

Therefore, when the breakdown voltage is applied across the gate pad 9 and the source pad 11, the region of each p type portion 53 can become filled up by the depletion layer. The $n^+$ type portion 52 at the source side and the $n^+$ type portion 52 at the gate side can thereby be made conductive to each other by punch-through and the serial resistor formed by the p type portions 53 can be reduced.

In the present preferred embodiment, the inversion suppressing structure 56, including the second bottom wall insulating film 49 and the floating region, is formed directly under the bidirectional Zener diode D (see FIG. 5). The conductivity type of the p type portions 53 of the bidirectional Zener diode D is suppressed from inverting to the n type by the inversion suppressing structure 56. Forming of an undesired current path between the gate pad 9 and the source pad 11 can thus be suppressed. Stability of on/off operations by the bidirectional Zener diode D can thus be improved.

The gate current can thereby be released satisfactorily to the ground potential (gate pad 9). A problem, such as breakdown of the gate insulating film, etc., can thus be suppressed and electrostatic breakdown resistance and avalanche resistance can be improved. The avalanche resistance refers to resistance that keeps the bidirectional Zener diode D from breaking down in an avalanche breakdown state.

As described above, with the semiconductor device 1 according to the present preferred embodiment, the second bottom wall insulating film 49 is interposed between the bottom wall of the diode trench 46 and the bidirectional Zener diode D. The thickness t4 of the second bottom wall insulating film 49 is greater than the thickness t5 of the second side wall insulating film 48.

In addition, the p type floating region 55, which faces the bidirectional Zener diode D across the second bottom wall insulating film 49, is formed in the semiconductor layer 2. The inversion suppressing structure 56 that suppresses the inversion of the conductivity type of the p type portions 53 of the bidirectional Zener diode D to the n type is formed by the second bottom wall insulating film 49 and the floating region.

The inversion of the conductivity type of the p type portions 53 to the n type can thereby be suppressed even when a voltage drop occurs across a pair of the $n^+$ type portions 52. Increase of an undesired current, such as a leakage current, etc., can thus be suppressed in the bidirectional Zener diode D. The stability of on/off operations by the bidirectional Zener diode D can thus be improved and therefore the stability of on/off operations can be made to contribute to improvement of electrostatic breakdown resistance and improvement of avalanche resistance.

Also with the semiconductor device 1 according to the present preferred embodiment, the bidirectional Zener diode D has the upper surface 51 facing the opening of the diode trench 46 and the upper surface 51 of the bidirectional Zener diode D is formed on the same plane as the first main surface 3 of the semiconductor layer 2.

By the above, in the photomask 88 used in the process of forming the p type body regions 34 and the p type portions 53, a step is suppressed from forming between the portion covering the upper surface 51 of the polysilicon body 54 and the portion covering the first main surface 3 of the semiconductor layer 2 (see FIG. 8I).

Moreover, the upper surface 51 of the polysilicon body 54 is formed to be flat above the bottom wall of the diode trench 46. The forming of a step in the photomask 88 above the upper surface 51 of the polysilicon body 54 can also be suppressed thereby.

An equal focus margin can thus be set respectively for the portion covering the upper surface 51 of the polysilicon body 54 and the portion covering the first main surface 3 of the semiconductor layer 2 when exposing the photomask 88. The process of forming the p type body regions 34 and the process of forming the p type portions 53 of the polysilicon body 54 can thereby be performed as a process in common. Also, at the same time, the process of forming the p type portions 53 in the polysilicon body 54 formed inside the diode trench 46 can be simplified.

Also, in the photomask 91 used in the process of forming the n$^+$ type source regions 35 and the n$^+$ type portions 52, a step is suppressed from forming between the portion covering the upper surface 51 of the polysilicon body 54 and the portion covering the first main surface 3 of the semiconductor layer 2 (see FIG. 8J).

Moreover, the upper surface 51 of the polysilicon body 54 is formed to be flat above the bottom wall of the diode trench 46. The forming of a step in the photomask 91 above the upper surface 51 of the polysilicon body 54 can also be suppressed thereby.

An equal focus margin can thus be set respectively for the portion covering the upper surface 51 of the polysilicon body 54 and the portion covering the first main surface 3 of the semiconductor layer 2 when exposing the photomask 91. The process of forming the n$^+$ type source regions 35 and the process of forming the n$^+$ type portions 52 of the polysilicon body 54 can thereby be performed as a process in common. Also, at the same time, the process of forming the n$^+$ type portions 52 in the polysilicon body 54 formed inside the diode trench 46 can be simplified.

Also with the semiconductor device 1 according to the present preferred embodiment, the bidirectional Zener diode D is formed inside the diode trench 46 across an interval from the side walls of the diode trench 46. The distance between the side walls of the bidirectional Zener diode D and the side walls of the diode trench 46 is greater than the thickness of the bidirectional Zener diode D.

With the present arrangement, the step portion 87, present between the portion of the polysilicon layer 84 formed on the first main surface 3 of the semiconductor layer 2 and the portion of the polysilicon layer 84 formed inside the diode trench 46 in the processes of FIG. 8G to FIG. 8H described above, can be removed. The step portion 87 can thereby be suppressed from remaining as a portion of the polysilicon body 54 and the bidirectional Zener diode D, having the flat upper surface 51, can thus be formed.

Also, the semiconductor device 1 according to the present preferred embodiment includes the side wall protection film 57 with the insulating property that is formed in the region between the side walls of the diode trench 46 and the side walls of the bidirectional Zener diode D and protects the side walls of the bidirectional Zener diode D. The side wall protection film 57 fills the region between the side walls of the diode trench 46 and the side walls of the bidirectional Zener diode D.

With the present arrangement, the bidirectional Zener diode D is protected from the side wall sides by the side wall protection film 57. Also, by the side wall protection film 57, the insulating property between the bidirectional Zener diode D and the semiconductor layer 2 can be improved in regard to the lateral direction parallel to the first main surface 3 of the semiconductor layer 2. Electric field influences that the bidirectional Zener diode D applies to the semiconductor layer 2 can thus be reduced.

The semiconductor device 1 according to the present preferred embodiment also includes the electric field relaxation structures 61, which, in the peripheral region along the peripheral edge of the diode trench 46, are formed in the surface layer portion of the main surface of the semiconductor layer 2 and relax the electric field in the peripheral region.

With the present arrangement, concentration of electric field in the peripheral region along the peripheral edge of the diode trench 46 can be suppressed by the electric field relaxation structures 61. Lowering of the electrostatic breakdown resistance and lowering of the avalanche resistance due to concentration of electric field can thus be suppressed.

Also, with the semiconductor device 1 according to the present preferred embodiment, the trench gate structures 27, the trench diode structure 45, and the electric field relaxation structures 61 have substantially the same arrangement. The trench gate structures 27, the trench diode structure 45, and the electric field relaxation structures 61 can thus be formed inside the semiconductor layer 2 by processes in common. Simplification of the manufacturing process and reduction of workload can thus be achieved.

Second Preferred Embodiment

Figure 11:
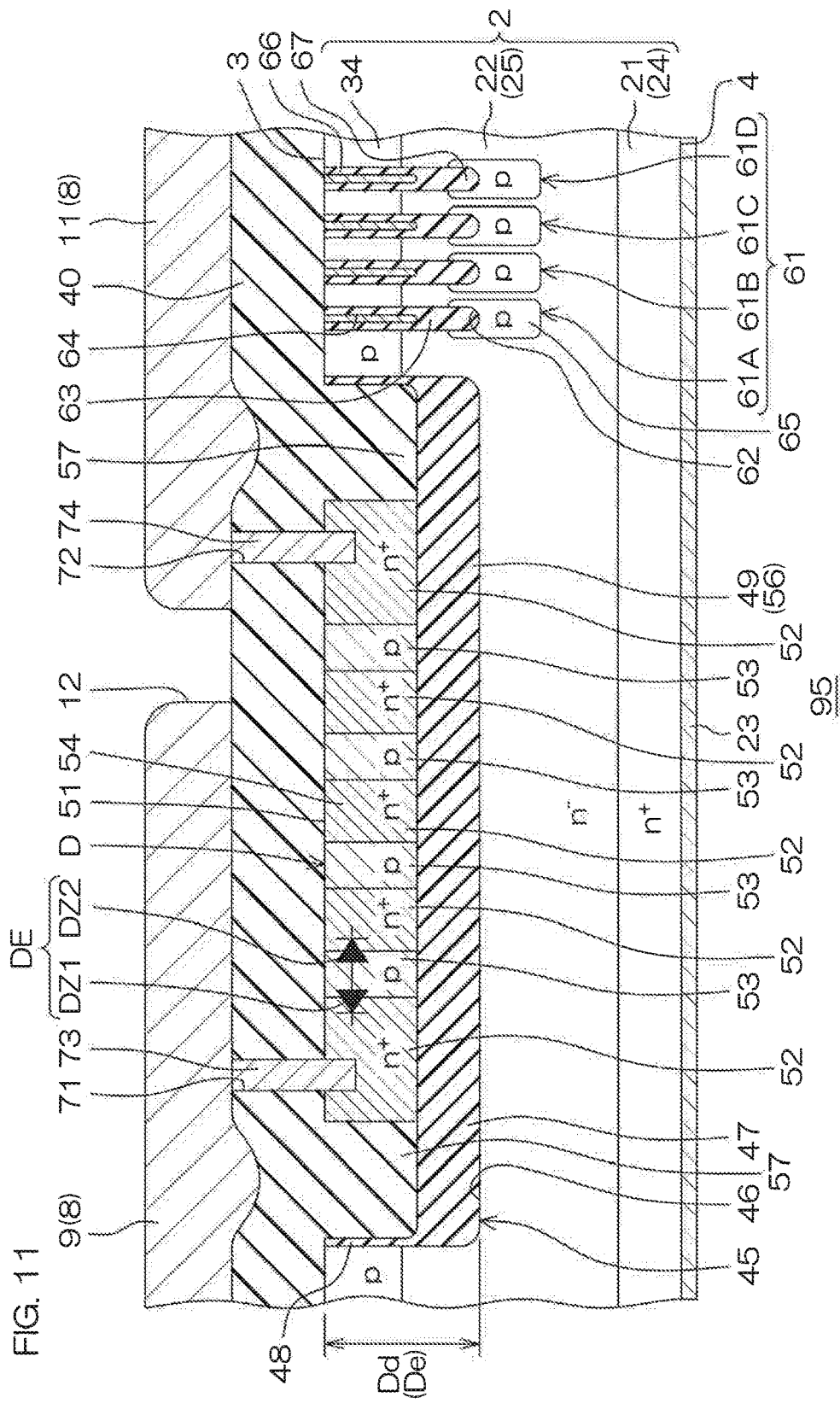
FIG. 11 is a sectional view of a portion corresponding to FIG. 5 and shows a semiconductor device according to a second preferred embodiment of the present invention.

FIG. 11 is a sectional view of a portion corresponding to FIG. 5 and shows a semiconductor device 95 according to a second preferred embodiment of the present invention. In FIG. 11, arrangements that are the same as the arrangements described above with the first preferred embodiment are provided with the same reference symbols and description thereof shall be omitted.

With the exception of the point of not including the p type floating region 55 along the bottom wall of the diode trench 45, the semiconductor device 95 according to the present preferred embodiment has the same arrangement as that of the semiconductor device 1 according to the first preferred embodiment described above.

With the semiconductor device 95 according to the present preferred embodiment, the inversion suppressing structure 56, which suppresses the inversion of the conductivity type of the p type portions 53 of the bidirectional Zener diode D to the n type, is formed by the second bottom wall insulating film 49 that is interposed between the bottom wall of the diode trench 46 and the bidirectional Zener diode D.

The same actions and effects as the actions and effects described above for the first preferred embodiment can be exhibited by such an arrangement as well.

Third Preferred Embodiment

Figure 12:
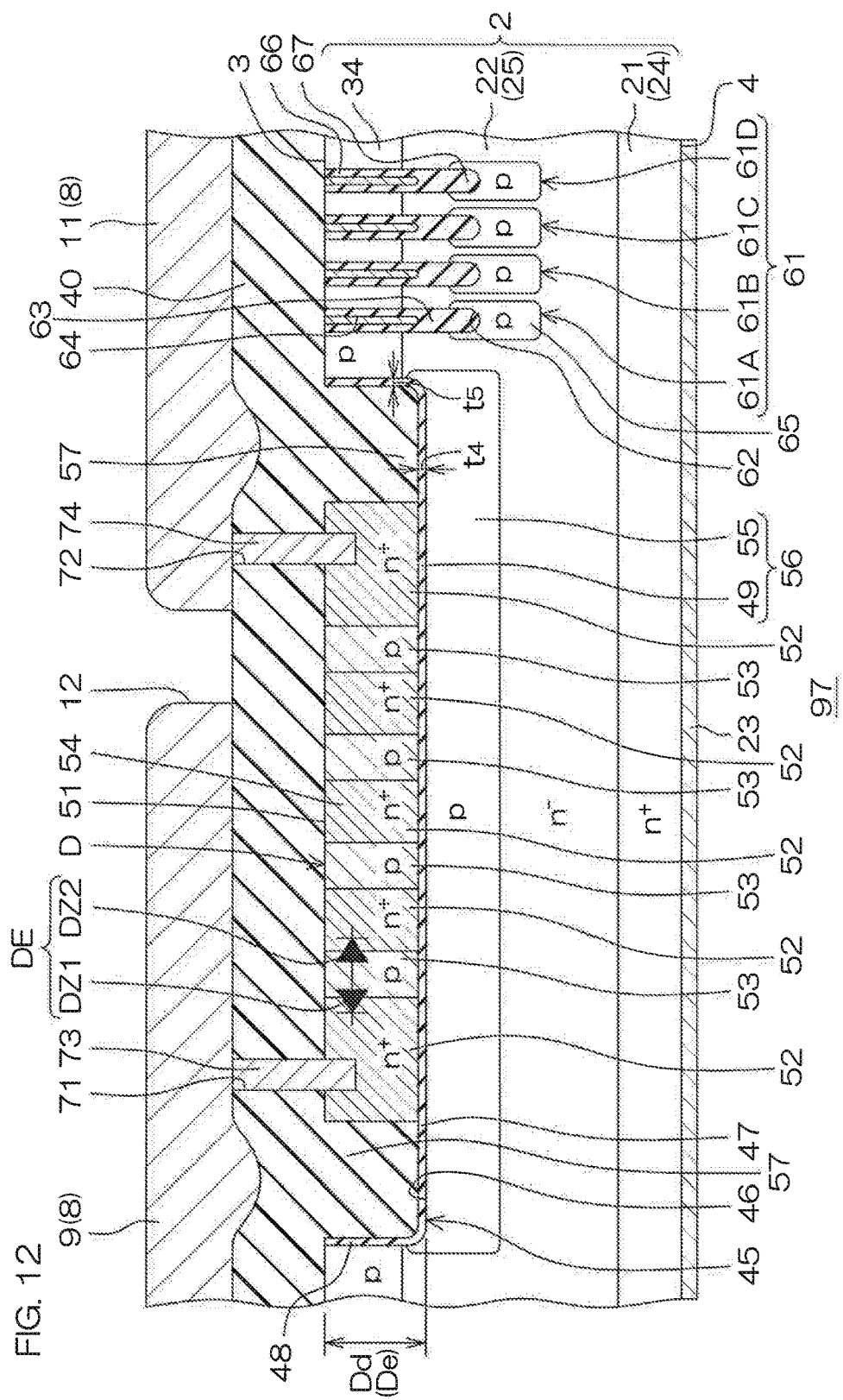
FIG. 12 is a sectional view of a portion corresponding to FIG. 5 and shows a semiconductor device according to a third preferred embodiment of the present invention.

FIG. 12 is a sectional view of a portion corresponding to FIG. 5 and shows a semiconductor device 97 according to a third preferred embodiment of the present invention. In FIG. 12, arrangements that are the same as the arrangements described above with the first preferred embodiment are provided with the same reference symbols and description thereof shall be omitted.

With the exception of the point of that the thickness t4 of the second bottom wall insulating film 49 is formed to be substantially equal to the thickness t5 of the second side wall insulating film 48, the semiconductor device 97 according to the present preferred embodiment has the same arrangement as that of the semiconductor device 1 according to the first preferred embodiment described above.

With the semiconductor device 97 according to the present preferred embodiment, the inversion suppressing structure 56, which suppresses the inversion of the conductivity type of the p type portions 53 of the bidirectional Zener diode D to the n type, is formed by the thin second bottom wall insulating film 49, which is interposed between the bottom wall of the diode trench 46 and the bidirectional Zener diode D, and the p type floating region 55.

The same actions and effects as the actions and effects described above for the first preferred embodiment can be exhibited by such an arrangement as well.

Although preferred embodiments of the present invention have been described above, the present invention may also be implemented in yet other modes.

With the first preferred embodiment described above, an example where the n+ type portions 52 and the p type portions are formed in stripes in the bidirectional Zener diode D was described. However, the bidirectional Zener diode D may instead have a structure such as shown in FIG. 13.

Figure 13:
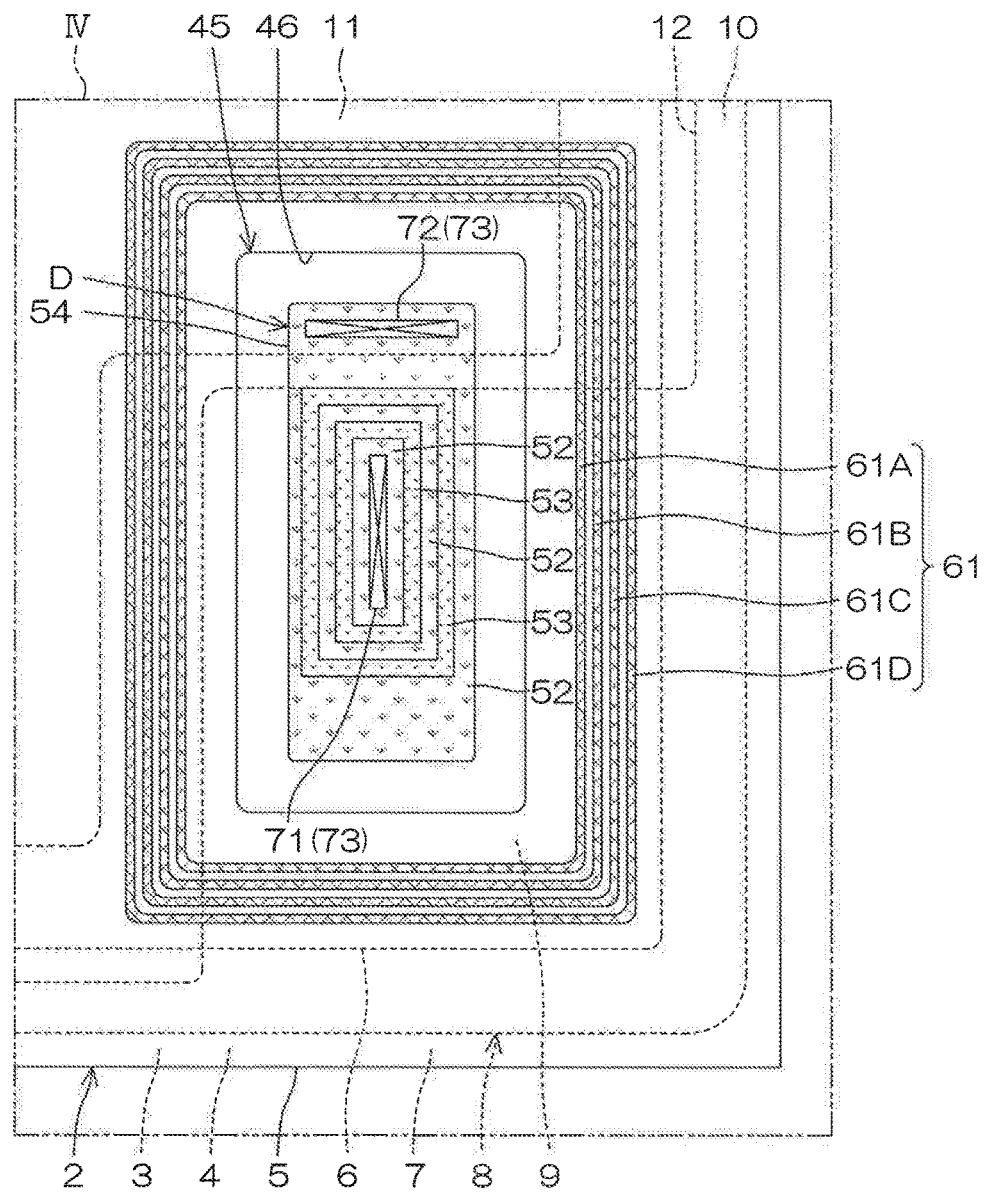
FIG. 13 is a sectional view of a portion corresponding to FIG. 4 and shows a modification example of a bidirectional Zener diode.

FIG. 13 is a sectional view of a portion corresponding to FIG. 4 and shows a modification example of the bidirectional Zener diode D. In FIG. 13, arrangements that are the same as the arrangements described above with the first preferred embodiment are provided with the same reference symbols and description thereof shall be omitted.

With the bidirectional Zener diode D according to the present modification example, an n+ type portion 52 at one end portion is disposed at a center of an inner region of the gate pad 9. The remaining p type portions 53 and n+ type portions 52 are disposed concentrically so as to surround the central n+ type portion 52. The first contact plug 73 is connected to the n+ type portion 52 at the one end portion that is positioned at the center. Also, the second contact plug 74 is connected to an n+ type portion 52 at another end portion that is positioned at an outermost periphery.

Even with such a structure, the bidirectional Zener diode D, having the structure where the n+ type portions 52 and the p type portions 53 are repeated alternately from the n+ type portion 52 at one end portion to the n+ type portion 52 at the other end portion, can be obtained. Obviously, the bidirectional Zener diode D of such structure may also be applied to the second preferred embodiment and the third preferred embodiment.

With the first preferred embodiment described above, an example where the front surface electrode 8 includes the gate pad 9, which is formed along the corner portion of the semiconductor layer 2 was described. However, a front surface electrode 8 having a structure shown in FIG. 14 may be adopted instead.

Figure 14:
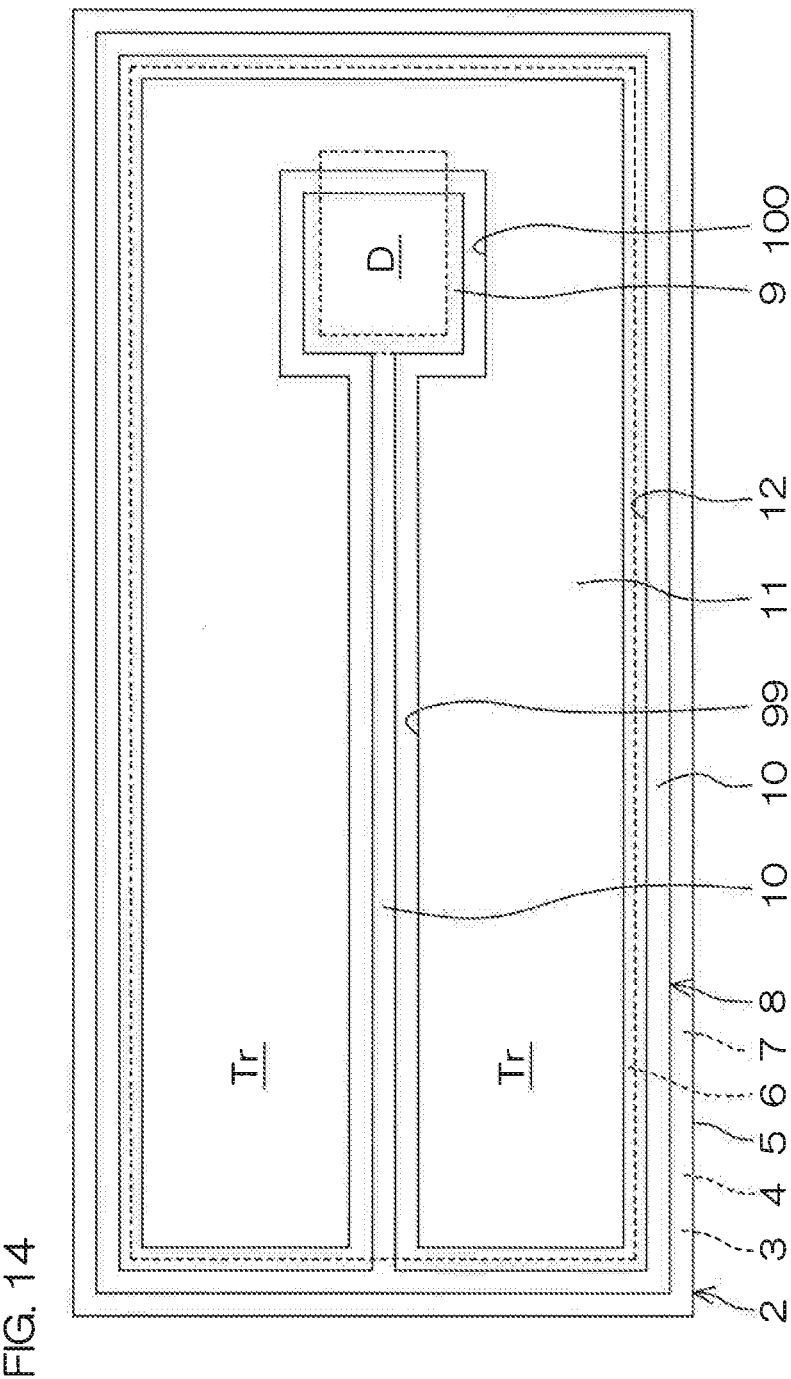
FIG. 14 is a plan view of a modification example of a front surface electrode.

FIG. 14 is a plan view of a modification example of the front surface electrode. In FIG. 14, arrangements that are the same as the arrangements described above with the first preferred embodiment are provided with the same reference symbols and description thereof shall be omitted. An example where the semiconductor layer 2 is formed to a chip shape of oblong shape in plan view is shown in FIG. 14.

With the front surface electrode 8 according to the present modification example, the source pad 11 is formed to an oblong shape in plan view that extends along a length direction of the semiconductor substrate 21. The source pad 11 has formed therein a removed region 99, which extends from one end portion toward another end portion of a length direction of the source pad 11 and with which one end portion is an open end and another end portion is a closed end. The closed end of the removed region 99 is arranged as a pad region 100 that is wider than another section of the removed region 99.

The gate pad 9 is disposed in the pad region 100 of the removed region 99. With the exclusion of a portion of connection with the gate finger 10, the gate pad 9 is surrounded by the source pad 11. The gate finger 10 extends from the gate pad 9 toward the open end of the removed region 99 of the source pad 11. Further, the gate finger 10 is routed to the outer region 7 (outer periphery of the source pad 11) from the open end of the removed region 99. The gate finger 10 may surround the entire periphery of the source pad 11.

Even with such a structure, the trench diode structure 45, extending across the gate pad 9 and the source pad 11, may be formed in a region directly under the gate pad 9. Obviously, the front surface electrode 8 of such structure may also be applied to the second preferred embodiment and the third preferred embodiment.

With each of the preferred embodiments described above, an example where the trench gate structures 27, the trench diode structure 45, and the electric field relaxation structures 61 have substantially the same arrangement was described. However, the trench gate structures 27, the trench diode structure 45, and the electric field relaxation structures 61 may instead have respectively different structures.

For example, the gate trenches 28, the diode trench 46, and the electric field relaxation trenches 62 may be formed at respectively different depths by forming the gate trenches 28, the diode trench 46, and the electric field relaxation trenches 62 in separate processes, respectively.

Also, the first inner wall insulating film 29, the second inner wall insulating film 47, and the third inner wall insulating film 63 may be formed to respectively different thicknesses by forming the first inner wall insulating film 29, the second inner wall insulating film 47, and the third inner wall insulating film 63 in separate processes, respectively.

Also, at least one of the first inner wall insulating film 29, the second inner wall insulating film 47, and the third inner wall insulating film 63 may be formed to be of uniform thickness.

Also, the first inner wall insulating film 29 and the third inner wall insulating film 63 may be formed to be of uniform thickness while the second inner wall insulating film 47 integrally includes the second side wall insulating film 48, the second bottom wall insulating film 49, and the second connection insulating film 50.

Also, the first inner wall insulating film 29 may be formed to be of uniform thickness while the third inner wall insulating film 63 integrally includes the third side wall insulating film 66, the third bottom wall insulating film 67, and the third connection insulating film 68.

Also with each of the preferred embodiments described above, a structure in which the conductivity types of the respective semiconductor portions are inverted may be adopted. That is, a p type portion may be of an n type and an n type portion may be of a p type.

Besides the above, various design modifications may be made within the scope of the matters described in the claims. Examples of features extracted from the present specification and drawings are indicated below.

Clause 1: A semiconductor device including a semiconductor layer of a first conductivity type, having a main surface, a diode trench, formed in the main surface of the semiconductor layer, a bidirectional Zener diode, formed inside the diode trench and having a pair of first conductivity type portions and at least one second conductivity type portion formed between the pair of first conductivity type portions, and a bottom wall insulating film, which is interposed between the bidirectional Zener diode and a bottom wall of the diode trench and with which a ratio of thickness with respect to depth of the diode trench is set to not less than 0.08 and not more than 0.35.

With the semiconductor device according to Clause 1, the bottom wall insulating film is interposed between the bottom wall of the diode trench and the bidirectional Zener diode. The ratio of the thickness of the bottom wall insulating film with respect to the depth of the diode trench is set to not less than 0.08 and not more than 0.35. An inversion suppressing structure, which suppresses inversion of the conductivity type of the second conductivity type portion of the bidirectional Zener diode to the first conductivity type, is formed by the bottom wall insulating film.

The inversion of the conductivity type of the second conductivity type portion to the first conductivity type can thereby be suppressed even when a voltage drop occurs across the pair of first conductivity type portions. A semiconductor device with which undesired increase of current can be suppressed can thus be provided.

Clause 2: The semiconductor device according to Clause 1, where an inversion suppressing structure, which suppresses inversion of the conductivity type of the second conductivity type portion of the bidirectional Zener diode to the first conductivity type, is formed by the bottom wall insulating film.

Clause 3: The semiconductor device according to Clause 1 or 2, where the depth of the diode trench is not less than 9000 Å and not more than 12000 Å, and the thickness of the bottom wall insulating film is not less than 1000 Å and not more than 3000 Å.

Clause 4: The semiconductor device according to any one of Clauses 1 to 3, further including a side wall insulating film, formed along side walls of the diode trench and having a thickness less than the thickness of the bottom wall insulating film.

Clause 5: The semiconductor device according to Clause 4, where a ratio of the thickness of the side wall insulating film with respect to the thickness of the bottom wall insulating film is not less than 0.16 and not more than 0.6.

Reference Invention

There has been an increasing demand for transistors that meet requirements of low on-resistance and low capacitance (high speed switching) in recent years, for example, in the onboard devices market, industrial machinery market, etc. For example, measures are being taken to make an area of an active region of a transistor small to reduce an effective area of each gate electrode and reduce an input capacitance Ciss (=Cgd+Cgs). However, such lowering of capacitance of a transistor brings about a conflicting effect of lowering of electrostatic breakdown resistance of the transistor.

A countermeasure that is generally taken against electrostatic breakdown is to incorporate a bidirectional Zener diode in a transistor as in Patent Document 1.

However, with an arrangement where the bidirectional Zener diode is made to undergo avalanche breakdown to release a noise current as in Patent Document 1, for example, a portion of a p⁻ type region remains at a fixed width without becoming depleted even after breakdown. The remaining portion of the p type region becomes a serial resistor in the flow of the noise current through the bidirectional Zener diode. The noise current is thus not absorbed sufficiently and readily leads to breakdown of a gate insulating film.

Although on the other hand, a countermeasure of thickening the gate insulating film to improve a breakdown resistance of the gate insulating film itself may be considered, it is difficult to adjust a thickness of the gate insulating film precisely in accordance with a design value of the breakdown resistance of the film. It is also not preferable to change the thickness of the gate insulating film needlessly because the thickness of the gate insulating film is also closely related to the switching performance of the transistor.

An object of a reference invention is to provide a semiconductor device, which, although being of low on-resistance and low capacitance, is capable of realizing a high electrostatic breakdown resistance.

A semiconductor device according to a preferred embodiment of the reference example includes a semiconductor layer, having a source region of a first conductivity type, a body region of a second conductivity type, and a drain region of the first conductivity type, a gate electrode, facing the body region via a gate insulating film, a source electrode, connected to the source region, and a bidirectional Zener diode, which has a pair of first conductivity type portions at respective end portions and at least one second conductivity type portion between the pair of first conductivity type portions and with which the pair of first conductivity type portions are respectively connected to the source electrode and the gate electrode, and the second conductivity type portion of the bidirectional Zener diode has a width smaller than a width of a depletion layer that spreads from a pn junction portion of the first conductivity type portion and the second conductivity type portion when a predetermined voltage is applied across the source electrode and the gate electrode.

With the present arrangement, the width of the depletion layer that forms when the predetermined voltage is applied across the gate and the source>the width of the second conductivity type portion of the bidirectional Zener diode. Therefore, the first conductivity type portion at one end portion of the bidirectional Zener diode can be made conductive with the first conductivity type portion at the other end portion of the bidirectional Zener diode by punch-through when, for example, a voltage due to electrostatic discharge is applied across the gate and the source. A serial resistance when current flows after breakdown can thereby be reduced in comparison to a structure with which the bidirectional Zener diode is made conductive by being made to undergo avalanche breakdown. Consequently, even when noise current enters inside the semiconductor device due to electrostatic discharge, the noise current can be released satisfactorily via the bidirectional Zener diode. A high electrostatic breakdown resistance can thereby be realized and lower on-resistance and lower capacitance can thus be realized, for example, by making the respective portions of the semiconductor device finer.

Also, the gate insulating film does not to have to be made thick to improve the breakdown resistance and the thickness of the gate insulating film may be designed with a focus on switching performance of a transistor. Influences on the switching performance of the transistor can thus also be kept small.

With the semiconductor device according to the preferred embodiment of the reference invention, the "predetermined voltage" may, for example, include a voltage not less than a "rated gate-source voltage Vgss" that is guaranteed for semiconductors in commercial distribution.

The semiconductor device according to the preferred embodiment of the reference invention may further include a gate trench, formed in the semiconductor layer, and an embedded insulating film, embedded in a bottom portion of the gate trench. In this case, the source region, the body region, and the drain region may be aligned in a depth direction of the gate trench along side surfaces of the gate insulating film and the gate insulating film may be formed, in continuation to the embedded insulating film, on side surfaces of the gate trench. The semiconductor device may also include a thin film portion that is disposed at a boundary portion between the gate insulating film and the embedded insulating film and is thinner than the gate insulating film.

As mentioned above, the semiconductor device according to the preferred embodiment of the reference invention can realize a high electrostatic breakdown resistance and can therefore be applied satisfactorily to a semiconductor device, having the structure with the thin film portion disposed inside the gate trench, as well.

With the semiconductor device according to the preferred embodiment of the reference invention, the bidirectional Zener diode may be constituted of a polysilicon layer and the first conductivity type portions and the second conductivity type portion may respectively include first conductivity type impurity regions and a second conductivity type impurity region that are selectively formed in the polysilicon layer.

A withstand voltage (breakdown voltage) of the bidirectional Zener diode is defined by the width of the second conductivity type portion. Therefore, if the second conductivity type portion is an impurity region inside the polysilicon layer as mentioned above, the width of the second conductivity type portion can be adjusted easily and the width of the second conductivity type portion can be adjusted with high precision by adjusting a width of a mask used in implanting the corresponding impurity in the polysilicon layer.

Specifically, if the bidirectional Zener diode is constituted of the polysilicon layer, the thin film portion may have a thickness of 400 Å to 450 Å, and the second impurity region may have an impurity concentration of $2.0 \times 10^{16}$ $cm^{-3}$ to $6.0 \times 10^{16}$ $cm^{-3}$ and a width of 2.4 μm to 2.6 μm.

With the bidirectional Zener diode in the semiconductor device according to the preferred embodiment of the reference invention, the first conductivity type portion at one end portion may be disposed at a center and the remaining second conductivity type portion and first conductivity type portion may be disposed concentrically so as to surround the first conductivity type portion at the center.

If the semiconductor device according to the preferred embodiment of the reference invention includes a gate pad, which is connected to the gate electrode and is exposed on a frontmost surface of the semiconductor device, the bidirectional Zener diode may be disposed in a region directly under the gate pad.

With the present arrangement, by effective use of the region directly under the gate pad, it becomes unnecessary to secure an installation space for the bidirectional Zener diode at an outer peripheral region of a chip, and therefore contribution can be made toward making the semiconductor device fine.

With the semiconductor device according to the preferred embodiment of the reference invention, the semiconductor layer may include a silicon substrate.

A preferred embodiment of the reference invention shall now be described in detail with reference to the attached drawings.

Figure 15:
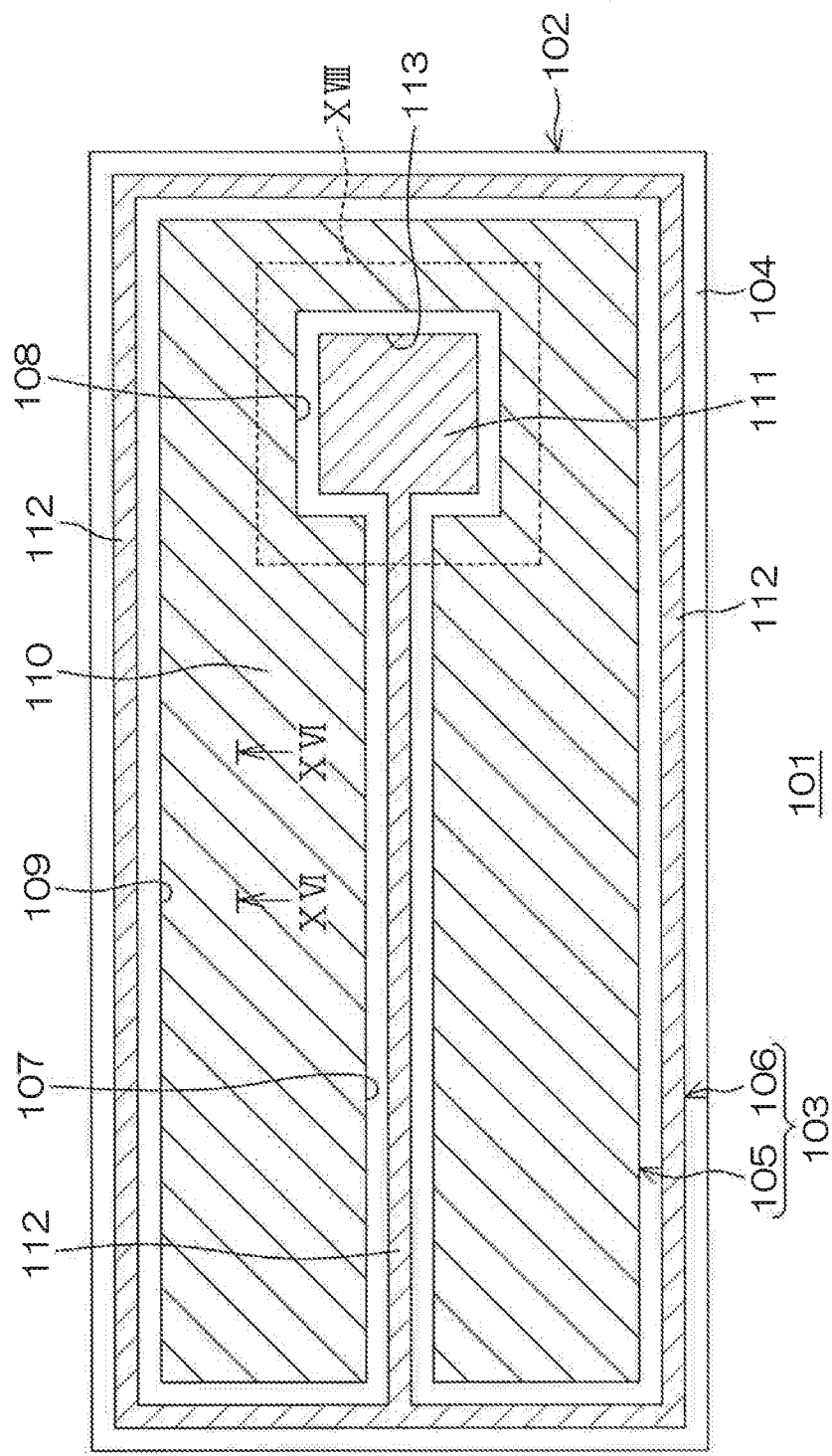
FIG. 15 is a schematic plan view of a semiconductor device according to a preferred embodiment of a reference invention.

FIG. 15 is a schematic plan view of a semiconductor device 101 according to the preferred embodiment of the reference invention.

With reference to FIG. 15, the semiconductor device 101 includes a semiconductor substrate 102 being an example of the semiconductor layer of the reference invention, an electrode film 103, and a front surface protection film 104. The front surface protection film 104 covers the electrode film 103 partially and selectively exposes a source pad 110 and a gate pad 111 which are to be described below. For example, silicon nitride (SiN), etc., may be used as the front surface protection film 104.

The semiconductor substrate 102 defines an outer shape of the semiconductor device 101 and, for example, has a chip shape of oblong shape in plan view. The semiconductor substrate 102 may, for example, be a silicon substrate and besides this, may be of a wide band gap semiconductor, such as silicon carbide (SiC), gallium nitride (GaN), etc., that may be used in a power device.

The electrode film 103 is constituted of a conductive material, such as an aluminum (Al) based material (for example, AlCu, etc.), and includes a source metal 105 and a gate metal 106.

The source metal 105 has an outer shape of substantially oblong shape in plan view that extends in a length direction of the semiconductor substrate 102. The source metal 105 has formed therein a removed region 107, which extends from one end portion toward another end portion of the length direction of the source metal 105 and with which one end is an open end and another end is a closed end. The closed end of the removed region 107 is arranged as a pad region 108 that is wider than another section of the removed region 107. Also, a portion of the source metal 105 is exposed as a source pad 110 at a frontmost surface of the semiconductor device 101 from a pad opening 109 in the front surface protection film 104.

The gate metal 106 includes a gate pad 111 and a gate finger 112.

The gate pad 111 is disposed in the pad region 108 and is exposed at the frontmost surface of the semiconductor device 101 from a pad opening 113 in the front surface protection film 104. With the exclusion of a portion of connection with the gate finger 112, the gate pad 111 is surrounded by the source metal 105.

On the other hand, the gate finger 112 (indicated for the sake of clarity by solid lines in FIG. 15) may be covered by the front surface protection film 104. The gate finger 112 extends from the gate pad 111 toward the open end of the removed region 107 of the source metal 105, is further routed from the open end to a peripheral edge portion of the semiconductor substrate 102, and surrounds the source metal 105. In the present preferred embodiment, the entire periphery of the source metal 105 is surrounded by the gate finger 112.

Figure 16:
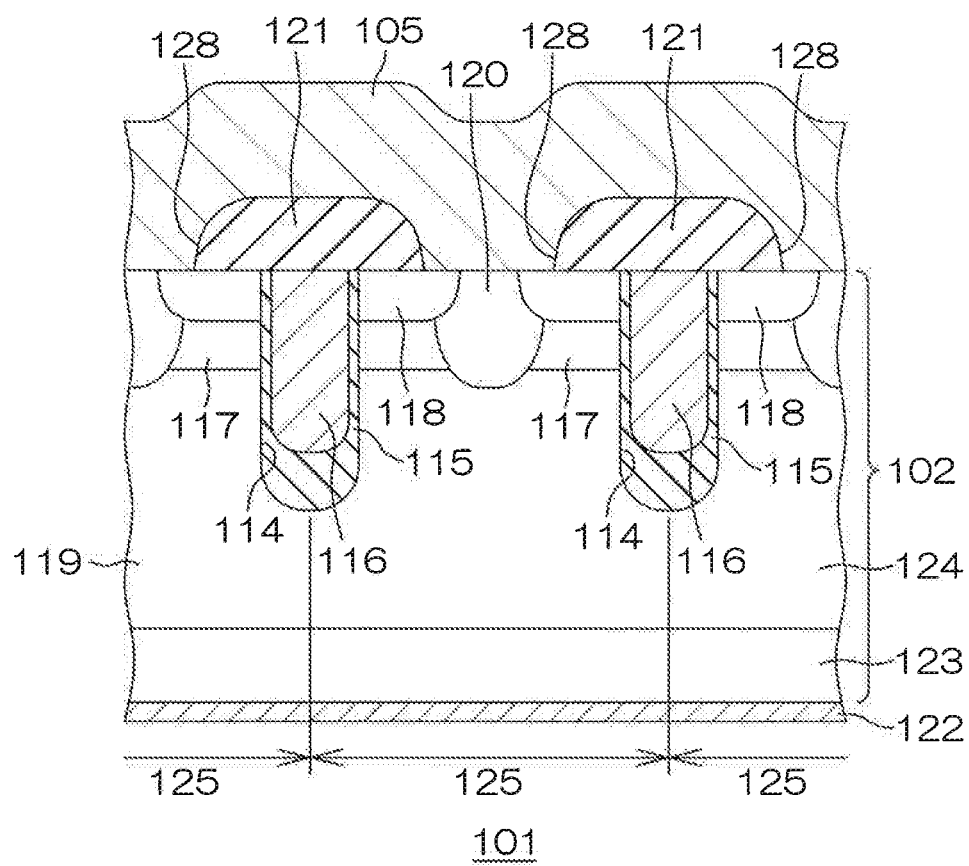
FIG. 16 is a sectional view taken along section line XVI-XVI in FIG. 15.
Figure 17:
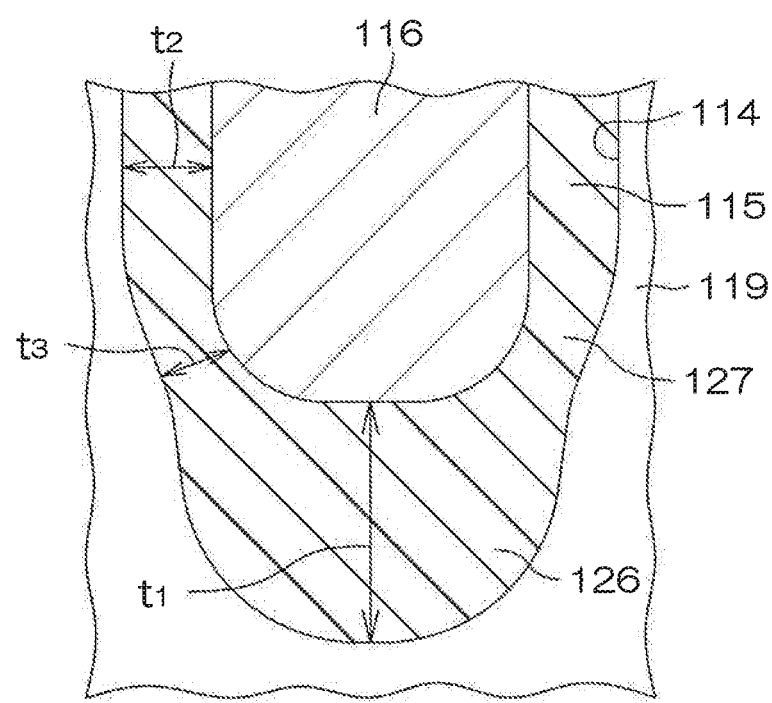
FIG. 17 is a diagram of a principal portion of a gate insulating film.

FIG. 16 is a sectional view of the semiconductor device 101 taken along section line XVI-XVI in FIG. 15. FIG. 17 is a diagram of a principal portion of a gate insulating film 115 of FIG. 16.

With reference to FIG. 16, the semiconductor device 101 includes the semiconductor substrate 102, gate trenches 114, gate insulating films 115, gate electrodes 116, $p^-$ type body regions 117, $n^+$ type source regions 118, an $n^-$ type drain region 119, $p^+$ type body contact regions 120, an interlayer insulating film 121, the source metal 105, and a drain electrode 122.

The semiconductor substrate 102 may, for example, be an epitaxial substrate obtained by crystal growth of an epitaxial layer 124, constituted of an n⁻ type silicon, on a base substrate 123 of an n⁺ type silicon. An impurity concentration of the n⁺ type base substrate 123 may, for example, be $2.0 \times 10^{19}$ cm⁻³ to $7.0 \times 10^{19}$ cm⁻³, and an impurity concentration of the n⁻ type epitaxial layer 124 may, for example, be $8.0 \times 10^{15}$ cm⁻³ to $2.0 \times 10^{16}$ cm⁻³.

The gate trenches 114 are formed in a predetermined pattern on a front surface portion of the semiconductor substrate 102. The pattern of the gate trenches 114 may be any of various patterns, such as stripes, lattice, etc. The front surface portion of the semiconductor substrate 102 is partitioned into a plurality of unit cells 125 in accordance with the pattern of the gate trenches 114. Also, an interval (cell pitch) between mutually adjacent gate trenches 114 may, for example, be approximately 1.0 µm to 2.0 µm.

The gate insulating films 115 are formed on inner surfaces of the gate trenches 114 and shall be described more specifically with reference to FIG. 17.

With reference to FIG. 17, in addition to a gate insulating film 115, an embedded insulating film 126 is disposed in an interior of each gate trench 114. The gate insulating film 115 and the embedded insulating film 126 may both be constituted of an insulating material, such as silicon oxide ($SiO_2$), etc. The embedded insulating film 126 is embedded to a fixed height from a deepest portion of the gate trench 114, and the gate insulating film 115 is disposed, in continuation to the embedded insulating film 126, on side surfaces of the gate trench 114. A thickness $t_1$ of the embedded insulating film 126 in a depth direction of the gate trench 114 is, for example, 1000 Å to 3000 Å, and a thickness $t_2$ of the gate insulating film 115 is, for example, 500 Å to 600 Å.

A gate electrode 116 is embedded in a region surrounded by the gate insulating film 115 and the embedded insulating film 126. The gate electrode 116 may, for example, be constituted of a conductive material, such as polysilicon, etc.

Also with the present preferred embodiment, a thin film portion 127, having a thickness $t_3$ (for example of 400 Å to 450 Å) that is thinner than the thickness $t_2$ of the gate insulating film 115, is provided integrally at a boundary portion between the gate insulating film 115 and the embedded insulating film 126. That is, with the insulating films inside each gate trench 114, the thin film portion 127 is formed at a portion contacting a bottom portion of the gate electrode 116. The thin film portion 127 may be constituted of the same insulating material, such as silicon oxide ($SiO_2$), etc., as the gate insulating film 115 and the embedded insulating film 126.

Referring again to FIG. 16, in each unit cell 125, a p⁻ type body region 117 is formed on a front surface portion of the epitaxial layer 124. An impurity concentration of the p⁻ type body region 117 may, for example, be $1.0 \times 10^{16}$ cm⁻³ to $3.5 \times 10^{16}$ cm⁻³.

In each unit cell 125, n⁺ type source regions 118 are formed on a front surface portion of the p⁻ type body region 117. An impurity concentration of the n⁺ type body regions 118 may, for example, be $1.0 \times 10^{19}$ cm⁻³ to $1.0 \times 10^{20}$ cm⁻³.

The n⁻ type drain region 119 is, in the epitaxial layer 124, an n⁻ type portion at a side of the p⁻ type body region 117 opposite the n⁺ type source regions 118 and is a region in common to the plurality of unit cells 125. Also, the n⁻ type drain region 119 is a region in which the conductivity type of the epitaxial layer 124 is maintained. An impurity concentration of the n⁻ type drain region 119 may thus be, for example, $2.0 \times 10^{16}$ cm⁻³ to $6.0 \times 10^{16}$ cm⁻³ (same as that of the n⁻ type epitaxial layer 124). The n⁻ type drain region 119 may be also be referred to as an n⁻ type drift region.

In each unit cell 125, a p⁺ type body contact region 120 is formed to penetrate through the n⁺ type source regions 118 from the front surface of the epitaxial layer 124 and contact the p⁻ type body region 117. An impurity concentration of the p⁺ type body contact region 120 may, for example, be $1.0 \times 10^{16}$ cm⁻³ to $3.5 \times 10^{16}$ cm⁻³.

The interlayer insulating film 121 is constituted of an insulating material, such as silicon oxide ($SiO_2$), etc., and is disposed on the semiconductor substrate 102. The interlayer insulating film 121 has formed therein contact holes 128 that expose the n⁺ type source regions 118 and the p⁺ type body contact regions 120. The source metal 105 is connected to the n⁺ type source regions 118 and the p⁺ type body contact regions 120 via the contact holes 128.

The drain electrode 122 is constituted of a conductive material, such as an aluminum (Al) based material (for example, AlCu, etc.), and is formed on a rear surface of the semiconductor substrate 102.

Figure 18:
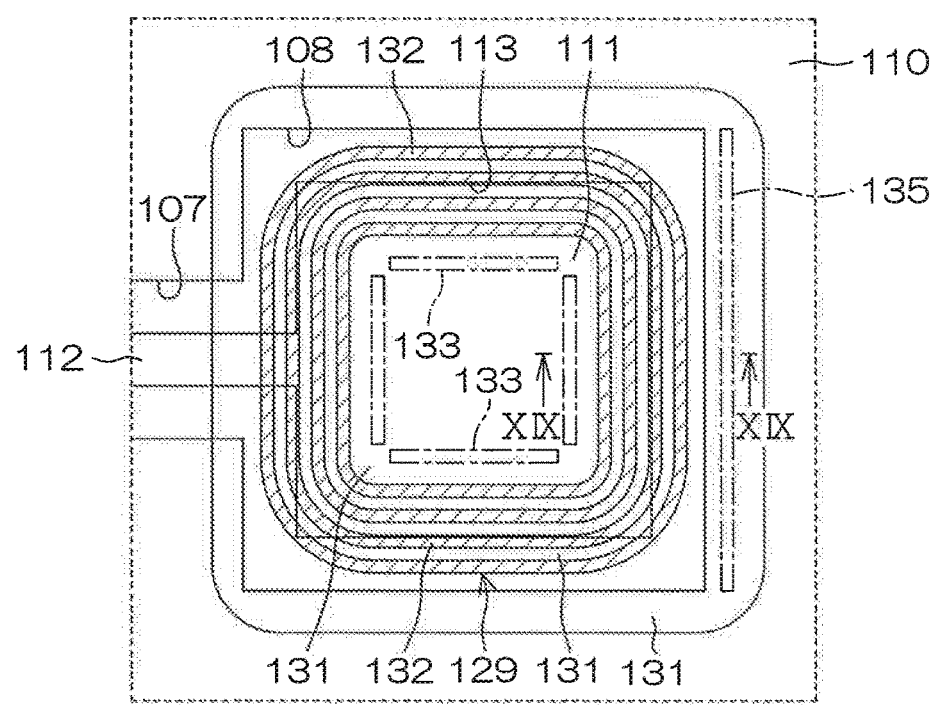
FIG. 18 is an enlarged view of a region surrounded by broken line XVIII in FIG. 15.
Figure 19:
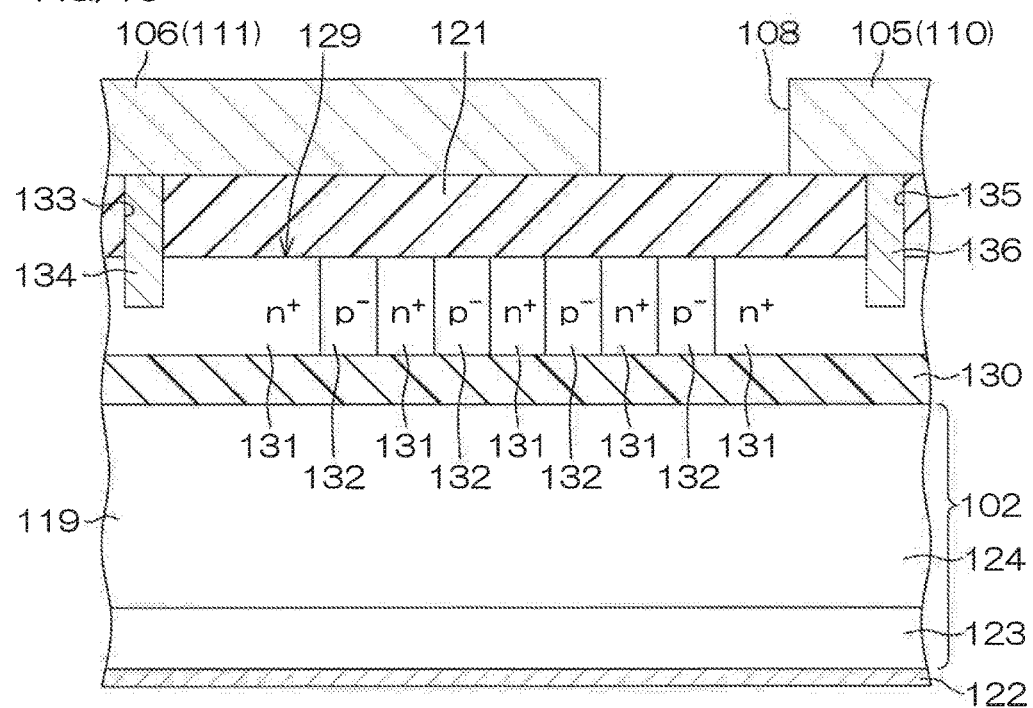
FIG. 19 is a sectional view taken along section line XIX-XIX in FIG. 18.

FIG. 18 is an enlarged view of a region surrounded by broken line XVIII in FIG. 15. FIG. 19 is a sectional view taken along section line XIX-XIX in FIG. 4. In FIG. 18 and FIG. 19, arrangements indicated in FIG. 15 to FIG. 17 and described above are provided with the same symbols and description thereof may be omitted.

With reference to FIG. 18 and FIG. 19, a bidirectional Zener diode 129 is disposed in a region directly under the gate pad 111. The bidirectional Zener diode 129 is formed above the semiconductor substrate 102 via an insulating film 130 (for example, of silicon dioxide). The bidirectional Zener diode 129 has a structure, in which n⁺ type portions 131, each being an example of the first conductivity type portion of the reference invention, and p⁻ type portions 132, each being an example of the second conductivity type portion of the reference invention, are repeated alternately, and respective end portions of the repetition structure are n⁺ type portions 131. As shown in FIG. 18, in the present preferred embodiment, the bidirectional Zener diode 129 has the n⁺ type portion 131 at one end portion disposed at a center of an inner region of the gate pad 111 and has the remaining p⁻ type portions 132 and n⁺ type portions 131 disposed concentrically so as to surround the central n⁺ type portion 131.

Also with the present preferred embodiment, the bidirectional Zener diode 129 is constituted of a polysilicon layer. The n⁺ type portions 131 and the p⁻ type portions 132 are arranged as n type or p type impurity regions formed selectively in the polysilicon layer. For example, the n⁺ type portions 131 and the p⁻ type portions 132 may have the same impurity concentrations as the n⁺ type source regions 118 and the p⁻ type body regions 117, respectively.

The interlayer insulating film 121 covers the bidirectional Zener diode 129. Gate side contact holes 133, exposing the n⁺ type portion 131 at the one end portion, are formed in the inner region of the gate pad 111.

Each gate side contact hole 133 is formed, for example, to a rectilinear shape along a peripheral edge of the n⁺ type portion 131 at the center. In the present preferred embodiment, the n⁺ type portion 131 at the center is formed to a quadrilateral shape in plan view and a total of four gate side contact holes 133 are formed, one each at each peripheral edge of the n⁺ type portion 131 at the center.

The gate pad 111 is connected to the n⁺ type portion 131 at the center via contact plugs 134 (conductive material, for example, tungsten (W), etc.) that are embedded in the respective gate side contact holes 133.

Also, in the interlayer insulating film 121, a source side contact hole 135, exposing the n⁺ type portion 131 at the other end portion, is formed directly under the source pad 110 at the rear of the gate pad 111 (at an opposite side of a position of the gate pad 111 connected to the gate finger 112).

The source side contact hole 135 is formed, for example, to a rectilinear shape along one peripheral edge of the n+ type portion 131 at an outermost periphery. In the present preferred embodiment, the n+ type portion 131 at the outermost periphery is formed to a quadrilateral annular shape in plan view and the source side contact hole 135 is formed along the one peripheral edge of the n+ type portion 131 at the outermost periphery.

The source pad 110 is connected to the n+ type portion 131 at the outermost periphery via a contact plug 136 (conductive material, for example, tungsten (W), etc.) that is embedded in the source side contact hole 135.

Figure 20:
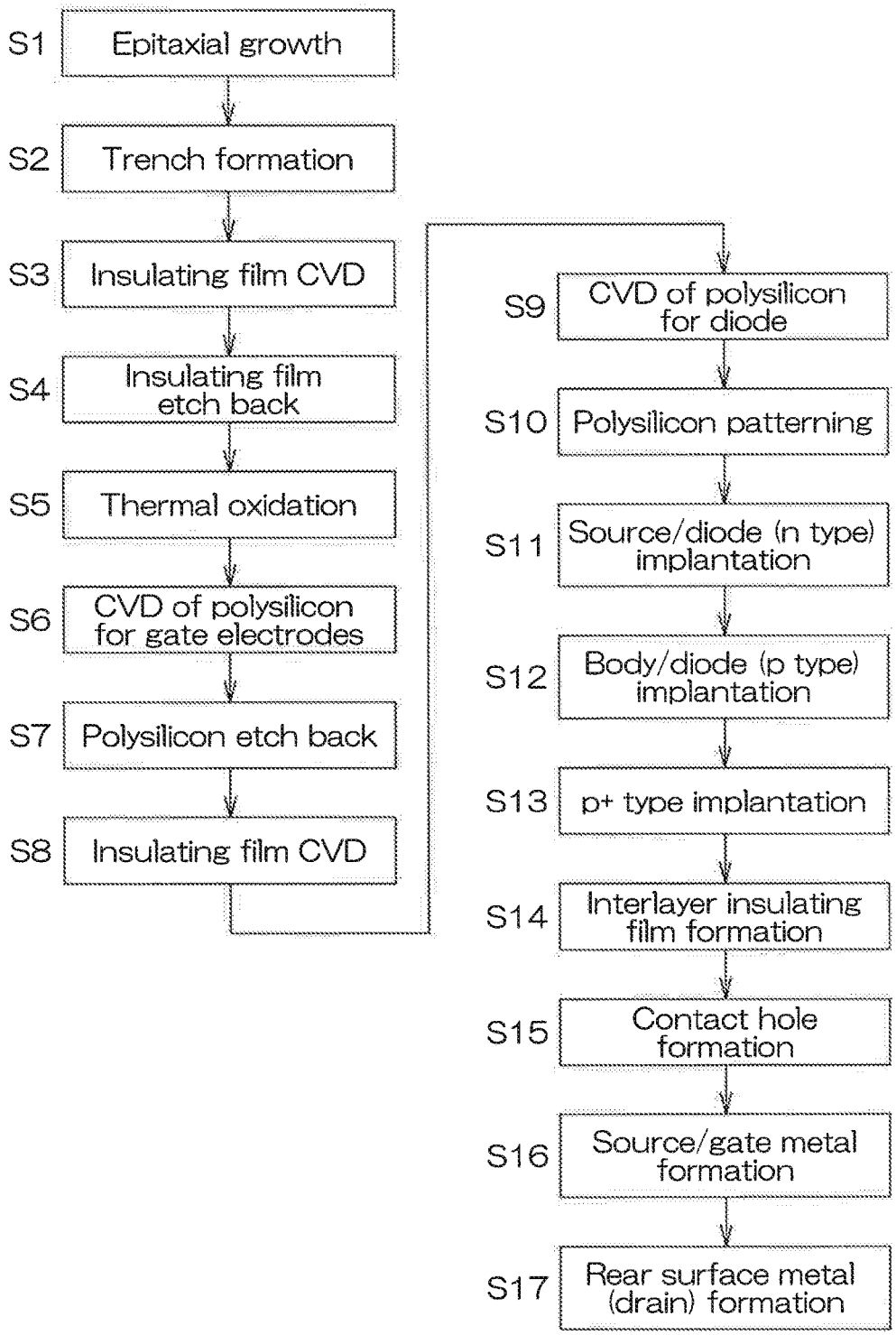
FIG. 20 is a flow diagram of a method for manufacturing the semiconductor device.

A method for manufacturing the semiconductor device 101 shall now be described. FIG. 20 is a flow diagram of a method for manufacturing the semiconductor device 101. FIG. 21A to FIG. 21D are sectional views for describing processes related to the forming of the gate insulating film 115.

To manufacture the semiconductor device 101, for example, the epitaxial layer 124, constituted of n⁻ type silicon, is formed by epitaxial growth on the n+ type silicon base substrate 123 (S1).

Figure 21A:
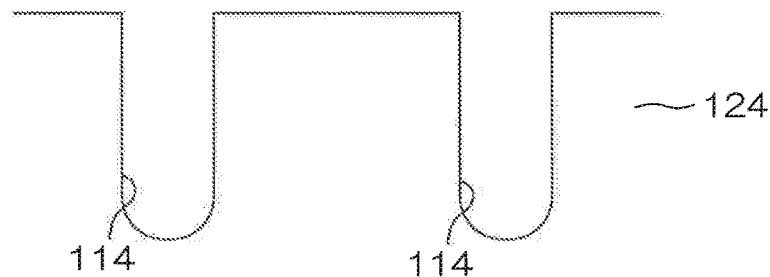
FIG. 21A to FIG. 21D are sectional views for describing processes related to the forming of the gate insulating film.

The gate trenches 114 and the gate insulating film 115 are formed in the next step. As shown in FIG. 21A, the gate trenches 114 are formed in the epitaxial layer 124 by a method, such as reactive ion etching (RIE), etc. (S2).

Figure 21B:
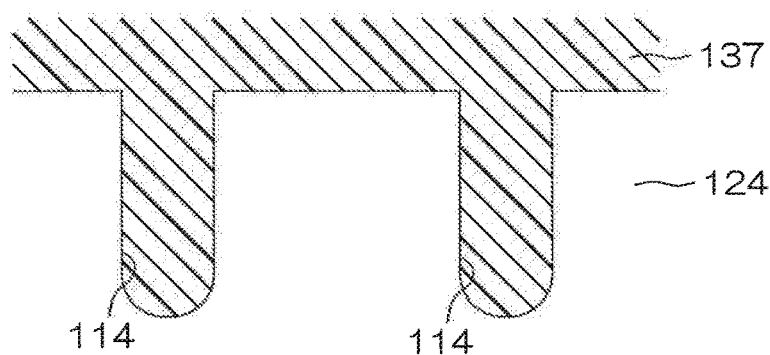

Next, as shown in FIG. 21B, an insulating film 137 is deposited on the epitaxial layer 124, for example, by the CVD method (S3). The deposition of the insulating film 137 is continued until the gate trenches 114 are refilled and the front surface of the epitaxial layer 124 is covered by the insulating material.

Figure 21C:
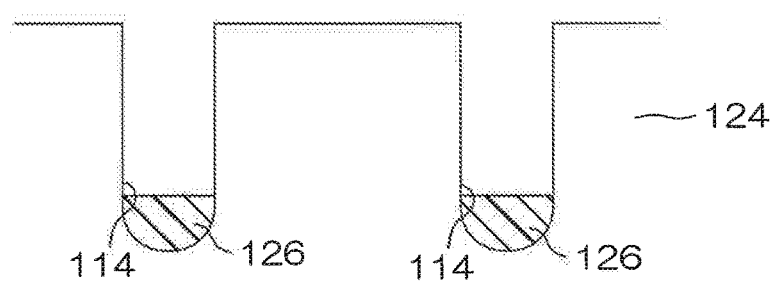

Next, as shown in FIG. 21C, a portion of the insulating film 137 is removed, for example, by etching back (S4). The embedded insulating films 126, constituted of the insulating film 137 remaining at bottom portions of the gate trenches 114, are thereby obtained.

Figure 21D:
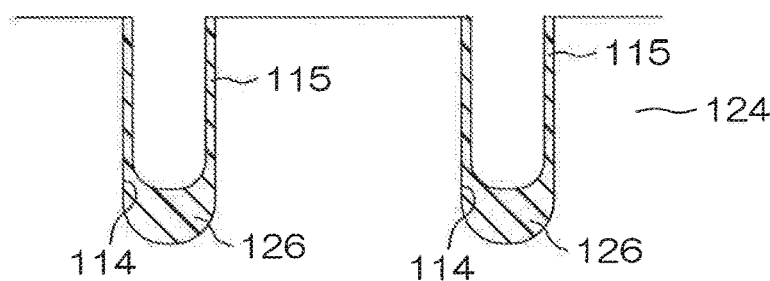

Next, as shown in FIG. 21D, the side surfaces of the gate trenches 114 are oxidized, for example by thermal oxidation, to form the gate insulating films 115 (S5).

Although specific illustration shall be omitted again from here, after the forming of the gate insulating films 115, polysilicon, which is the material of the gate electrodes 116, is deposited, for example, by the CVD method (S6), and after the deposition, unnecessary portions are removed, for example, by etching back (S7). The gate electrodes 116, embedded in the gate trenches 114, are thereby obtained.

Next, the insulating film 130, which is to become a base of the bidirectional Zener diode 129, is formed on the epitaxial layer 124, for example, by the CVD method (S8).

Next, polysilicon, which is the material of the bidirectional Zener diode 129, is deposited, for example, by the CVD method (S9), and after the deposition, unnecessary portions are removed, for example, by etching back (S10). The polysilicon layer for diode is thereby obtained on the insulating film 130.

Next, a mask having openings selectively at regions at which the n+ type source regions 118 are to be formed is applied above the epitaxial layer 124 and an n type impurity is implanted via the mask. In this process, the n type impurity is also implanted into the polysilicon layer for diode at the same time (S11). The implantation into the polysilicon layer for diode may be performed by full surface implantation without application of a mask.

Next, a mask having openings selectively at regions at which the p⁻ type body regions 117 are to be formed is applied above the epitaxial layer 124 and a p type impurity is implanted via the mask. In this process, the p type impurity is also implanted into the polysilicon layer for diode at the same time (S12). The implantation into the polysilicon layer for diode is performed by applying a mask to regions in which the p⁻ type portions 132 are not to be formed.

Next, a mask having openings selectively at regions at which the p+ type body contact regions 120 are to be formed is applied above the epitaxial layer 124 and the p type impurity is implanted via the mask (S13).

Thereafter, diffusion processing is performed on the impurities implanted in S11 to S13 to form the p⁻ type body regions 117, the n+ type source regions 118, the p+ type body contact regions 120, and the n+ type portions 131 and p⁻ type portions 132 of the bidirectional Zener diode 129.

Next, the interlayer insulating film 121 is formed on the epitaxial layer 124, for example, by the CVD method (S14) and the respective contact holes 128, 133, and 135 are formed in the interlayer insulating film 121 (S15).

After then embedding the contact plugs 134 and 136 in the gate side contact holes 133 and the source side contact hole 135, the source metal 105 and the gate metal 106 are formed on the interlayer insulating film 121 (S16).

Next, the drain electrode 122 is formed on the rear surface of the semiconductor substrate 102, for example, by the sputtering method. The semiconductor device 101 is obtained through the above processes.

The semiconductor device 101 may, for example, be used as a switching element. In this case, in a state of applying a drain voltage across the source metal 105 and the drain electrode 122 (across the source and the drain) such that the drain side will be positive, a predetermined voltage (a voltage not less than a gate threshold voltage) is applied to the gate metal 106. Channels are thereby formed along the depth direction of the gate trenches 114 at portions of the p⁻ type body regions 117 in vicinities of the gate insulating films 115, and a current flows in the depth direction of the gate trenches 114.

With the present semiconductor device 101, the bidirectional Zener diode 129 is connected between the gate metal 106 and the source metal 105 (between the gate and the source) as shown in FIG. 18 and FIG. 19. Therefore, even if noise current due to electrostatic discharge, etc., enters into the semiconductor device 101, the noise current can be released to the exterior (ground potential) by making it flow with priority through the bidirectional Zener diode 129.

That is, as shown in FIG. 22, if the breakdown resistance of the gate insulating films 115 (the gate insulating films 115 here conceptually include the thin film portions 127) is close to 25V, when a voltage of approximately 25V is applied across the gate and the source in a state where the bidirectional Zener diode 129 is not incorporated, the gate insulating films 115 will break down and a leak current will flow near 25V. The leak current is more significant the higher the gate-source voltage Vgs and increases substantially proportionately from the voltage value corresponding to the breakdown resistance.

On the other hand, as indicated by breakdown waveforms for two diodes in FIG. 22, it is considered that when the bidirectional Zener diode 129 that undergoes breakdown at a lower voltage than the breakdown resistance of the gate insulating films 115 is incorporated, even upon entry of noise current, etc., the bidirectional Zener diode 129 can be made to undergo breakdown before the gate insulating films 115 to thereby make the noise current flow with priority through the bidirectional Zener diode 129 and achieve ESD protection of the semiconductor device 101.

However, with a diode of a first mode in FIG. 22, the waveform after breakdown is considerably gradual in comparison to the waveform for the gate insulating films 115 and therefore from a gate-source voltage Vgs of approximately 40V (at an intersection A of the diode waveform and the gate insulating film waveform) as a boundary, the noise current flows out into the gate insulating films 115, so that the gate insulating films 115 undergo breakdown.

On the other hand, when, as with a diode of a second mode in FIG. 22, the waveform after breakdown is steep in comparison to that of the first mode and a slope thereof is close to a slope of the waveform for the gate insulating films 115, even if a comparatively high gate-source voltage Vgs is applied, the noise current can be made to continue to flow through the bidirectional Zener diode 129 with priority, so that breakdown of the gate insulating films 115 can be prevented.

Mechanisms of breakdown of the diode of the first mode and the diode of the second mode shall now be described in detail with reference to FIG. 23 and FIG. 24.

First, FIG. 23 is a diagram for describing the mechanism of breakdown of the bidirectional Zener diode 129 according to the first mode, with which the bidirectional Zener diode 129 undergoes breakdown by avalanche breakdown (avalanche design).

Figure 25:
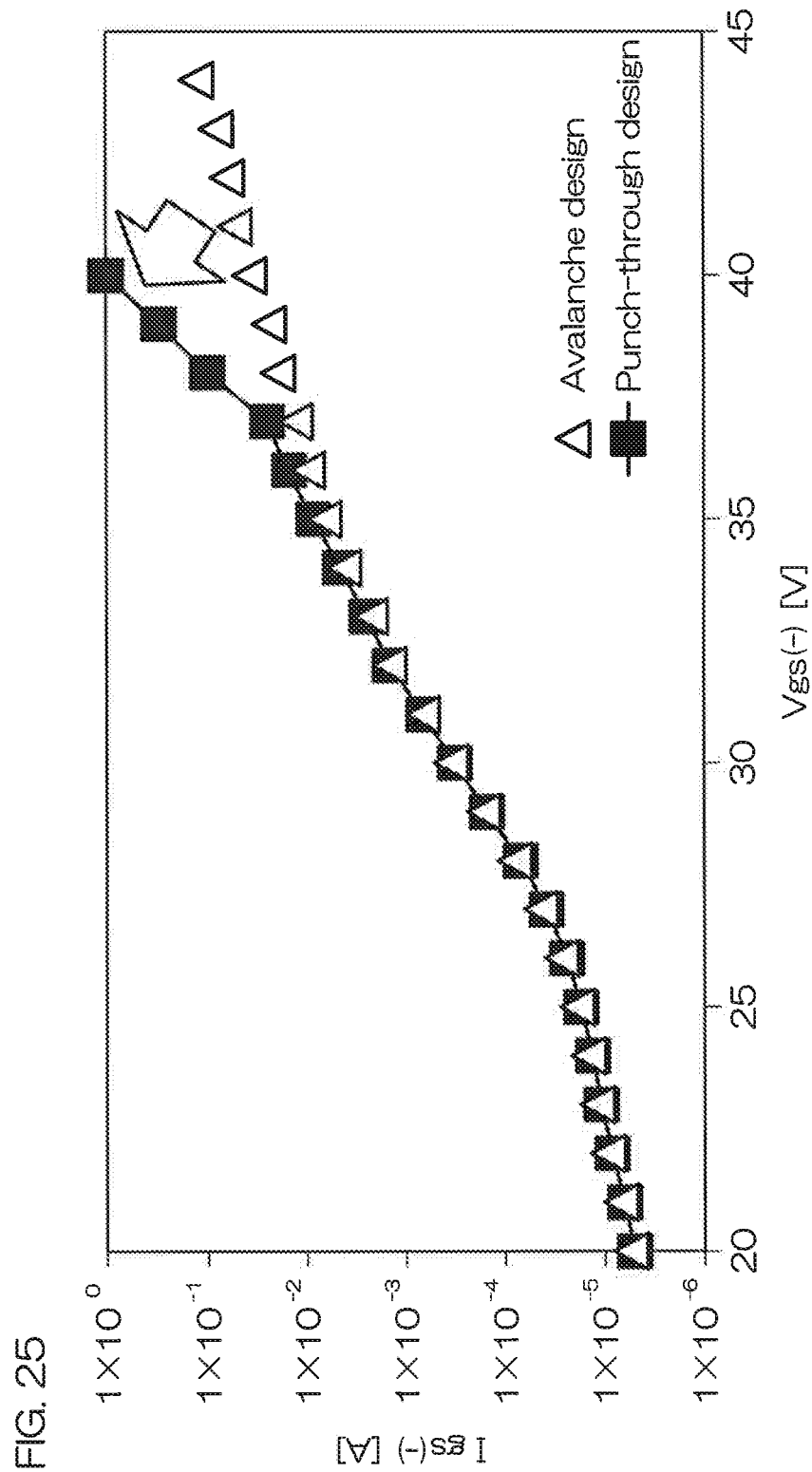
FIG. 25 is a diagram for comparing breakdown waveforms of an avalanche design and a punch-through design.

As shown in FIG. 23, the withstand voltage (breakdown voltage) of the bidirectional Zener diode 129 is defined by the impurity concentrations of the $n^+$ type portions 131 and the $p^-$ type portions 132 and therefore when the gate-source voltage Vgs corresponding to the breakdown voltage is applied, the $n^+$ type portion 131 at the source side and the $n^+$ type portion 131 at the gate side are made conductive to each other due to avalanche breakdown. Therefore, even after breakdown, each $p^-$ type portion 132 is not filled up by a depletion layer 138 (lower side of FIG. 23) and portion of the each $p^-$ type portion 132 remains at a fixed width. The remaining portions of the $p^-$ type portions 132 become serial resistors 139 in the flow of noise current through the bidirectional Zener diode 129 from the source side to the gate side. Therefore as shown in FIG. 22 and FIG. 25, the noise current (ordinate axis Igs in FIG. 22 and FIG. 25) increases only gradually even after breakdown and readily leads to breakdown of the gate insulating films 115.

Figure 24:
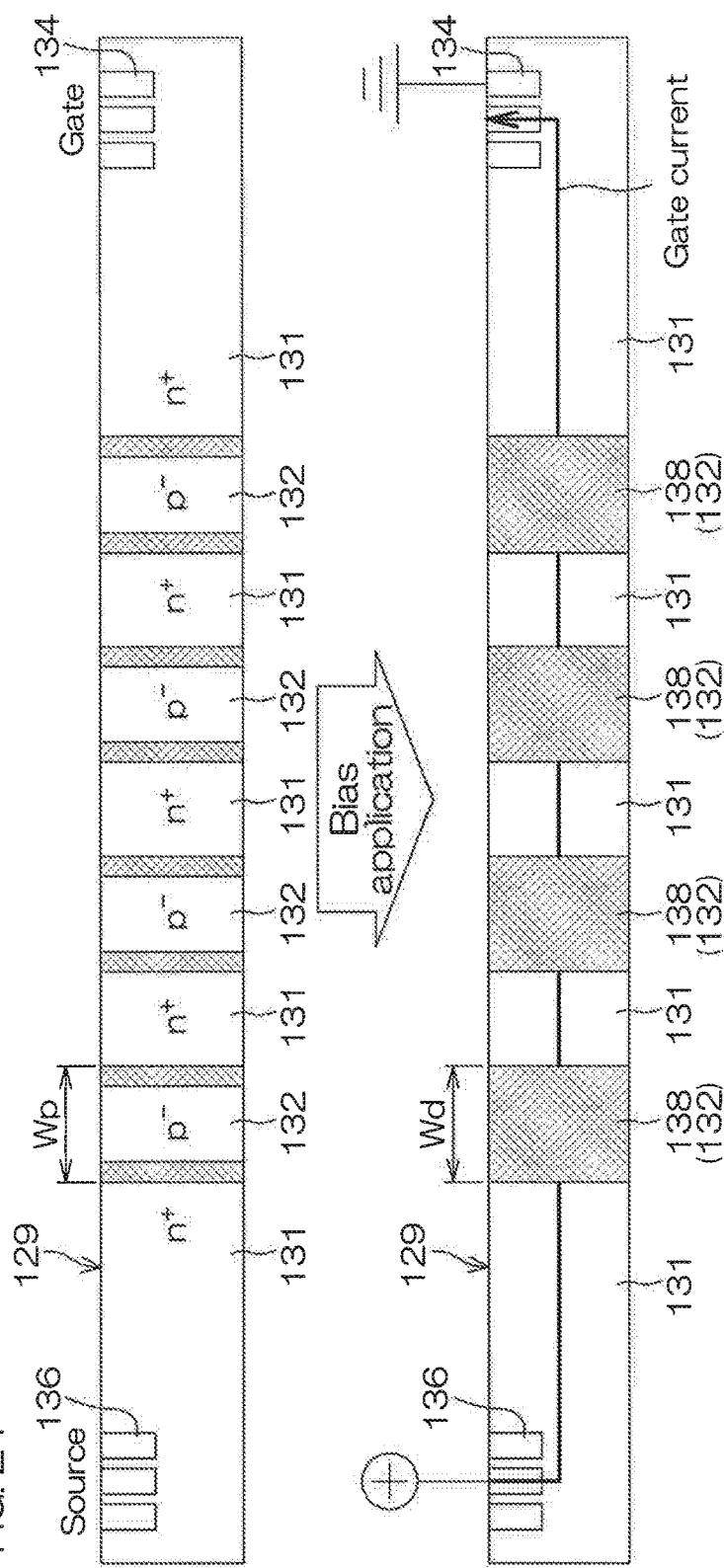
FIG. 24 is a diagram for describing a mechanism of breakdown of a bidirectional Zener diode according to a second mode.

Meanwhile, FIG. 24 is a diagram for describing the mechanism of breakdown of the bidirectional Zener diode 129 according to the second mode, with which the bidirectional Zener diode 129 undergoes breakdown by punch-through (punch-through design).

As shown in FIG. 24, the withstand voltage (breakdown voltage) of the bidirectional Zener diode 129 is defined by a width of each $p^-$ type portion 132. Specifically, the width Wp of each $p^-$ type portion 132 is, for example, defined to be a width smaller than a width Wd of each depletion layer 138 that spreads when the breakdown voltage is applied across the gate and the source (Wp<Wd). Therefore, when a gate-source voltage Vgs, corresponding to the breakdown voltage of the bidirectional Zener diode 129, is applied, the $n^+$ type portion 131 at the source side and the $n^+$ type portion 131 at the gate side can be made conductive to each other by punch-through. Therefore, after breakdown, the region of each $p^-$ type portion 132 is filled up with the depletion layer 138 (lower side of FIG. 24) and therefore the serial resistance can be reduced in comparison to the avalanche design of FIG. 23. Thereby as shown in FIG. 22 and FIG. 25, the noise current (ordinate axis Igs in FIG. 22 and FIG. 25) after breakdown is made to increase steeply in comparison to the avalanche design of FIG. 23 and the noise current can thus be released satisfactorily to the ground potential via the bidirectional Zener diode 129.

Figure 26:
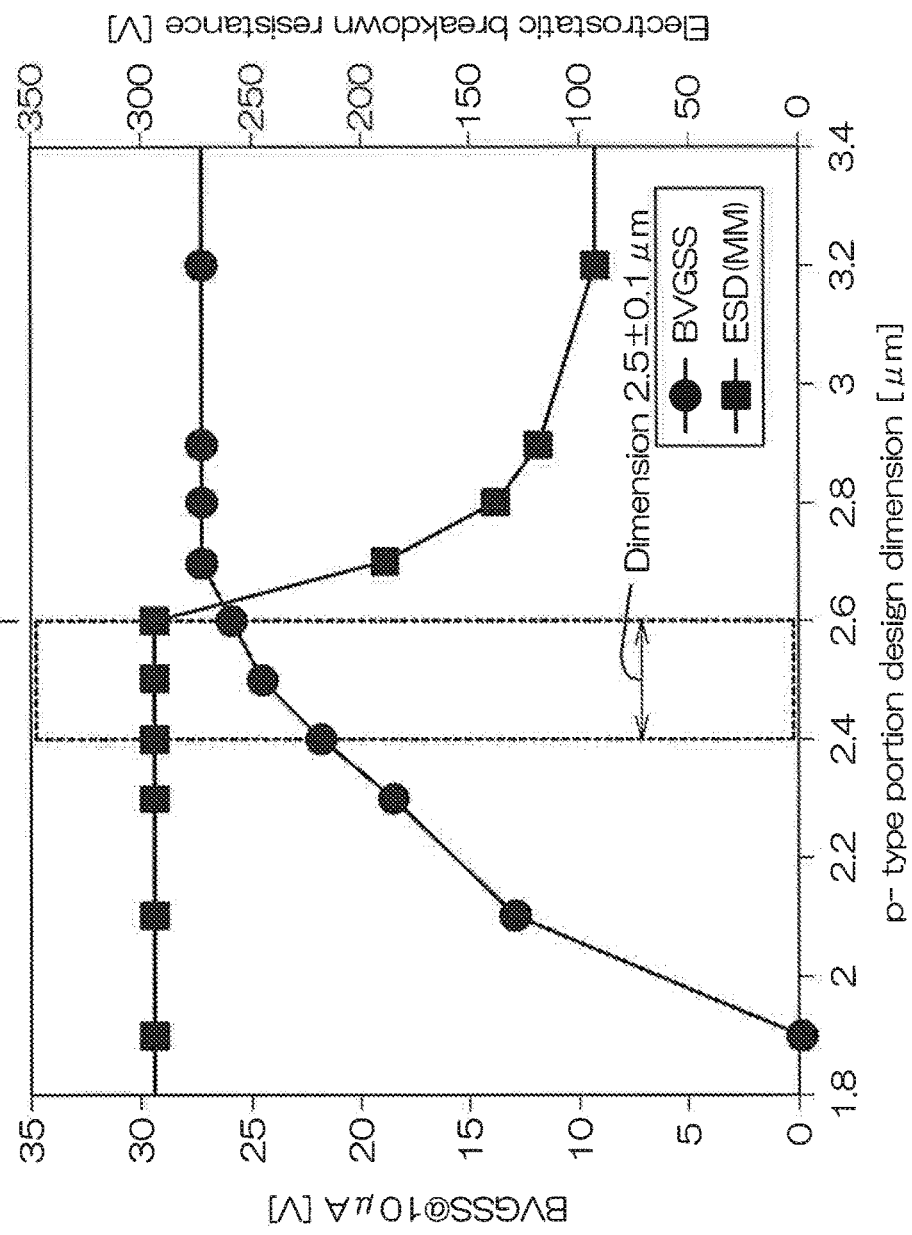
FIG. 26 is a diagram for describing how a gate-source breakdown voltage BVgss and electrostatic breakdown resistance vary according to a design dimension of a $p^-$ type layer of a bidirectional Zener diode.

FIG. 26 is a diagram for describing how a gate-source breakdown voltage BVgss and the electrostatic breakdown resistance vary according to a design dimension of the $p^-$ type portion 132 of the bidirectional Zener diode 129.

As shown in FIG. 26, the gate-source breakdown voltage BVgss converges at approximately 27V at a design dimension of 2.6 μm as a boundary and remains there even when the width of each $p^-$ type portion 132 increases further. On the other hand, the electrostatic breakdown resistance decreases rapidly in a region of 2.6 μm and greater. That is, in a region where the width of the $p^-$ type portion 132 reaches 2.6 μm as a boundary and increases further, breakdown due to avalanche breakdown, which is defined by the concentration of the $p^-$ type portion 132, occurs regardless of the width of the $p^-$ type portion 132 and consequently, breakdown of the gate insulating films 115 occurs readily (the electrostatic breakdown resistance is low).

On the other hand, in a region where the width of the $p^-$ type portion 132 is not more than 2.6 μm, the gate-source breakdown voltage BVgss increases in proportion to the design dimension of the $p^-$ type portion 132 and it can thus be confirmed that breakdown due to punch-through, which is related to the width of the $p^-$ type portion 132, is occurring. Therefore, in the region where the width of the $p^-$ type portion 132 is not more than 2.6 μm, noise current is absorbed satisfactorily in accordance with the mechanism shown in FIG. 24 and therefore a high electrostatic breakdown resistance is maintained.

If, for example, the "rated gate-source voltage Vgss" guaranteed for the semiconductor device 101 is 20V, application of a gate-source voltage exceeding the rated voltage Vgss will be a burden on the gate insulating films 115 and therefore, based on FIG. 26 and allowing for a variation of 0.1 μm, the design dimension of the $p^-$ type portion 132 is set to 2.5 μm (±0.1 μm). By this arrangement, when 20V is exceeded, the bidirectional Zener diode 129 can be made to undergo breakdown by punch-through to sufficiently release noise current and meanwhile suppress current flowing in the gate insulating films 115. Consequently, a high electrostatic breakdown resistance of approximately 30V can be maintained.

The preferable design dimension described above is merely an example for verifying the effects of the semiconductor device 101 and varies according to the impurity concentration of the $p^-$ type portions 132 that constitute the bidirectional Zener diode 129. For example, if the impurity concentration of the $p^-$ type portions 132 is in a range of, $2.0\times10^{16}$ cm$^{-3}$ to $6.0\times10^{16}$ cm$^{-3}$, the width is preferably 2.4 μm to 2.6 μm.

As described above, a high electrostatic breakdown resistance can be realized by the semiconductor device 101.

Figure 27:
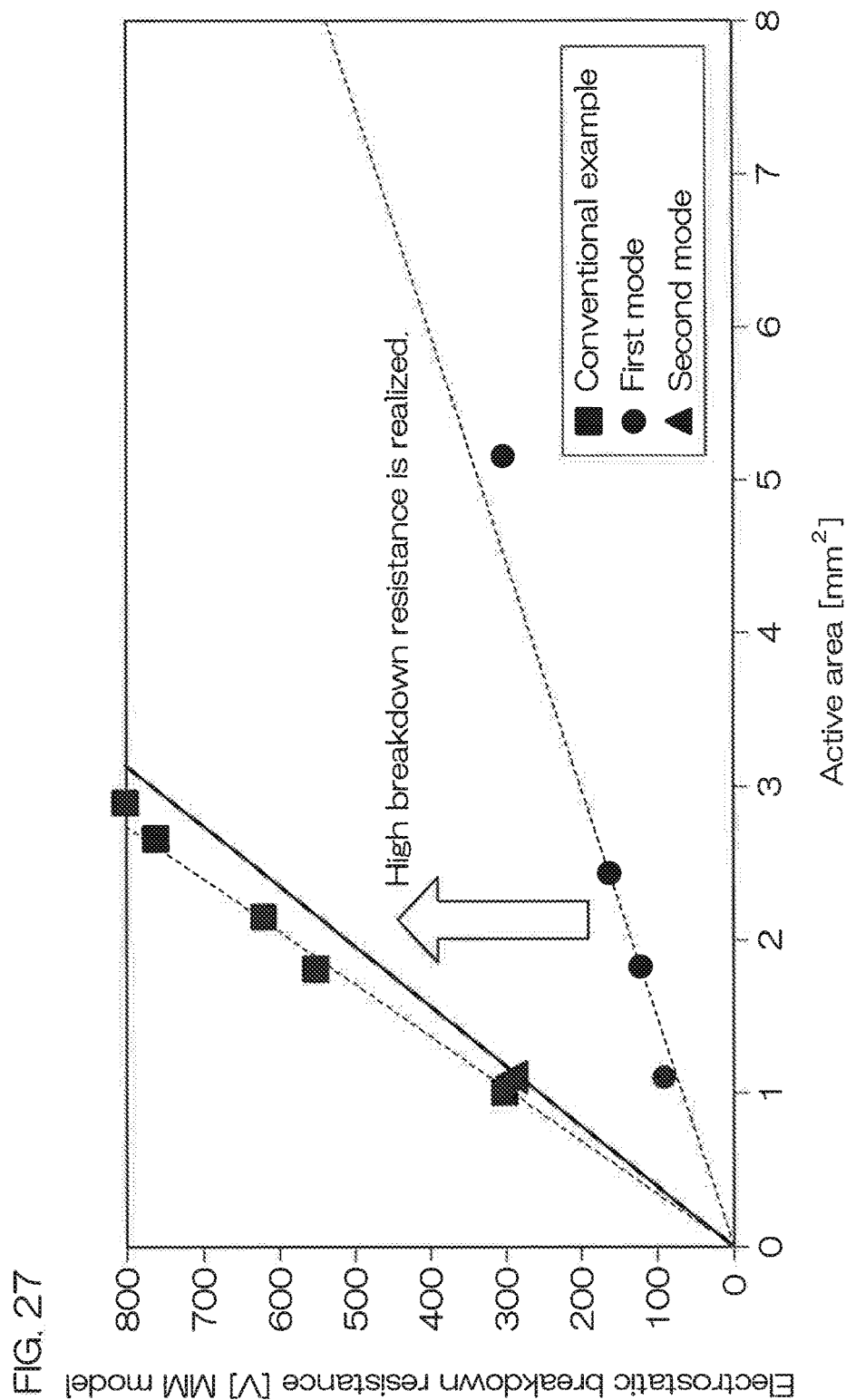
FIG. 27 is a diagram showing relationships of area of active region and electrostatic breakdown resistance according to transistors that differ from each other in structure.

This can be demonstrated further byway of FIG. 27. FIG. 27 is a diagram that shows that even when an active region of the semiconductor device 101 is made small in area and fine, a sufficient electrostatic resistance can be realized. The second mode and the first mode in FIG. 27 correspond to the second mode and the first mode shown in FIG. 22 to FIG. 25 and described above. On the other hand, the conventional example indicates a semiconductor device having the same arrangement as that of the first mode with the exception that, in each gate trench 114, the embedded insulating film 126 and the thin film portion 127 are not formed and a gate insulating film thicker than the thin film portion 127 is formed to a substantially uniform thickness.

That is, as shown in FIG. 27, with the semiconductor device of the second mode, a high electrostatic breakdown resistance is realized for the semiconductor device as a whole despite the breakdown resistance of the insulating films inside the gate trenches 114 themselves being lower than that of the conventional example due to having the thin film portions 127.

Lower on-resistance and lower capacitance can thus be realized, for example, by adopting the embedded insulating films 126 that are thick in comparison to the gate insulating films 115 to lower the gate-drain capacitance and making the respective portions of the semiconductor device 101 finer.

Also, there is no need to make the gate insulating films 115 thick to improve the breakdown resistance, and therefore the thickness of the gate insulating films 115 can be designed with a focus on the switching performance of the transistor. Influences on the switching performance of the transistor can thus also be kept small.

Although a preferred embodiment of the reference invention has been described above, the reference invention may also be implemented in yet other modes.

For example, an arrangement in which the conductivity types of the respective semiconductor portions of the semiconductor device 101 are inverted may be adopted. That is, in the semiconductor device 101, a p type portion may be of an n type and an n type portion may be of a p type.

What is claimed is:

1. A semiconductor device comprising:
a semiconductor layer of a first conductivity type, having a main surface with a diode trench formed therein;
an inner wall insulating film, including a side wall insulating film, formed along side walls of the diode trench, and a bottom wall insulating film, formed along a bottom wall of the diode trench and having a thickness greater than a thickness of the side wall insulating film; and
a bidirectional Zener diode, formed on the bottom wall insulating film inside the diode trench and having a pair of first conductivity type portions and at least one second conductivity type portion formed between the pair of first conductivity type portions, wherein
the bidirectional Zener diode is formed inside the diode trench across an interval from the side walls of the diode trench, and
a distance between a side wall of the bidirectional Zener diode and a side wall of the diode trench is greater than a thickness of the bidirectional Zener diode.

2. The semiconductor device according to claim 1, wherein the bottom wall insulating film includes an inversion suppressing structure that is interposed between the bottom wall of the diode trench and the bidirectional Zener diode and suppresses inversion of the conductivity type of the second conductivity type portion of the bidirectional Zener diode to the first conductivity type.

3. A semiconductor device comprising:
a semiconductor layer of a first conductivity type, having a main surface with a diode trench formed therein;
an inner wall insulating film, formed along an inner wall of the diode trench;
a bidirectional Zener diode, formed inside the diode trench and having a pair of first conductivity type portions and at least one second conductivity type portion formed between the pair of first conductivity type portions; and
a floating region of the second conductivity type formed in a region of the semiconductor layer oriented along a bottom wall of the diode trench, wherein
the bidirectional Zener diode is formed inside the diode trench across an interval from the side walls of the diode trench, and
a distance between a side wall of the bidirectional Zener diode and a side wall of the diode trench is greater than a thickness of the bidirectional Zener diode.

4. The semiconductor device according to claim 3, wherein the semiconductor device includes an inversion suppressing structure that is formed by the inner wall insulating film, interposed between the bottom wall of the diode trench and the bidirectional Zener diode, and the floating region, facing the bidirectional Zener diode across the inner wall insulating film and suppresses inversion of the conductivity type of the second conductivity type portion of the bidirectional Zener diode to the first conductivity type.

5. The semiconductor device according to claim 3, wherein the inner wall insulating film includes a side wall insulating film, formed along side walls of the diode trench, and a bottom wall insulating film, formed along a bottom wall of the diode trench and having a thickness greater than a thickness of the side wall insulating film, and
the semiconductor device includes an inversion suppressing structure that is formed by the bottom wall insulating film, interposed between the bottom wall of the diode trench and the bidirectional Zener diode, and the floating region, facing the bidirectional Zener diode across the bottom wall insulating film and suppresses inversion of the conductivity type of the second conductivity type portion of the bidirectional Zener diode to the first conductivity type.

6. The semiconductor device according to claim 1, wherein the bidirectional Zener diode has an upper surface facing an opening of the diode trench, and
the upper surface of the bidirectional Zener diode is formed on the same plane as the main surface of the semiconductor layer.

7. The semiconductor device according to claim 1, wherein the bidirectional Zener diode is formed inside the diode trench across an interval from the side walls of the diode trench.

8. The semiconductor device according to claim 7, further comprising a side wall protection film with insulating property that protects side walls of the bidirectional Zener diode.

9. The semiconductor device according to claim 1, wherein the bidirectional Zener diode includes a polysilicon body,
the pair of first conductivity type portions include first conductivity type impurity regions formed selectively in the polysilicon body, and
the second conductivity type portion includes a second conductivity type impurity region formed selectively in the polysilicon body.

10. The semiconductor device according to claim 1, further comprising an insulated gate type field effect transistor, including a body region of the second conductivity type, formed on a surface layer portion of the main surface of the semiconductor layer, a source region of the first conductivity type, formed on a surface layer portion of the body region, a gate electrode, facing the body region across a gate insulating film, and a source electrode, connected to the source region, and having the semiconductor layer as a drain layer; and wherein, in the bidirectional Zener diode, one of the pair of first conductivity type portions is electrically connected to the gate electrode and the other of the pair of first conductivity type portions is electrically connected to the source electrode.

11. The semiconductor device according to claim 10, wherein a gate trench is further formed in the main surface of the semiconductor layer, the gate insulating film is formed along an inner wall of the gate trench, and the gate electrode is embedded in the gate trench across the gate insulating film and faces the source region, the body region, and the drain region across the gate insulating film.

12. The semiconductor device according to claim 11, wherein the gate trench has the same depth as a depth of the diode trench, the gate insulating film has the same structure as the inner wall insulating film, and the gate electrode has the same conductive material as the bidirectional Zener diode.

13. The semiconductor device according to claim 1, further comprising an electric field relaxation structure, formed in a surface layer portion of the main surface of the semiconductor layer in a peripheral region along a peripheral edge of the diode trench and relaxing an electric field in the peripheral region.

14. The semiconductor device according to claim 13, wherein a plurality of the electric field relaxation structures are formed at intervals in a direction away from the diode trench.

15. The semiconductor device according to claim 13, wherein the electric field relaxation structure is formed so as to surround the diode trench.

16. The semiconductor device according to claim 13, wherein an electric field relaxation trench is further formed in the main surface of the semiconductor layer and the electric field relaxation structure includes an electric field relaxation inner wall insulating film, formed along an inner wall of the electric field relaxation trench, and an embedded conductor, embedded in the electric field relaxation trench across the electric field relaxation inner wall insulating film.

17. The semiconductor device according to claim 16, wherein the electric field relaxation trench has the same depth as a depth of the diode trench, the electric field relaxation inner wall insulating film has the same structure as the inner wall insulating film, and the embedded conductor has the same conductive material as the bidirectional Zener diode.

18. A semiconductor device comprising:

a semiconductor layer of a first conductivity type, having a main surface with a diode trench formed therein;

an inner wall insulating film, including a side wall insulating film, formed along side walls of the diode trench, and a bottom wall insulating film, formed along a bottom wall of the diode trench and having a thickness greater than a thickness of the side wall insulating film;

a bidirectional Zener diode, formed on the bottom wall insulating film inside the diode trench and having a pair of first conductivity type portions and at least one second conductivity type portion formed between the pair of first conductivity type portions; and an electric field relaxation structure, formed in a surface layer portion of the main surface of the semiconductor layer in a peripheral region along a peripheral edge of the diode trench and relaxing an electric field in the peripheral region, wherein an electric field relaxation trench is further formed in the main surface of the semiconductor layer, the electric field relaxation structure includes an electric field relaxation inner wall insulating film, formed along an inner wall of the electric field relaxation trench, and an embedded conductor, embedded in the electric field relaxation trench across the electric field relaxation inner wall insulating film, the electric field relaxation trench has the same depth as a depth of the diode trench, the electric field relaxation inner wall insulating film has the same structure as the inner wall insulating film, and the embedded conductor has the same conductive material as the bidirectional Zener diode.

* * * * *